(12) United States Patent
Kouno et al.

(10) Patent No.: US 6,365,932 B1
(45) Date of Patent: Apr. 2, 2002

(54) POWER MOS TRANSISTOR

(75) Inventors: Kenji Kouno, Gifu; Shouji Mizuno, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/626,479

(22) Filed: Jul. 26, 2000

(30) Foreign Application Priority Data

Aug. 20, 1999 (JP) ............................... 11-234173
Oct. 28, 1999 (JP) ............................... 11-307654

(51) Int. Cl.[7] ..................... H01L 29/76; H01L 29/94; H01L 31/062; H01L 31/113; H01L 31/119
(52) U.S. Cl. ................... 257/341; 257/133; 257/146; 257/343; 257/370
(58) Field of Search ................. 257/133, 146, 257/341, 343, 370

(56) References Cited

U.S. PATENT DOCUMENTS

| | | | |
|---|---|---|---|
| 4,376,286 A | 3/1983 | Lidow et al. | |
| 4,593,302 A | 6/1986 | Lidow et al. | |
| 4,916,085 A | 4/1990 | Frisina | |
| 4,929,991 A | 5/1990 | Blanchard | |
| 5,119,162 A | 6/1992 | Todd et al. | |
| 5,272,098 A | 12/1993 | Smayling et al. | |
| 5,283,201 A | 2/1994 | Tsang et al. | |
| 5,286,995 A | 2/1994 | Malhi | |
| 5,304,827 A | 4/1994 | Malhi et al. | |
| 5,369,045 A | 11/1994 | Ng et al. | |
| 5,468,984 A | 11/1995 | Efland et al. | |
| 5,474,944 A | 12/1995 | Zambrano | |
| 5,498,554 A | 3/1996 | Mei | |
| 5,514,608 A | 5/1996 | Williams et al. | |
| 5,594,266 A | 1/1997 | Beigel et al. | |
| 5,629,543 A | 5/1997 | Hshieh et al. | |
| 5,644,148 A | * 7/1997 | Kinzer | 257/133 |
| 5,973,361 A | * 10/1999 | Hshieh et al. | 257/341 |
| 6,064,086 A | * 5/2000 | Nakagawa et al. | 257/335 |

FOREIGN PATENT DOCUMENTS

| | | |
|---|---|---|
| EP | 802 567 A2 | 10/1997 |
| JP | 2590863 B2 | 3/1997 |
| JP | 11-354779 | 12/1999 |
| JP | 2000-4023 | 1/2000 |
| JP | 2000-12842 | 1/2000 |

OTHER PUBLICATIONS

Efland et al., "An Optimized RESURF LDMOS Power Device Module Compatible with Advanced Logic Processes," IEEE, IEDM 92, pp. 237–240, Apr. 1992.

* cited by examiner

Primary Examiner—Ngân V. Ngô
(74) Attorney, Agent, or Firm—Law Office Of David G. Posz

(57) ABSTRACT

A new and improved power MOS transistor having a protective diode with an increased breakdown voltage difference and less sheet resistivity is disclosed. In an up-drain type MOSFET, an n-type well layer has its top surface in which an elongated p-type base region is provided adjacent to a deep $n^+$-type region (drain region). The p-type base region is formed so that it partly overlaps the deep $n^+$ region. A $p^+$-type region (p-type base region) is connected to a source electrode. A surge bypassing diode D1 is thus formed between the source and drain of the MOSFET.

15 Claims, 76 Drawing Sheets

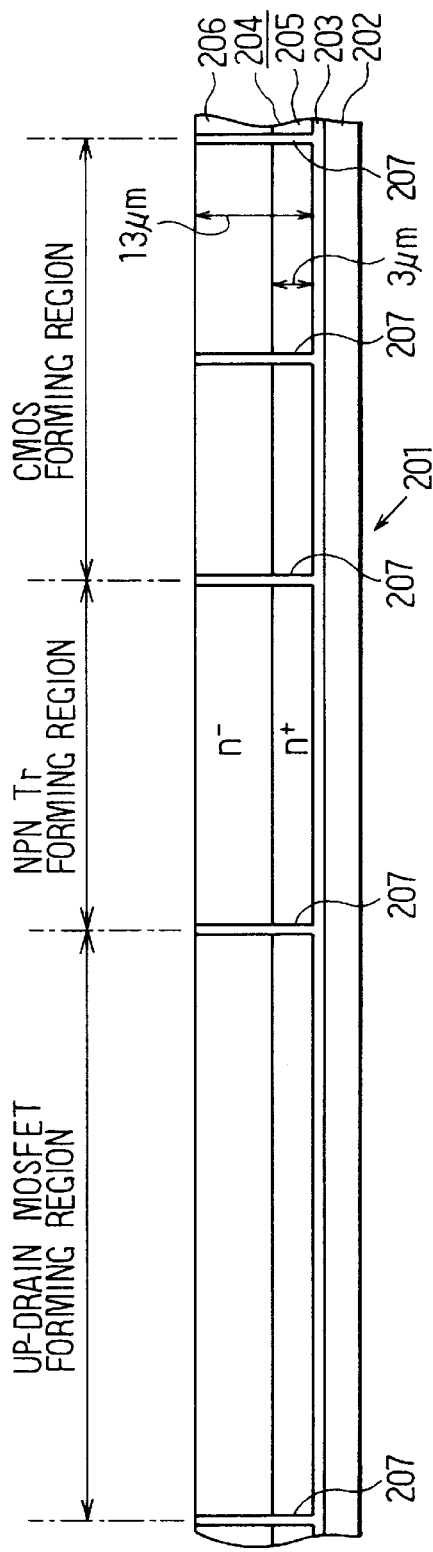
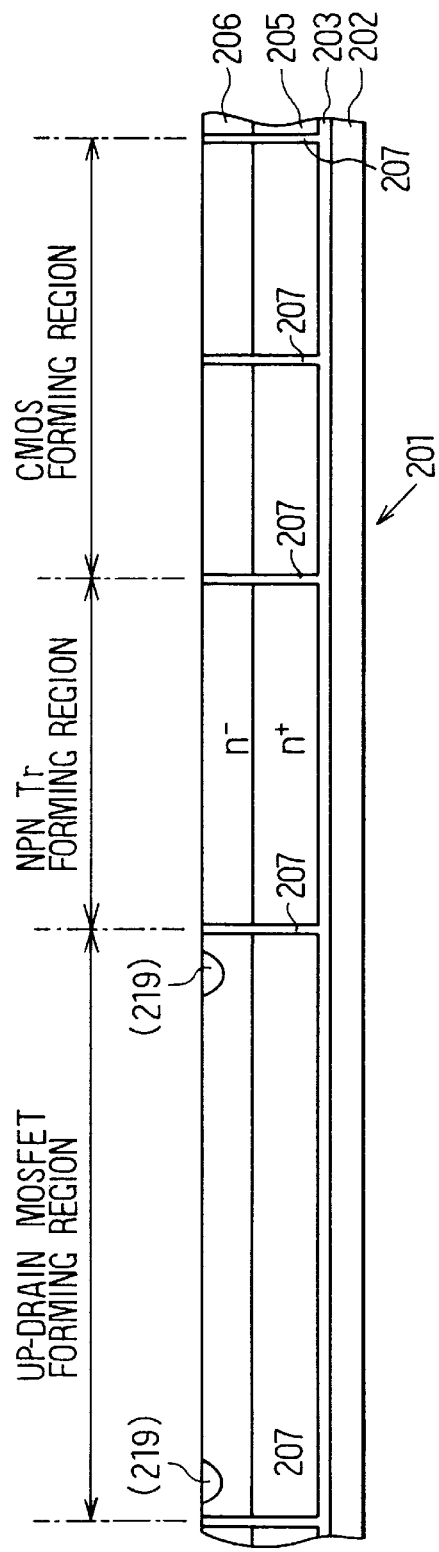

POWER MOS TRANSISTOR

CROSS REFERENCE TO RELATED APPLICATION

This application is based upon Japanese Patent Application Nos. Hei. 10-165233 filed on Jun. 12, 1998, Hei. 10-168843 filed on Jun. 16, 1998, Hei. 10-171373 filed on Jun. 18, 1998, Hei. 11-234173 filed on Aug. 20, 1999, and Hei. 11-307654 filed on Oct. 28, 1999, the contents of which are incorporated herein by reference.

BACKGROUND OF THE INVENTION

1. Field of the Invention

The present invention relates generally to power metal oxide semiconductor (MOS) transistors and, more particularly, to surge protection techniques for use therewith.

2. Related Art

Generally, power MOS transistors for use in land vehicles including but not limited to power MOS field effect transistors (MOSFETS) are strictly required to offer low turn-on resistivity and high withstanding voltage rating at low costs.

Power MOSFETs as built in hybrid integrated circuit (IC) devices for land vehicles typically include vertical type power MOSFETs (up-drain type) and lateral type power MOSFETs (LDMOS type).

Such power MOSFETs are adaptable for use in driving loads such as lamps, relay switches and the like, and are often encountered with a variety of kinds of surge voltages or noises as applied via output terminals thereof, including electrostatic potential variations, inductive ("L") loads, and others. To avoid problems due to such surge noises, power MOSFETs are required to offer enhanced surge withstand rating or durability in addition to high breakdown voltages and low turn-on resistivity.

A prior known approach to increasing surge withstand rating for protecting power MOS transistors against possible surge voltages in particular from electrostatic discharge (ESD) noises is to employ certain methodology including (i) a method for strengthening power elements per se by increasing the impurity concentration of a channel well region to thereby suppress operability of parasitic transistors, (ii) a method for providing a trigger circuit including a capacitor between the drain and gate of a MOS transistor to thereby permit a surge current to flow therein through a MOS operation, and (iii) a surge bypass method with a capacitor or power Zener diode or else being additionally connected in parallel to a power MOSFET of interest (see FIG. 20).

While the prior art approach exhibits advantages, these do not come without accompanying penalties which follow. The methods (i), (ii) stated above suffer from a problem that the turn-on resistance of a power MOS transistor can increase with an increase in threshold voltage Vth and also a problem that the expected ESD surge withstand rating is variable with a change in size of a power MOS transistor per se in view of the current capacity thereof. Problems faced with the surge bypass method (iii) are such that the requisite number of externally associated IC components is increased and that the ESD withstand rating is lowered due to the presence of a parasitic or stray inductance (see FIG. 20) of electrical interconnect leads involved.

An improved scheme is disclosed in Published Unexamined Japanese Patent Application No. 10-4180, which permits the surge withstand rating to stay unchanged in a way independent of sizes of power elements and electrical leads or else. This technique will be explained in detail with reference to FIG. 21.

FIG. 21 shows an LDMOS transistor of the so-called "resurf" structure type with its unique ESD remedy for employing a built-in protective diode D11, which is provided at an outer peripheral portion of such LDMOS structure for breaking down at a certain withstand voltage level that is potentially lower than that of an internal cell(s). And, any surface current incoming from the drain side is forced to flow through the protective diode toward the source side and then dumped away externally.

Unfortunately, this structure is still with a room for further improvement. More specifically, this structure is inherently designed to employ the resurf-type structure utilizing the same lightly-doped p-type ("LDp") well region 800 for both its LDMOS cell unit and protective diode unit, which structure has its breakdown voltage as determined depending on the impurity concentration and diffusion depth of a lightly-doped n-type (LDn) well region 801 overlying the LDp well region 800. Due to this design scheme, the LDMOS cell unit measures approximately 70 volts in breakdown voltage whereas the protective diode D11 is about 60 volts in breakdown voltage since this diode comes with a drain region 802 that is further laminated on the LDn well region 801 in the cell unit, resulting in a potential difference between them being as small as about 10 volts.

Also note that in the structure of FIG. 21, the protective diode D11's p-type layer 800 acting as an anode region is disposed between the LDn well region 801 (or alternatively n-type drain region 802) and n-type layers 803, 804 to provide the so-called pinch resistor structure; for this reason, the resulting sheet resistance is as high as about 10 kiloohms per unit area (kΩ/□).

Further, the structure of FIG. 21 is such that since an n-type epitaxial layer 104 is present beneath the protective diode D11, the diode is far from any ideal or "pure" diode structure, which also includes a parasitic npn transistor having a collector formed of an n-type region with the LDn well region 801 and n-type drain region 802 overlapping each other, a base formed of its underlying LDp well layer 800, and an emitter of a lightly doped n ($n^+$) type layer 804 of a substrate. With such an arrangement, an increase in surge current would result in an increase in voltage potential of such parasitic transistor's p-type base layer, which in turn leads to occurrence of a bipolar operation. In other words, the protective diode D11 will be readily destructive by local current concentration due to such bipolar operation.

SUMMARY OF THE INVENTION

This invention has been conceived in view of the background thus far described and its first object is to provide a new and improved power MOS transistor with a protective diode that is high in breakdown voltage difference and yet less in sheet resistivity.

In accordance with a first aspect of the invention, the above object is attainable by providing an up-drain type MOSFET, characterized in that a base region of a second conductivity type so that the base partly overlaps a deep drain region, and that this base region is connected to the source side thereby forming a surge bypassing diode between the source and drain.

In accordance with a second aspect of the invention, an up-drain type MOSFET is provided which is featured in that a semiconductor region of a first conductivity type is formed in a surface of a surface-side semiconductor layer while forming a base region of a second conductivity type in such a manner as to partly overlap this semiconductor region, and that the base region is connected to the source side whereas the semiconductor region of the first conductivity type is connected to the drain side thereby forming a surge bypassing diode between the source and drain.

In accordance with a third aspect of the invention, an LDMOSFET is provided, which is featured in that a semiconductor region of a first conductivity type is formed in a surface of a surface-side semiconductor layer while forming a base region of a second conductivity type so that it partly overlaps this semiconductor layer, and that the base region is connected to the source side whereas the semiconductor region of the first conductivity type is connected to the drain side thereby forming a surge bypassing diode between the source and drain.

In accordance with a fourth aspect of the invention, a VDMOSFET is provided, which features in that a deep region of first conductivity type is formed which is deep enough to reach a semiconductor substrate from the a surface of a surface-side semiconductor layer while at the same time forming in the surface of the surface-side semiconductor layer a base region of second conductivity type which partly overlaps the deep region, and that the base region is connected to the source side thus forming a surge bypassing diode between the source and drain.

In accordance with a fifth aspect of the invention, a lateral type insulated gate bipolar transistor (IGBT) is provided, which features in that a semiconductor region of first conductivity type is formed in a surface of a surface-side semiconductor layer while simultaneously forming a base region of second conductivity type so that it partly overlaps the semiconductor region, and that the base region is connected to the source side whereas the semiconductor region is coupled to the collector side thus forming a surge bypassing diode between the emitter and collector.

With use of any one of the device structures stated supra, the resultant source cell unit (or emitter cell unit) is increased in breakdown voltage when compared to those MOS structures of the so-called resurf type in virtue of field curvature relax effects due to cell integration—typically, as high as about 120 volts. On the other hand, the breakdown voltage of the surge bypass diode for use as the intended protective diode may be lowered in value—e.g. 70 volts or below—because of the fact that it is determinable in value by a distance or spatial interval between two adjacent diffusion regions. In short, it becomes possible to design the protective diode's breakdown voltage in a way independent of the cell unit, which in turn makes it possible to provide a sufficiently increased breakdown voltage difference.

Furthermore, the formation of the intended diode by use of two diffusion regions makes it possible to reduce or minimize the sheet resistance of an anode in the presence of the base region (e.g. as low as 200Ω/□, or more or less), which in turn enables the protective diode to much decrease in operating resistance than the device of FIG. 21. Moreover, the protective diode is hardly affectable by current concentration effect occurring due to bipolar operations, leading to appreciable improvement in breakdown level.

With the above-noted principles of the invention, it is possible to achieve an improved power MOS transistor having its protective diode with increased breakdown voltage difference and reduced sheet resistivity.

In accordance with a sixth aspect of the invention, a double-well complementary MOS (CMOS) transistor structure is provided, which employs two separate well regions of first and second conductivity types that are also formed in a power device formation region and bipolar transistor formation region respectively. More than one power device and bipolar transistor are constituted in such well regions.

It is thus possible to fabricate in a semiconductor substrate any intended power device and bipolar transistor while using none of the power device's exclusive-use mask and bipolar transistor's dedicated mask. This in turn makes it possible to reduce costs for manufacturing a semiconductor device with power devices and bipolar CMOS ("BiCMOS") transistors formed in the same semiconductor substrate.

In accordance with a seventh aspect of the invention, a first mask as disposed over a semiconductor substrate is used to simultaneously fabricate those well regions of a first conductivity type in respective formation regions of a power device and a bipolar transistor plus a double-well CMOS transistor. Further, a second mask is disposed overlying the semiconductor substrate for use in simultaneously forming well regions of a second conductivity type in respective formation regions of the power device and bipolar transistor plus double-well CMOS transistor. Thereafter, gate electrodes are disposed simultaneously in the formation regions of such power device and double-well CMOS transistor.

With the manufacturing method above, it is possible to fabricate in the semiconductor substrate more than one power device and bipolar transistor without using any exclusive-use or "dedicated" masks of the power device and bipolar transistor. This in turn makes it possible to reduce production costs of a semiconductor device with such power device and BiCMOS transistor formed in the same semiconductor substrate.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

FIGS. 26 through 35 illustrate, in cross-section, some of major-steps in the manufacture of the hybrid IC in accordance with the second embodiment of the invention;

FIGS. 71B, 72B, 73B to 75B depict corresponding sectional views of each of the device structures of the preceding figures;

DESCRIPTION OF THE PREFERRED EMBODIMENTS

First Embodiment

One preferred form carrying out this invention will now be set forth with reference to some of the accompanying drawings below.

Figure 1:
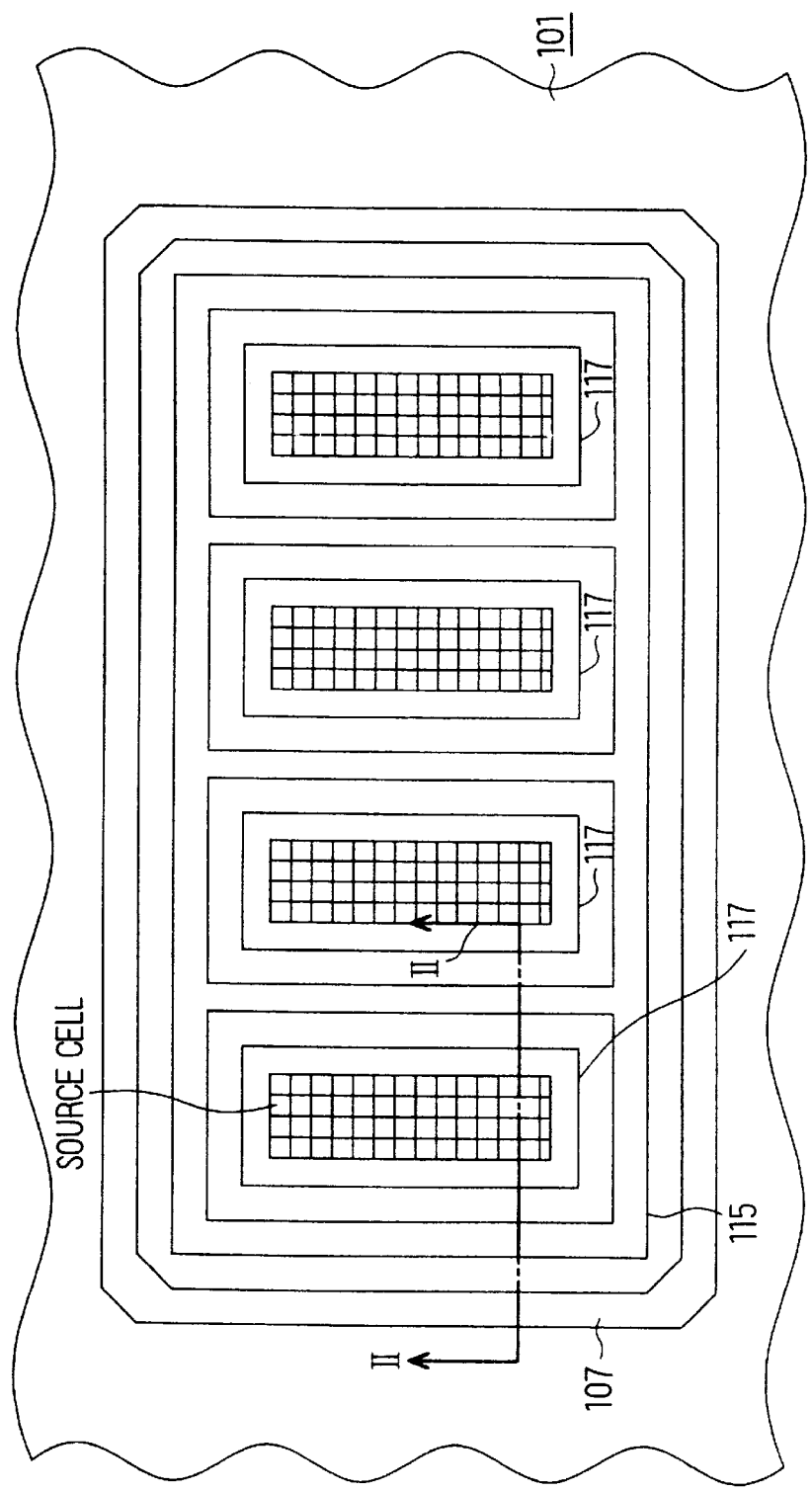
FIG. 1 is a diagram showing a plan view of a hybrid IC in accordance with one preferred embodiment of the present invention.
Figure 2:
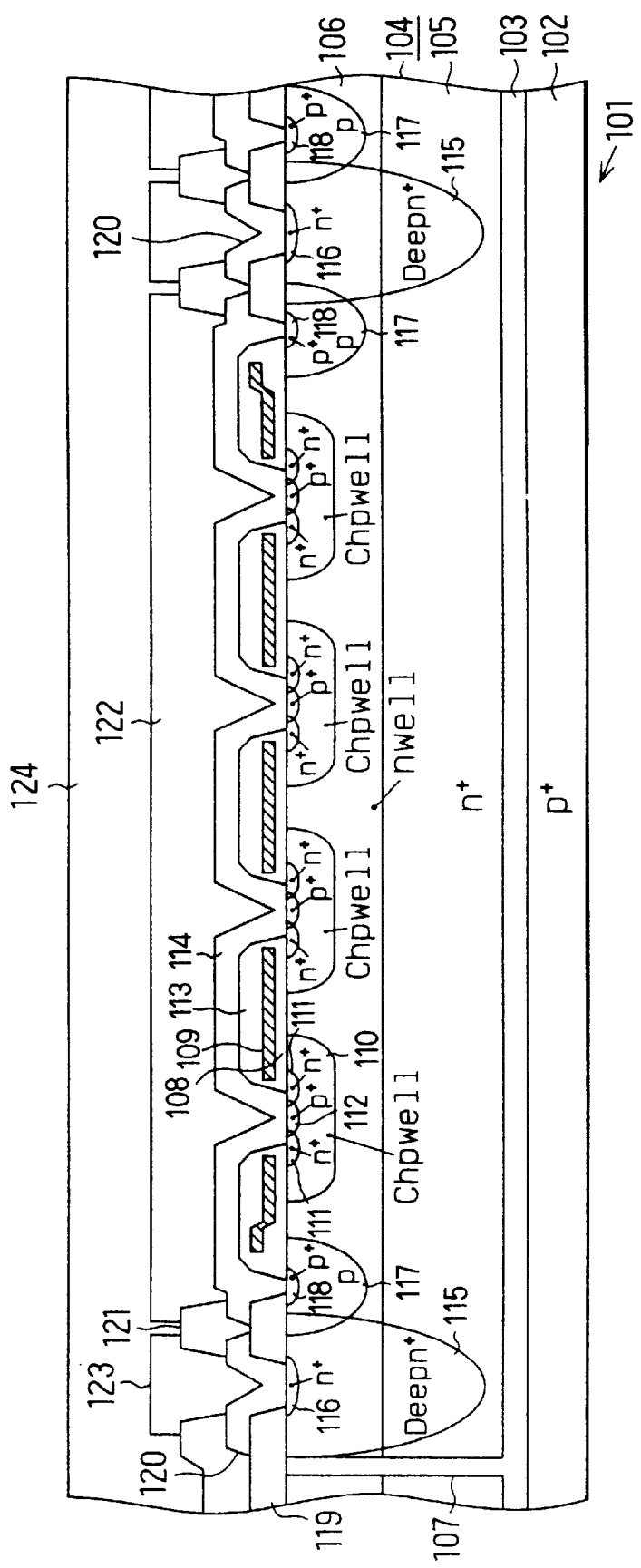
FIG. 2 is a longitudinal sectional view of the structure of FIG. 1 as taken along line II—II.
Figure 3:
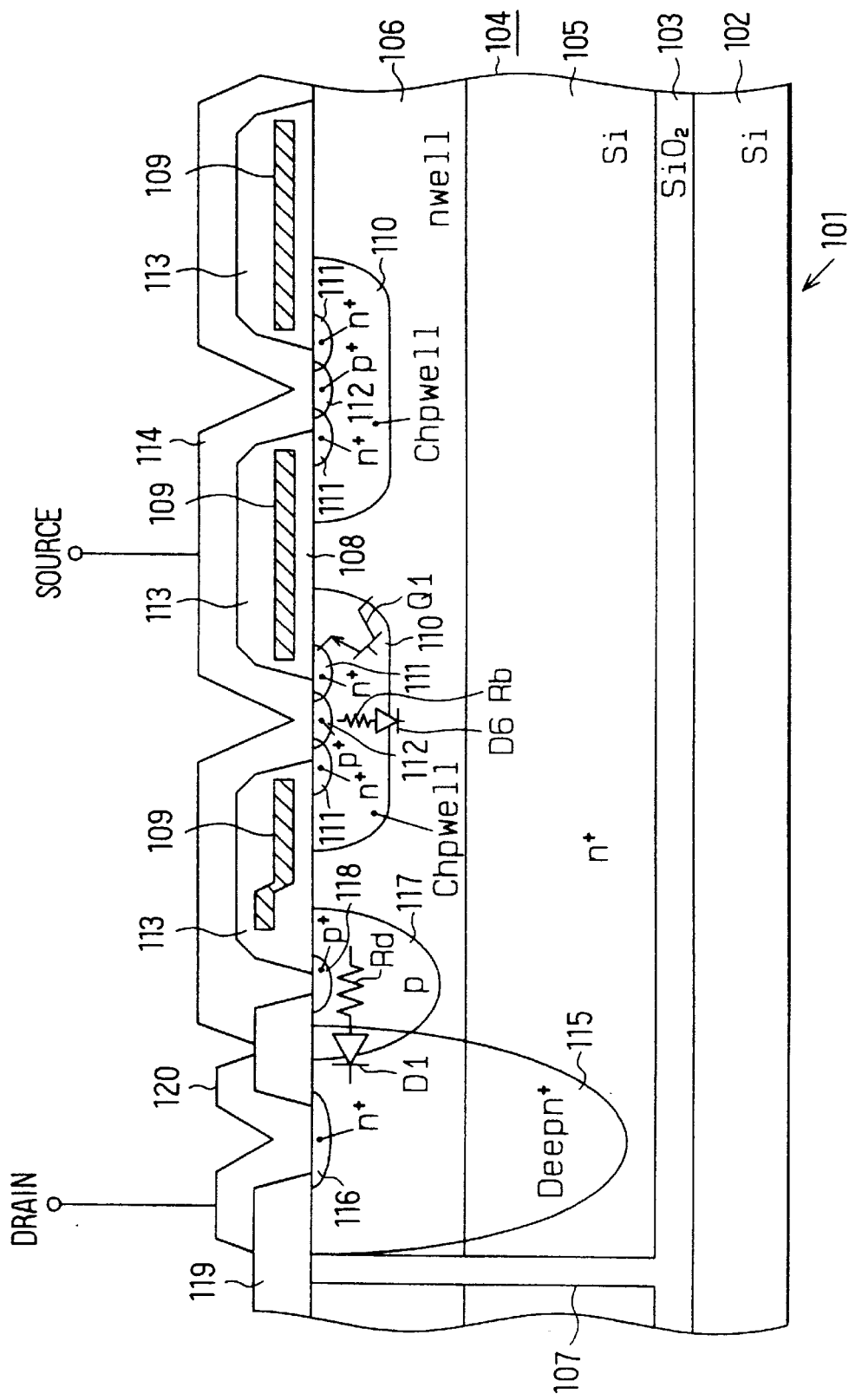
FIG. 3 is an enlarged view of main part of the embodiment.
Figure 4:
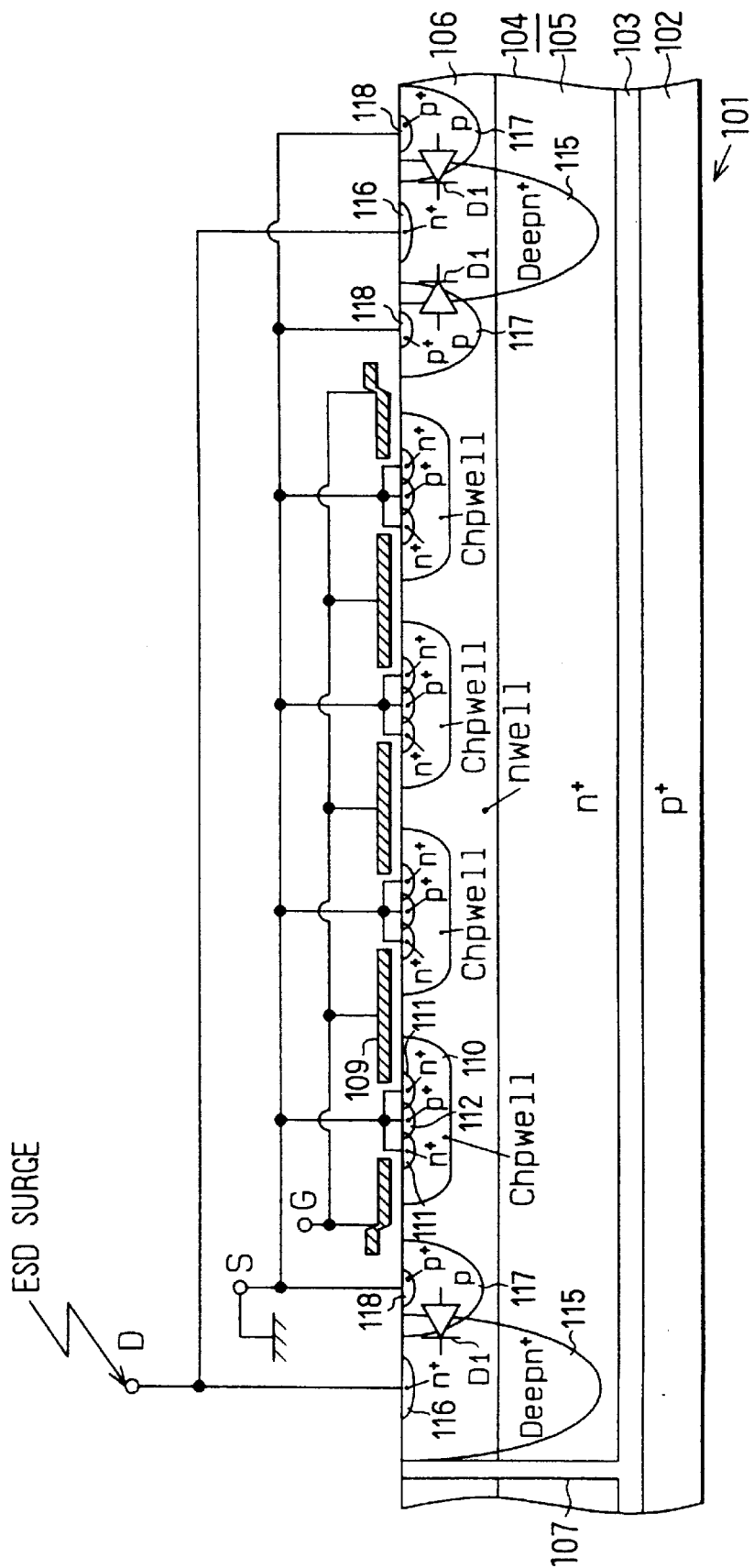
FIG. 4 is a circuit diagram.

See FIG. 1, which is a diagram showing a plan view of main part of a hybrid IC device in accordance with one embodiment of this invention. A longitudinal cross-sectional view taken along line II—II of FIG. 1 is shown in FIG. 2. The illustrative hybrid IC is for use as a component that makes up an electronic controller in land vehicles, typically for driving loads such as lamps and/or relays used therein. This hybrid IC includes a power MOS transistor formed of an up-drain type MOSFET, an enlarged view of main part of which is shown in FIG. 3. Further, a sectional view of this up-drain MOSFET with necessary electrical lead wiring added thereto is shown in FIG. 4.

As shown in FIG. 2, this embodiment employs a silicon-on-insulator (SOI) substrate 101 which consists essentially of a heavily doped p (p$^+$) type silicon substrate 102 and a silicon thin film 104 overlying the substrate 102 with a silicon oxide film 103 sandwiched therebetween. The silicon layer 104 has therein an n-type well layer 106 and a heavily doped n (n$^+$) type silicon layer (semiconductor layer of first conductivity type) 105 that is buried underlying the n-well layer 106. In other words the n-well layer (surface-side semiconductor layer of first conductivity type) 106 is formed on the n$^+$-type silicon layer 105 to have an impurity concentration less than that of this silicon layer 105.

The silicon layer 104 has a narrow deep groove called "trench" 107 as defined therein, which has an inner wall surface on which a silicon oxide film is formed along with a polycrystalline silicon or "polysilicon" filled in the same trench 107. This trench groove 107 permits formation of an array of multiple "islands" as better shown in FIG. 1. And, an up-drain MOSFET is formed in a selected one of these islands.

In such up-drain MOSFET formed island, a polysilicon gate electrode 109 is disposed at a surface of the n-type well layer 106 via a gate oxide film 108 as shown in FIG. 3. A p-type well channel region 110 is formed in a top surface of the n-well region 106 at an end portion of the polysilicon electrode 109 while an n$^+$-type region (source region of first conductivity type) 111 and p$^+$-type region 112 are formed within the p-well channel region 110 at the top surface thereof. In this way the polysilicon gate electrode 109 is disposed via the gate oxide film 108 with respect to a partial region of at least the p-well channel region 110 at the n-well layer 106. In addition a silicon oxide film 113 is formed overlying the polysilicon gate electrode 109. A source electrode (aluminum layer) 114 is disposed over the silicon oxide film 113. This source electrode (aluminum layer) 114 is in contact with the n$^+$ region 111 and p$^+$ region 112, thus completing a source cell. A number of source cells each having a similar structure to this source cell are formed as shown in FIG. 1.

Further formed at the top surface of the n-well layer 106 of FIG. 3 is a deep n$^+$-type region (deep drain region of first conductivity type) 115 which is deep enough to reach the n$^+$-type silicon layer 105. An n$^+$-type region 116 is formed within the deep n$^+$ layer 115 at its top surface portion.

On the other hand, a drain electrode (aluminum layer) 120 is disposed overlying a local oxidation of Si (LOCOS) oxide film 119 on the n-type silicon layer 104 of FIG. 3 so that this drain electrode (aluminum layer) 120 is in contact with the n$^+$-type region 116. In FIG. 2, a silicon oxide film 121 is formed overlying the drain electrode (aluminum layer) 120 and source electrode (aluminum layer) 114. In addition, a second-layered aluminum film 122 is formed on the source electrode (aluminum layer) 114 whereas another second-layered aluminum film 123 is formed on the drain electrode (aluminum layer) 120. A passivation film 124 is formed covering these second aluminum layers 122, 123.

In the up-drain MOSFET thus arranged, upon application of a voltage to the polysilicon gate electrode 109, a current from the drain electrode (aluminum layer) 120 behaves to flow along an expected route of n$^+$ type region 116→deep n$^+$ region 115→n$^+$ silicon layer 105→n-well layer 106→p-well channel region 110's top surface →n$^+$ region 111 and p$^+$ region 112→source electrode (aluminum layer) 114 as shown in FIG. 4.

Further in this example, a p-type base region 117 is formed at the top surface of the n-well region 106 of FIG. 3 in such a manner as to partly overlap the deep n$^+$ region 115. In addition a p$^+$-type base region 118 is formed within the base region 117 at its top surface portion. The p$^+$ base region 118 (p-base region 117) is connected to the source electrode 114. This results in formation of a surge by passing diode D1 between the source and drain.

An explanation will be given of the layout of the deep n$^+$ region 115 and p type base region 117. As shown in FIG. 1, all the source cells involved are subdivided or "partitioned" into four blocks providing four separate cell groups with the deep n$^+$ region 115 being formed around these source cell blocks. The p-type base region 117 is extended so that it neighbors this deep n$^+$ region 115.

Figure 5:
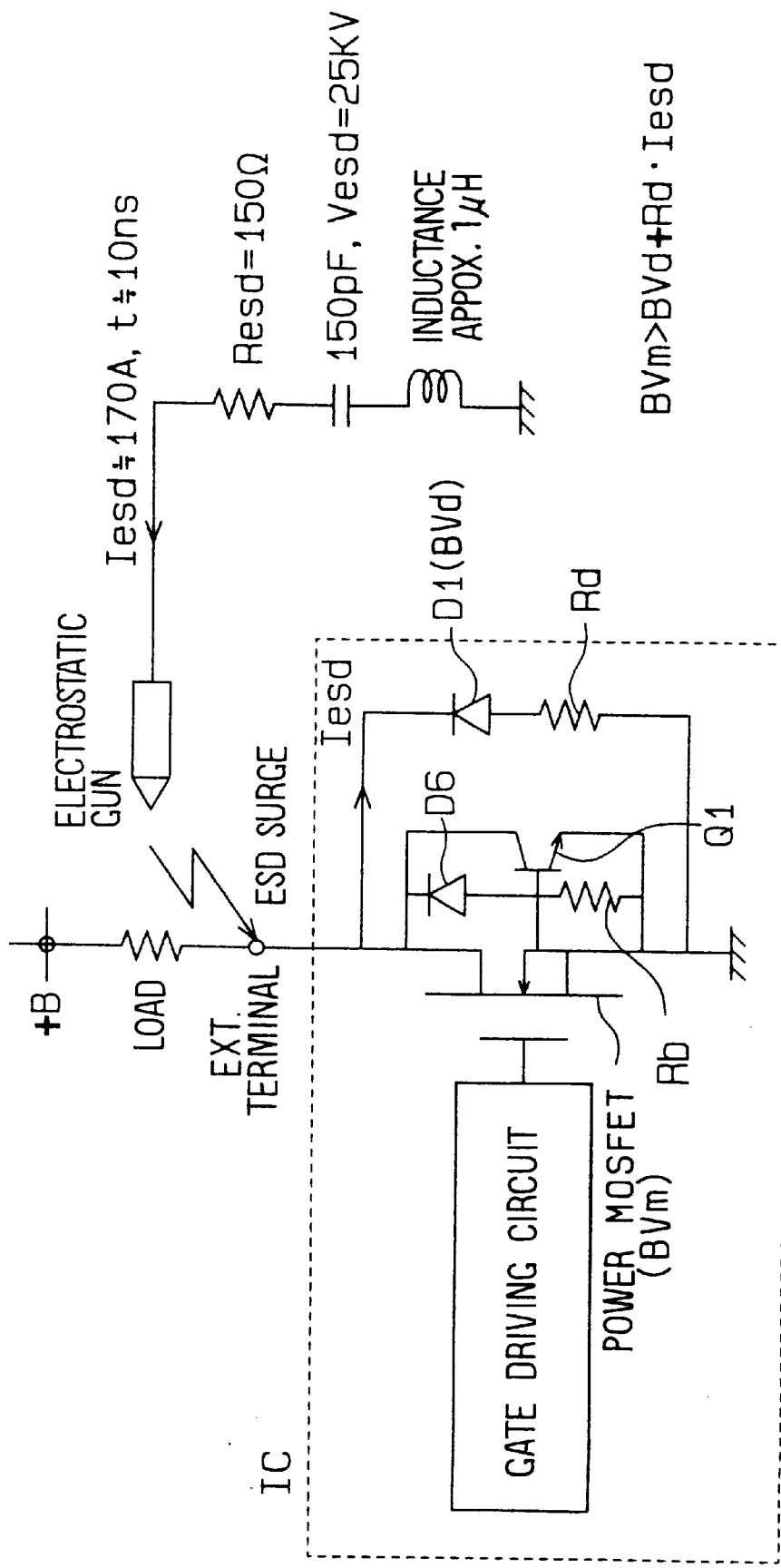
FIG. 5 is a diagram showing a circuit conFIGuration.

A circuit configuration of the IC device is shown in FIG. 5, wherein a power MOSFET (up-drain MOSFET) and its associative gate driver circuit are formed in the IC so that the power MOSFET comes with a body diode D106 along with a parasitic npn transistor Q1 formed thereto. More specifically, in the structure of FIG. 3, the p-well channel region 110 and n-well layer 106 form the body diode D6 whereas the n$^+$ source region 111 and p-well channel region 110 plus n-well layer (n-type drift layer) 106 form the parasitic npn transistor Q1. Further, the bypass diode (surge bypass diode) D1 of FIG. 5 is formed in the deep n region 115 and p-base region 117.

Suppose that the surge bypass diode D1 is absent. If this is the case, upon application of an ESD surge to a drain terminal, a surge current is initially caused to flow by the body diode D6 alone: As the current flowage increases with time, a voltage potential drop due to the parasitic transistor Q1 and base resistance Rb increases resulting in creation of a parasitic transistor operation when the base is biased sufficiently. The bipolar transistor Q1 causes a flow of increased current based on its positive feedback action, which finally reaches permanent destruction.

An actually implemented power MOSFET device such as LDMOSFET or up-drain MOSFET is typically designed to include a parallel array of a great number of micro-size MOSFET cells each of which is miniaturized to measure 10 micrometers ($\mu$m) or more or less (about ten thousand cells per square millimeter). Obviously, each transistor (cell) is not the same as others in electrical lead resistivity. Generally, the lead resistivity of those transistors (cells) lying in close proximity to pads is less in value than the others. In the case of employing two-layered aluminum lead wires as formed into a solid and "fat" layout pattern, the resultant lead resistivity is greatly variable depending upon layout patterns of IC elements and aluminum interconnect leads in a manner such that the resistivity can decrease in value at certain locations at which the second layered aluminum components of the source and drain come closer to each other. One example is that in a device including LDMOS cells laid out per square millimeter while causing their drains and sources to be alternately connected together by use of a first-layered aluminum with a thickness of 0.45 $\mu$m at a diagonal angle of 45 degree into a stripe shape and also letting the second-layered aluminum be laid out into a triangular solid pattern, a difference between lead resistance values of adjacent transistors becomes as large as 10 ohms ($\Omega$). Accordingly, finally destructible transistors (cells) are limited only to a very small number of specific transistors (cells) with less lead resistivity while preventing destruction of all the power MOS transistors used.

In any case, it is true that surge destruction takes place principally due to an operation of the parasitic bipolar transistor Q1—in view of this, what should be firstly done to attain the required surge withstand rating is to make such bipolar transistor inoperative. To this end, it will be the best way to preclude the power MOSFET from exhibiting any breakdown operation.

To attain the foregoing, the illustrative embodiment is specifically arranged so that as shown in FIG. 5, when letting the entire surge current $I_{esd}$ flow in the surge bypassing diode (bypass diode) D1 as internally provided in the IC, the resulting voltage of its breakdown voltage Bvd plus a voltage potential drop due to operation resistance Rd, i.e. Rd·$I_{esd}$, stays less than the power MOSFET's breakdown voltage BVm, as represented by, $$BVm > BVd + Rd \cdot I_{esd}, \ Rd < (BVm - Bvd)/I_{esd} \quad (1)$$

In other words, the bypass diode D1 is specifically designed in layout size and shape in a way such that its operation resistance (parasitic resistance) Rd satisfies Formula (1). To minimize the layout size, it will be recommendable to increase the length (total opposite length) of a high density pn junction (e.g. deep n$^+$/base).

Note here that in the case of FIG. 5, the surge application condition is as follows. Letting a voltage $V_{esd}$=25 kv, resistance $R_{esd}$=150Ω, the surge current $I_{esd}$ may be given as:

$$I_{esd} = V_{esd}/R_{esd} = 25k/150 \approx 170 \ (A).$$

In this way, the illustrative embodiment permits construction of the intended surge protection circuit with its surge withstand rating being kept constant irrespective of power element sizes and electrical lead layout patterns, by specifically designing the operation resistance and breakdown voltage of the bypass diode D1 to ensure that the bypass diode D1's cathode potential becomes less than the power MOS transistor's drain breakdown voltage upon flowing of a maximal value of ESD surge current in the bypass diode D1, which current inherently has its maximum value determinable depending on voltage application conditions.

An additional explanation will next be given of the embodiment device in comparison with the device of FIG. 21.

Figure 21:
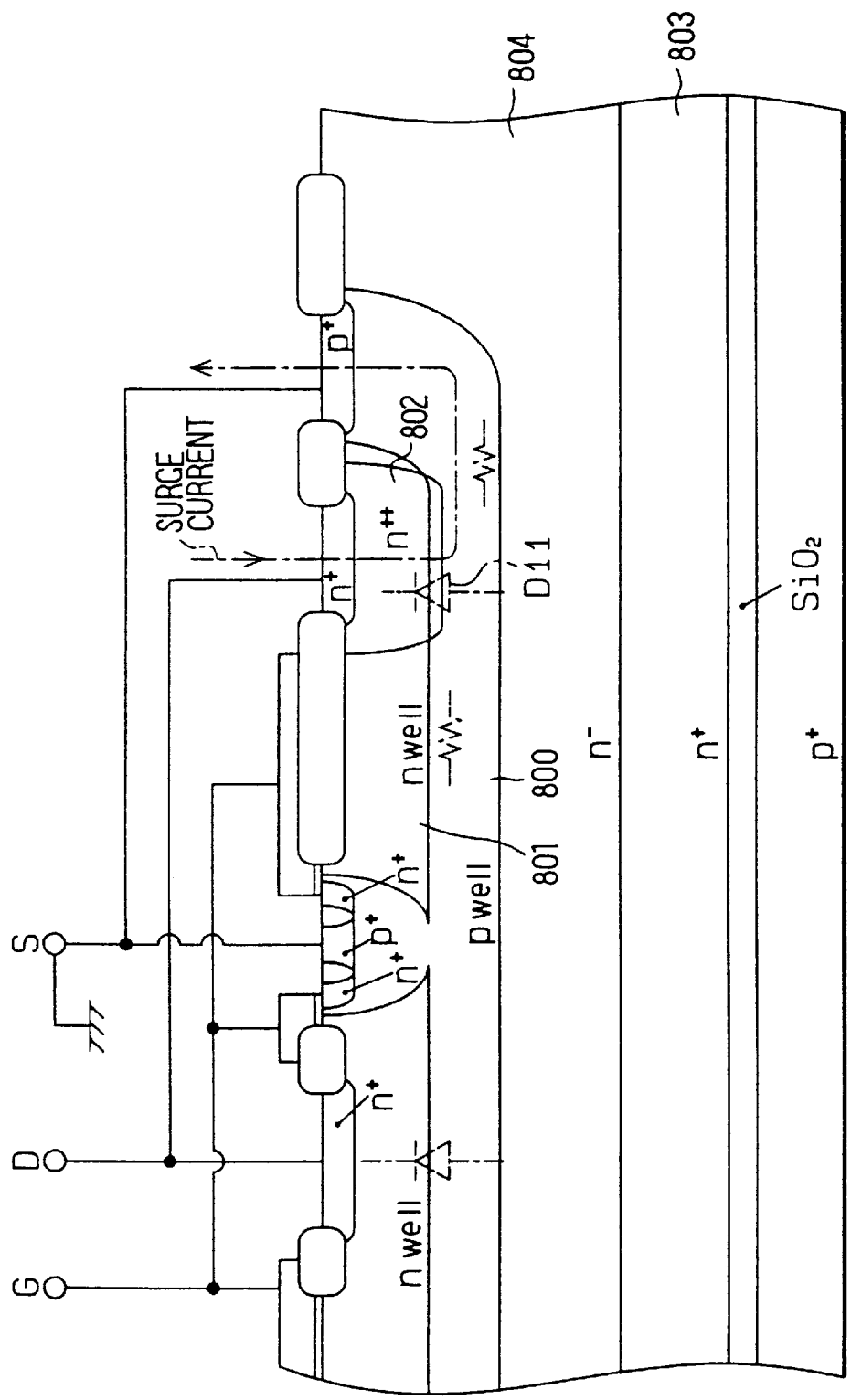
FIG. 21 is a diagram showing in cross-section a prior art semiconductor device.

The device of FIG. 21 is structured to include at the outer periphery of LDMOS device a built-in protective diode D11 as the ESD remedy in resurf type LDMOS structure, which diode breaks at a specified breakdown voltage that is less than that of internal cells. This structure is designed in principle based on the so-called resurf structure (its breakdown voltage is determinable by the impurity concentration and diffusion depth of an LDn well region 801 overlying LDp well region 100) which utilizes an n-type diffusion layer 801 overlying the same LDp well region 800 with respect to both its LDMOS cell unit and protective diode unit. Due to this, the LDMOS cell unit measures about 70 volts in breakdown voltage whereas the breakdown voltage of a protective diode D11 is about 60 volts because this diode is arranged so that an n-type drain region 802 is laminated or stacked over the LDn well region 801 of such cell unit, resulting in a difference therebetween being as less as about 10 volts.

In contrast, with the up-drain structure of this embodiment, the breakdown voltage of its source cell unit is as high as 120 volts in the presence of electric field curvature relax effects due to integration of cells. On the other hand, the breakdown voltage of a protective diode D1 at the outer periphery is determined by a distance between the deep n$^+$ region and base region as provided at the outer periphery-it measures about 70 volts.

In short, the up-drain structure embodying the invention is such that the diode D1's breakdown voltage may be designed in a way almost completely independent of the cell unit, which makes it possible to successfully attain a sufficiently increased breakdown voltage difference required. This in turn enables further improvement in ESD withstand voltage rating.

Further, with the device of FIG. 21, its electrical sheet resistivity is noticeably high to measure about 10kΩ/□ because of the fact that this device is formed to have the so-called pinch structure with the p-type layer 800 for use as an anode region of the protective diode D11 being laid between the n-type LDn well region 801 (or alternatively n-type drain region 802) and the n-type layers 803, 804.

The illustrative embodiment, by contrast, is such that the anode's sheet resistivity is as low as about 200Ω/□ of base region 17 due to the fact that the deep n$^+$ region and base layer are sued to form the diode. Due to this, it is possible to much reduce the operation resistance of protective diode than the device of FIG. 21, which in turn makes it possible to increase the ESD withstand rating to a higher level than the device of FIG. 21.

In addition, with the device of FIG. 21, this is out of the "pure" diode structure due to the presence of an n-type epitaxial layer 804 beneath the protective diode D11, wherein this device is designed to internally include a parasitic npn transistor (with its collector formed of an n-type region at a surface for lamination of the LDn well region 801 and n-type drain region 802, a base formed of its underlying LFp well region 800, and an emitter of the n-type layer 804 of the substrate). With such a structure, an increase in surge current can result in an increase in voltage potential at the p-type base of such parasitic transistor causing a bipolar operation. To be brief, this device is faced with a problem that it becomes readily destructible by current concentration action resulted from such bipolar operation. Actually, experimentation for comparison of ESD withstand voltage rating with respect to the same element size reveals that whereas the case of FIG. 21 results in measurement of mere 3 kV or thereabout, the illustrative embodiment offers drastic improvement of the rating to measure 18 kV; thus, the superiority of this embodiment becomes apparent.

An explanation will next be given of a manufacturing method of the device embodying the invention in conjunction with FIGS. 6A through 11B below.

Figure 6A:
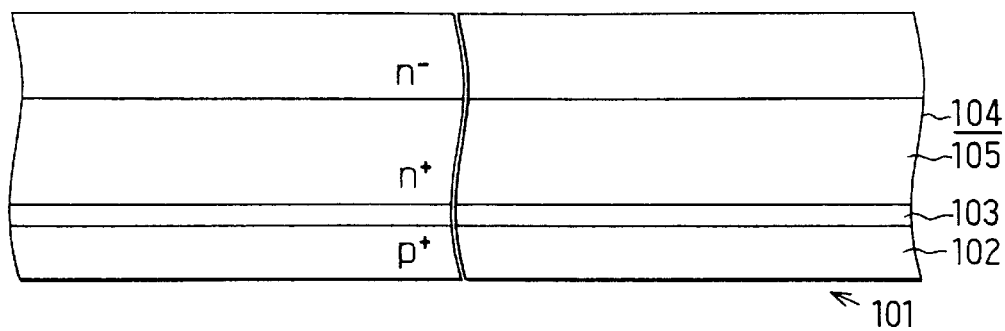
FIGS. 6A–6C through 11A–11B are sectional views for explanation of a manufacturing process.

Firstly, as shown in FIG. 6A, fabricate an SOI wafer 101. More precisely, prepare a p$^+$-type support substrate 102 into which a chosen impurity—here, boron (B)—was doped to a concentration of about 1×10$^{18}$ atoms per cubic centimeter (cm$^{-3}$). Then, fabricate on the substrate a buried oxide film 103 to a thickness of about 1 μm. Further form thereon an n-type device formation layer 104 to a thickness of 15 μm with phosphorus (P) doped thereinto to a concentration of 1×10$^{15}$ cm$^{-3}$. In this case, the n$^+$-type buried layer 105 is formed through diffusion of antimony (Sb) into the entire surface area of the wafer (the sheet resistivity is about 20Ω/□, diffusion depth is about 3 μm).

Figure 6B:
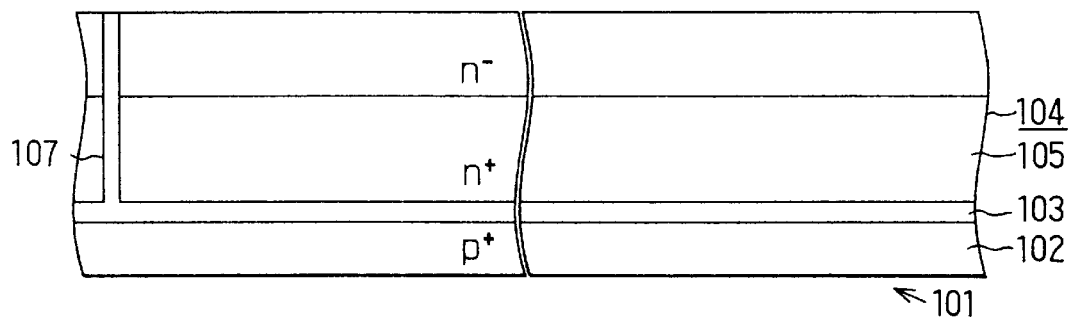

Then, as shown in FIG. 6B, use an oxide film as a trench mask to fabricate by dry etch techniques a groove (trench) 107 for definition of an element isolation region. After having formed the trench, chemical dry etching (CDE) and annealing and the like are performed for recovery of damaged portions. Then, perform oxidation of trench sidewalls and polysilicon burying. Additionally, let extra polysilicon be removed away through etch back or chemical mechanical polish (CMP) processing, for exposure of a silicon surface (device formation surface).

Figure 6C:
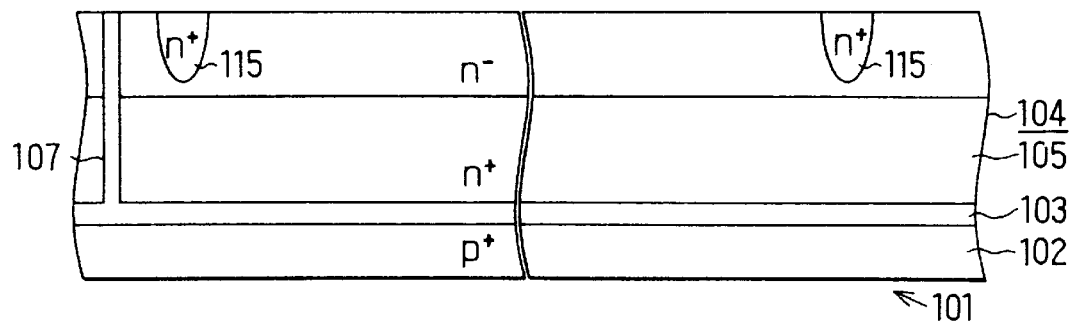
Figure 7A:
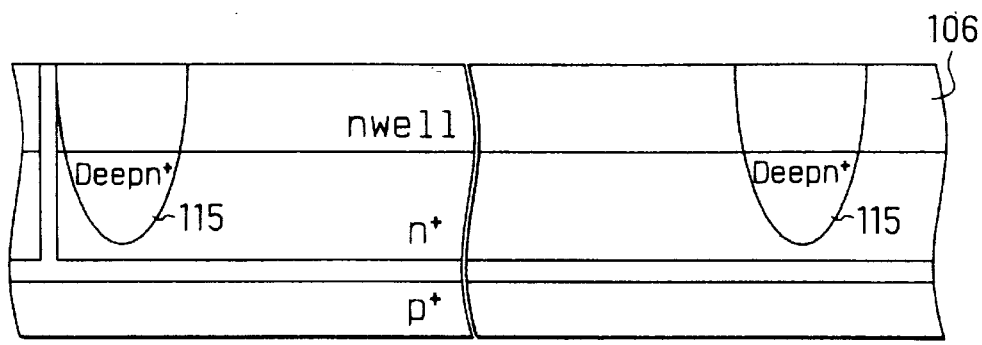

Further, as shown in FIG. 6C, fabricate a deep n$^+$ region 115 for use as the drain of an up-drain element and also as the cathode of a protective diode. More specifically, a chosen impurity, such as phosphorus (P), is doped by implantation techniques at a dose of $3 \times 10^{15}$ atoms per square centimeter ($cm^{-2}$) with an oxide film of about 40 nanometers (nm) thick being used as a through oxide film; then, the resultant structure is subjected to thermal processing at a temperature of about 1050° C. for one hour, thus letting the doped impurity outdiffuse within the wafer. Further, form an n-well layer 106 for reduction of the drift resistivity of resultant elements. More specifically, phosphorus (P) is doped by implantation at a dose of about $3 \times 10^{12}$ $cm^{-2}$, followed by thermal processing at about 1170° C. for 10 hours for outdiffusion of the impurity within the wafer. The resulting structure is as shown in FIG. 7A.

Figure 7B:
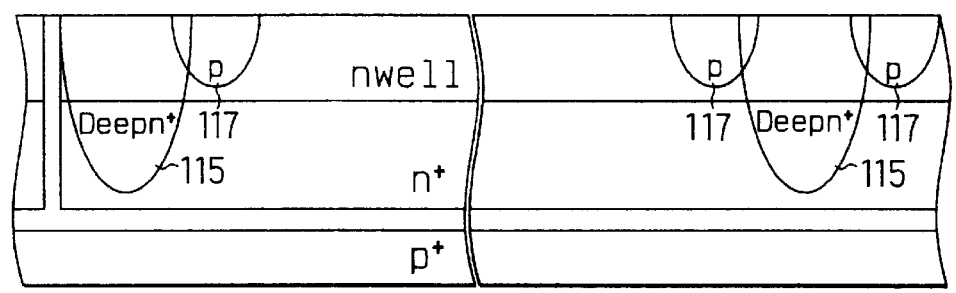

Then, as shown in FIG. 7B, fabricate a p-type base region 117 for later use as the anode of the protective diode. More specifically, boron (B) is doped by implantation techniques at a dose of $2 \times 10^{14}$ $cm^{-2}$; then, the resultant structure is subject to thermal processing at about 1150° C. for thirty minutes for outdiffusion of the impurity within the wafer. Note here that it will also be permissible when necessary that the p-base region 117 is provided in not only the protective diode section but also a source cell unit. In the latter case, the cell unit decreases in base impurity concentration of a parasitic npn transistor, rendering such parasitic transistor hardly operative, thus enabling cells per se to likewise increase in surge withstand voltage rating.

Figure 7C:
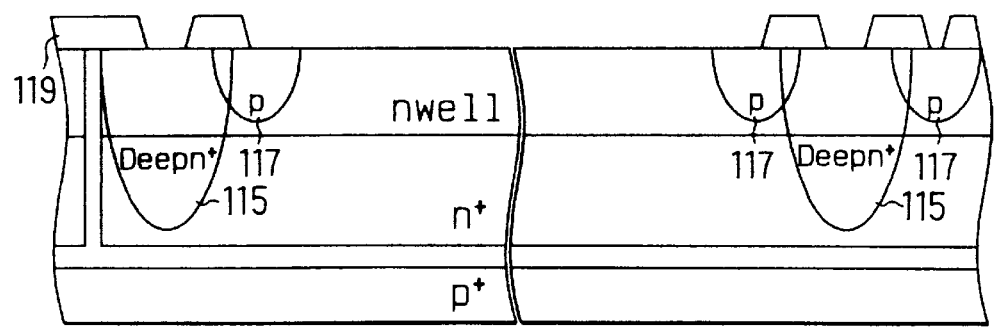

Subsequently, as shown in FIG. 7C, form in a field section a thermal oxide film (LOCOS) 119 with an SiN film used as a mask (at 950° C. for 11 hours).

Figure 8A:
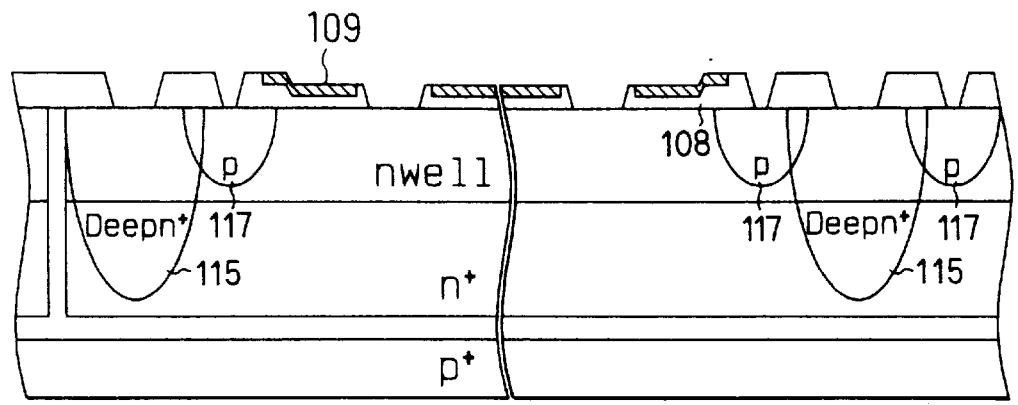
Figure 8B:
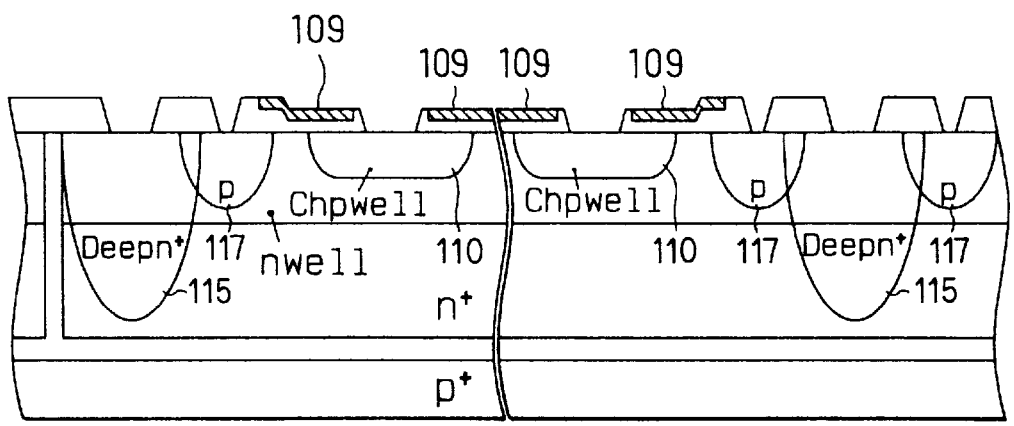

And, as shown in FIG. 8A, deposit a gate polysilicon film for later use as a gate electrode 109. Then, deposit phosphorus to a thickness of about 370 nm, providing a resultant film with its sheet resistivity of about $25\Omega/\square$, which is then subject to patterning. Thereafter, the polysilicon gate 109 is oxidized for profile rounding at 1000° C. for one hour.

Further, as shown in FIG. BB, use the polysilicon layer 109 as a mask to form a p-well channel region 110. Specifically, boron (B) is doped by implantation at a dose of $3 \times 10^{13}$ $cm^{-2}$; then, the resultant structure is thermally annealed at about 1050° C. for 7 hours.

Figure 8C:
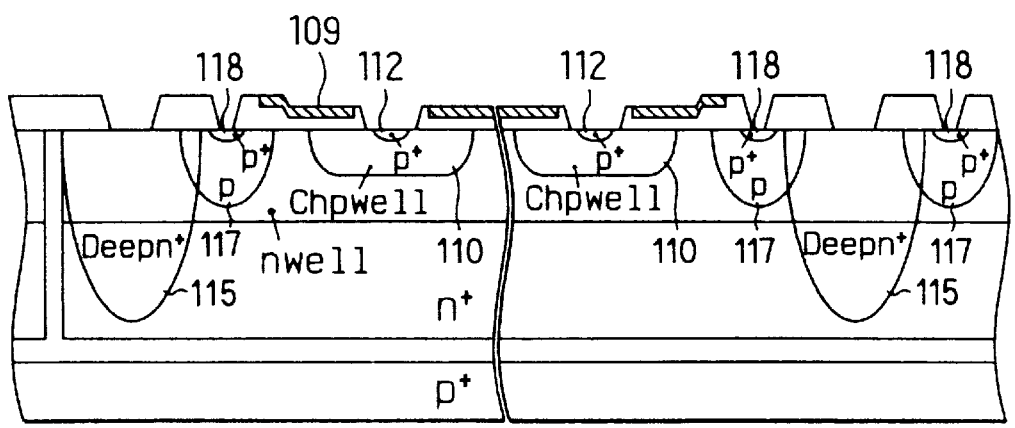
Figure 9A:
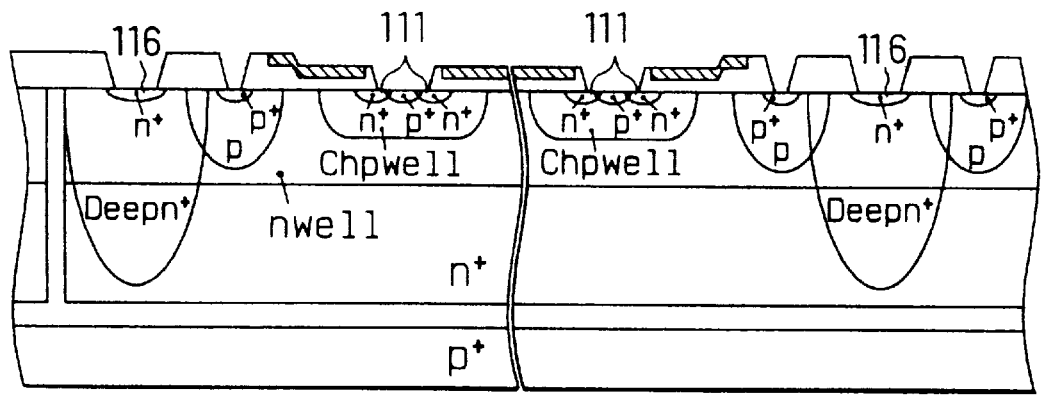

Subsequently, as shown in FIG. 8C, fabricate $p^+$-type regions 112, 118 using $BF_2$ at a dose of $5 \times 10^{15}$ $cm^{-2}$ while forming $n^+$-type regions 111, 116 using As at a dose of $5 \times 10^{15}$ $cm^{-2}$ as shown in FIG. 9A.

Figure 9B:
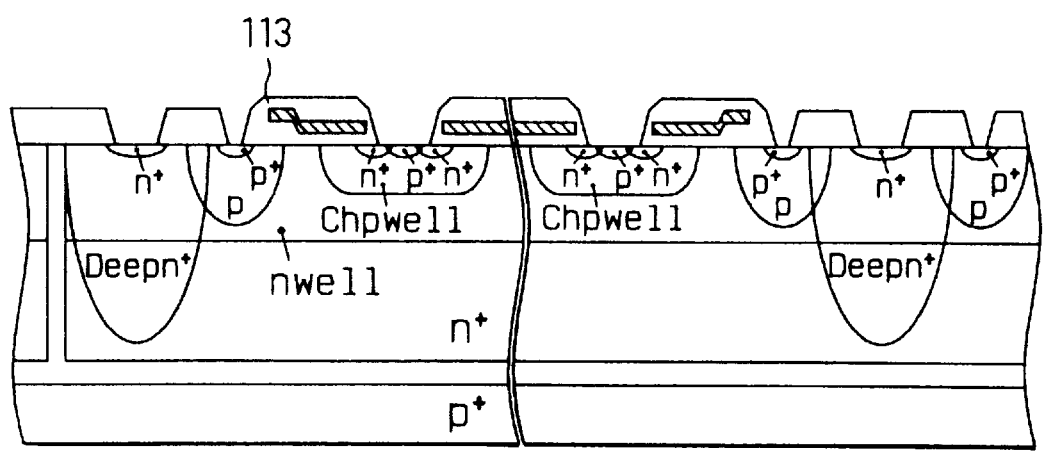
Figure 10A:
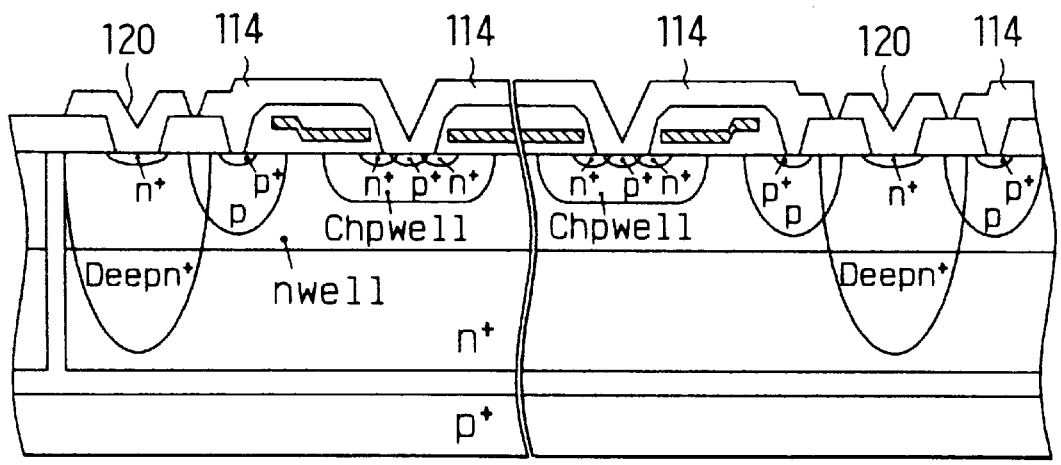

Then, as shown in FIG. 9B, deposit a BPSG film 113 to a thickness of about 670 nm while forming more than one contact by dry etch techniques. Thereafter, as shown in FIG. 10A, deposit first-layered aluminum films 114, 120 to a thickness of about 450 nm, which till then be subject to patterning.

Figure 10B:
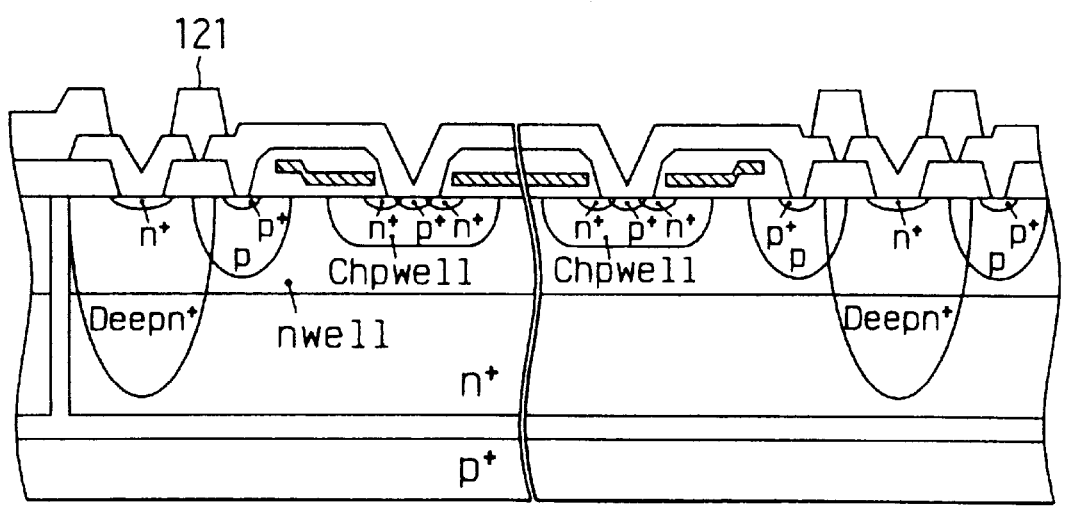
Figure 11A:
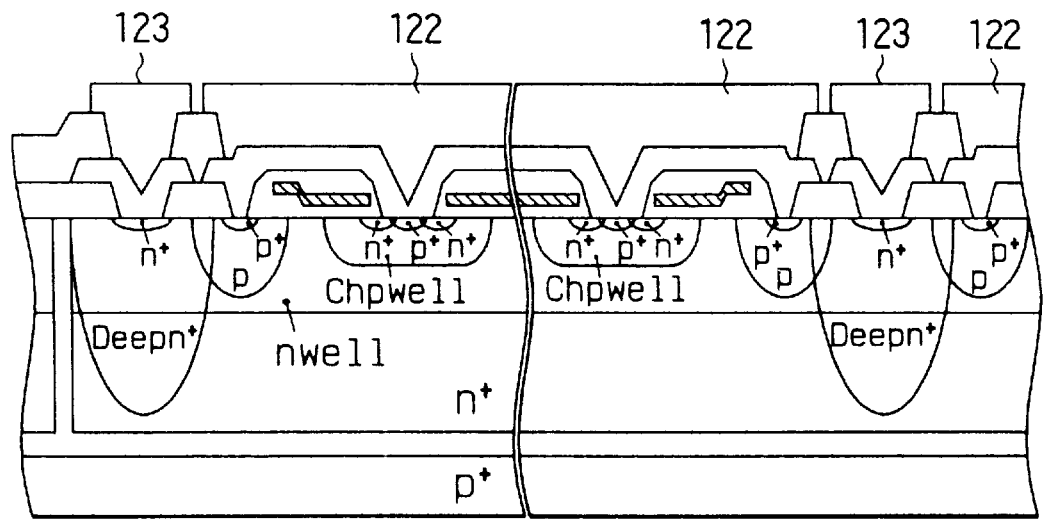
Figure 11B:
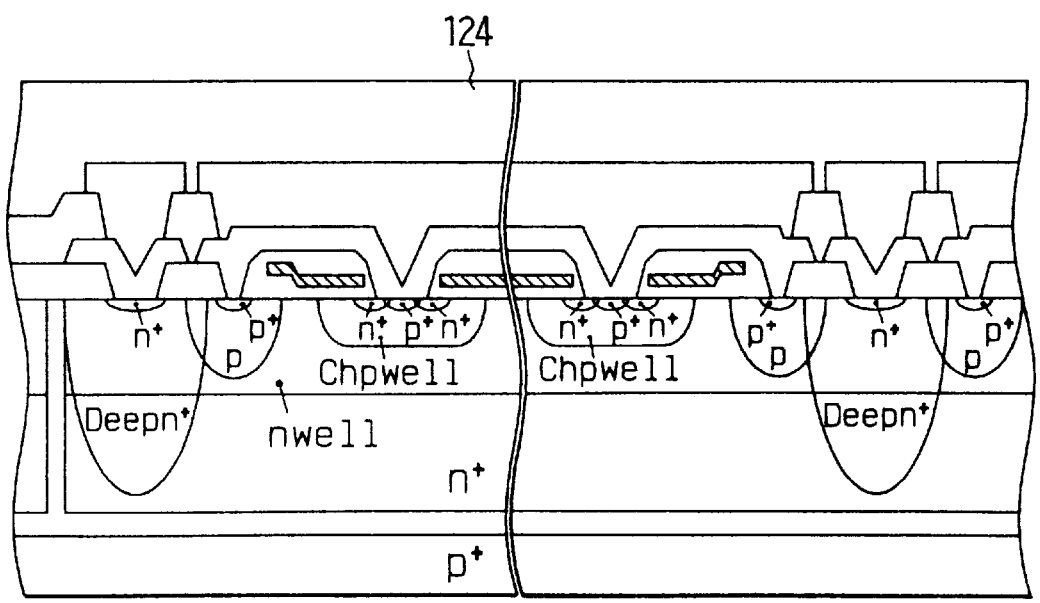

Thereafter, as shown in FIG. 10B, deposit a TEOS interlayer film 121, which is then etched for formation of via holes therein. Then, as shown in FIG. 11A, deposit second-layer aluminum films 122, 123 to a thickness of about 900 nm, which are then patterned. Furthermore, as shown in FIG. 11B, deposit an SiN layer 124; etch the SiN layer 124 for removal of its selected portions lying at pad sections. Where by the element fabrication process is completed.

As apparent from the foregoing, the illustrative embodiment has some features which follow.

(i) As shown in FIG. 3, the up-drain MOSFET is arranged such that the p-type base region (base region of second conductivity type) 117 is formed at a top surface portion of the a type well layer (surface-side semiconductor layer) 106 in such a manner as to partly overlap the deep $n^+$ region (deep drain region) 115 while connecting the base region 117 to the source side to thereby form the surge bypass diode D1 between the source and drain so that the source cell unit is increased by electric field curvature relax effects due to cell integration to measure about 120 volts in breakdown voltage when compared to resurf MOS structures. In addition, it is possible to design the breakdown voltage of a protective diode in a way almost independent of the break down voltage of the cell unit thereby permitting the breakdown voltage of the protective diode D1 at the outer periphery to be determined to measure approximately 70 volts by a distance or spatial interval between the deep $n^+$ region and base region as provided at the periphery, which in turn makes it possible to provide a sufficient break down difference required. It is thus possible to further improve the ESD withstand voltage rating. Furthermore, forming the diode by use of the $n^+$ region and base region makes it possible to permit the anode's sheet resistance to be as low as about $200\Omega/\square$ of the base layer, which in turn enables reduction of the operation resistance of the protective diode as compared to the device of FIG. 21, thus allowing the ESD withstand voltage rating to be less than that of the FIG. 21 device. In addition, the protective diode is hardly affectable by any possible current localization occurring due to a bipolar operation, thus improving the withstand voltage rating. With the advantages above, it becomes possible to achieve the power MOS transistor with protective diode D1 offering an increased breakdown voltage difference while reducing sheet resistivity thereof.

(ii) A MOS element (currently available standard element) having a field plate structure at a cell outer periphery is such that since the cell's outer periphery part is higher in breakdown voltage than cell inside part, the latter part is firstly broken down prior to the former part's breakdown in the event of surge application, which makes it unexpectable to attain surge bypassing effect as obtainable by the protective diode. In contrast, the illustrative embodiment is specifically arranged so that when letting a maximal current in conformity with the surge current application condition flow into a surge bypass diode D1, the same diode D1's cathode potential stays lower than the breakdown voltage at the drain of a transistor; thus preferably improving the applicability and utilizability thereof.

It is noted that the present invention should not be limited only to the embodiment stated supra and is modifiable in form for implementation in a way which follows.

Figure 12:
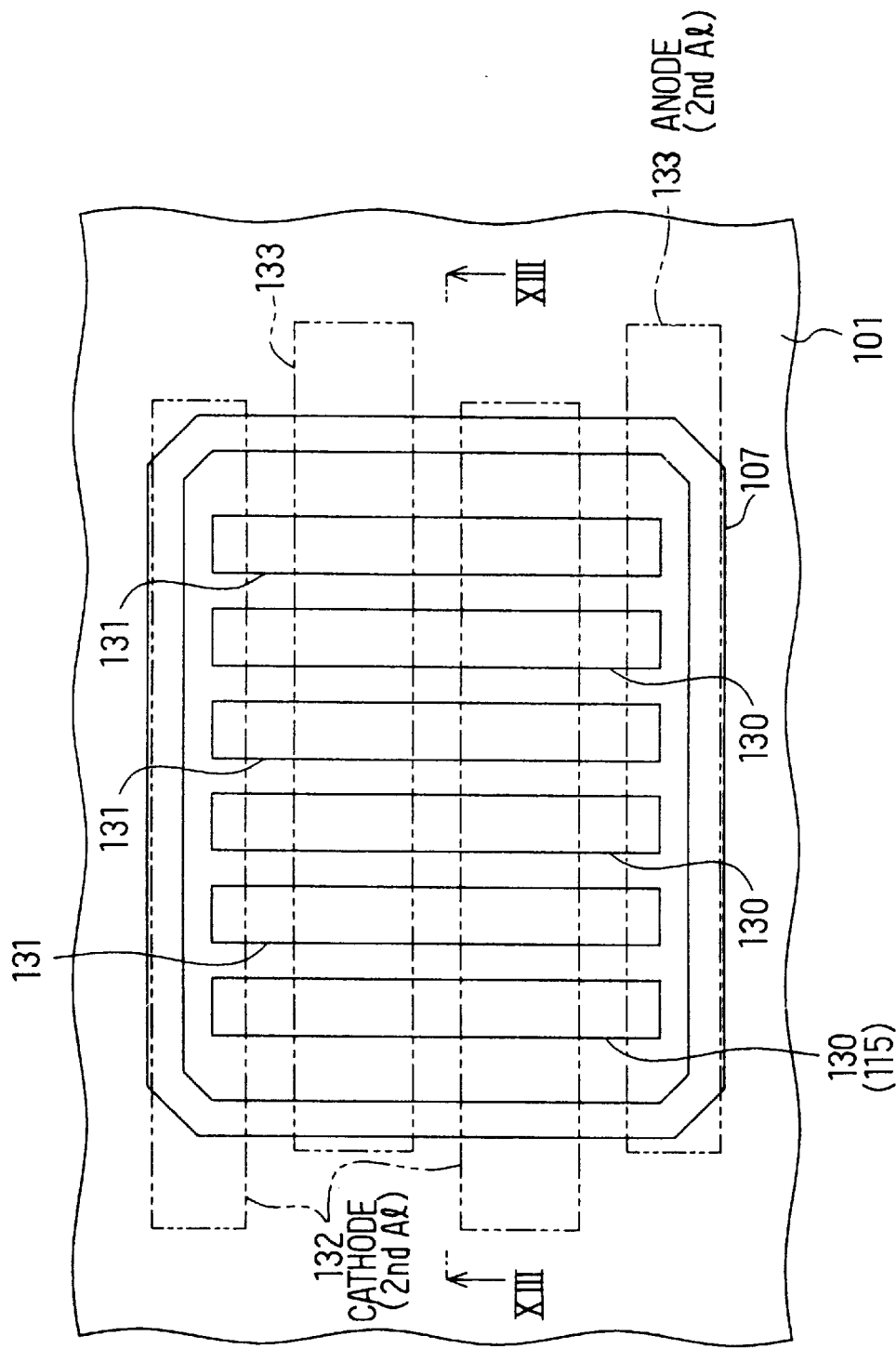
FIG. 12 is a plan view of a hybrid IC.
Figure 13:
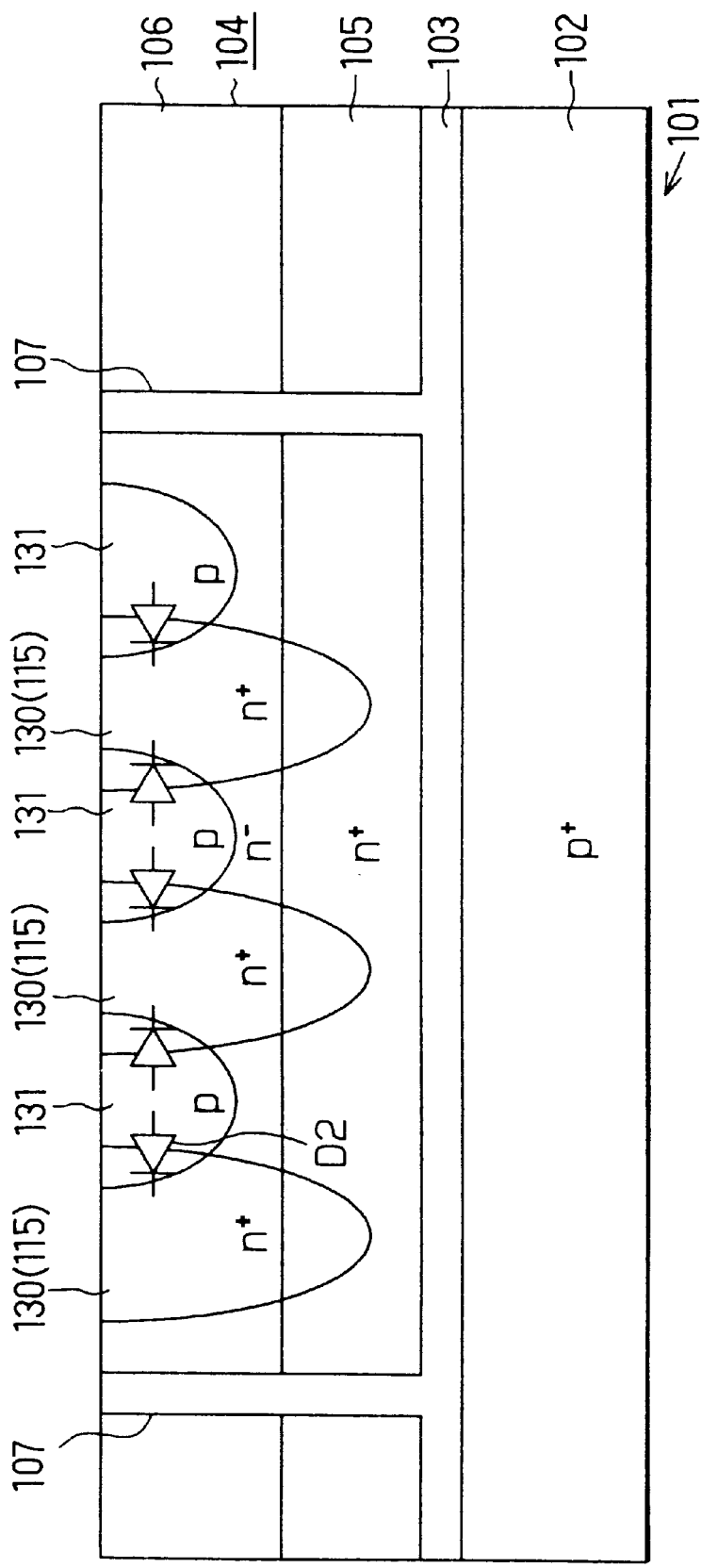
FIG. 13 is a longitudinal sectional view of the device of FIG. 12 taken along line XIII—XIII.

Although in the structure shown in FIG. 1 the surge bypass diode D1 is formed within a selected transistor formation island, this may be replaced with a surge bypass diode D2 which is formed in another island (another region) different from the transistor formation is land (transistor formation region) as shown in FIGS. 12–13. More specifically, as shown in FIG. 13, an array of multiple parallel deep $n^+$-type regions (semiconductor region of first conductivity types) 130 is formed in a top surface of the n-well layer (surface-side semiconductor layer) 106 at a trench island, wherein a respective one of these deep $n^+$ regions 130 is designed to extend straightly. The deep $n^+$ regions 130 have been formed simultaneously during fabrication of the deep $n^+$ region (deep drain region) 115 of FIG. 2. Additionally a p-type base region (base region of second conductivity type) 131 is formed in such a way as to partly overlap the deep $n^+$ regions 130 of FIG. 13, wherein this p-base region 131 extends straightly in close proximity to the deep $n^+$ region 130 as shown in FIG. 12. Furthermore, using a cathode electrode (second-layer aluminum) 132 and anode electrode (second-layer aluminum) 133, the p-base region 131 is connected to the source side whereas the deep $n^+$ regions 130 are coupled to the drain side with respect to a transistor as formed in another island. In this way the surge bypass diode D2 is formed between the source and drain.

Although the explanation above is directed to one exemplary up-drain structure, the present invention may also be applicable to an LDMOS structure. A planar view of this structure as shown in FIG. 14, and a sectional view taken along line XV—XV is shown in FIG. 15.

Figure 15:
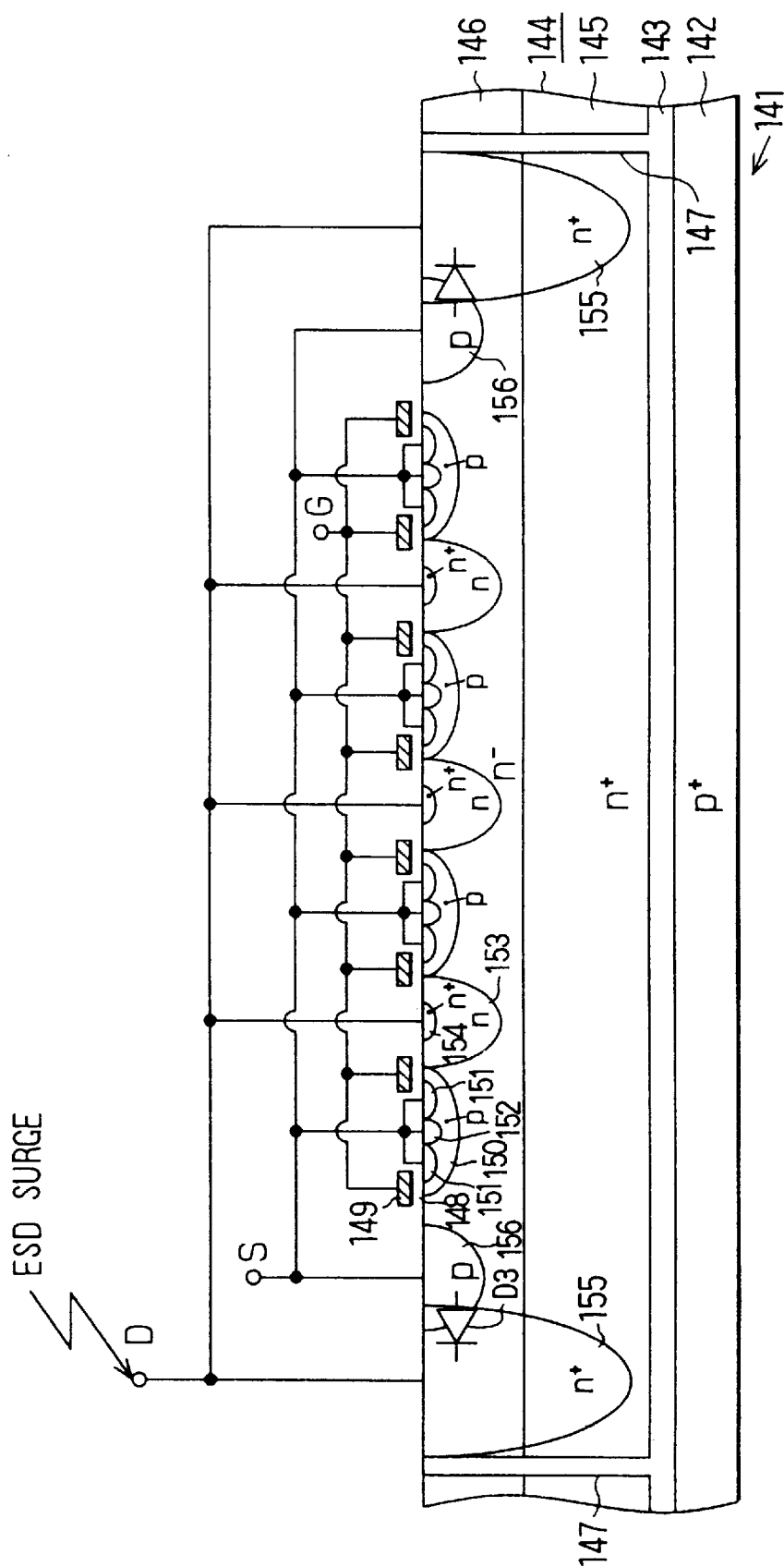
FIG. 15 is a longitudinal sectional view of the device of FIG. 14 along line XV—XV.

As shown in FIG. 15, the LDMOS structure includes an SOI substrate 141, which is structured from a p$^+$-type silicon substrate 142 and a thin-film silicon layer 144 with a silicon oxide film 143 sandwiched therebetween. In the silicon layer 144, an n$^+$ silicon layer (buried semiconductor layer of first conductivity type) 145 is buried or embedded beneath an n$^-$-type silicon layer 146. More specifically the n$^-$ silicon layer (surface-side semiconductor layer of first conductivity type) 146 is formed on the n$^+$ silicon layer 145 and is less in impurity concentration than the same silicon layer 145.

Figure 14:
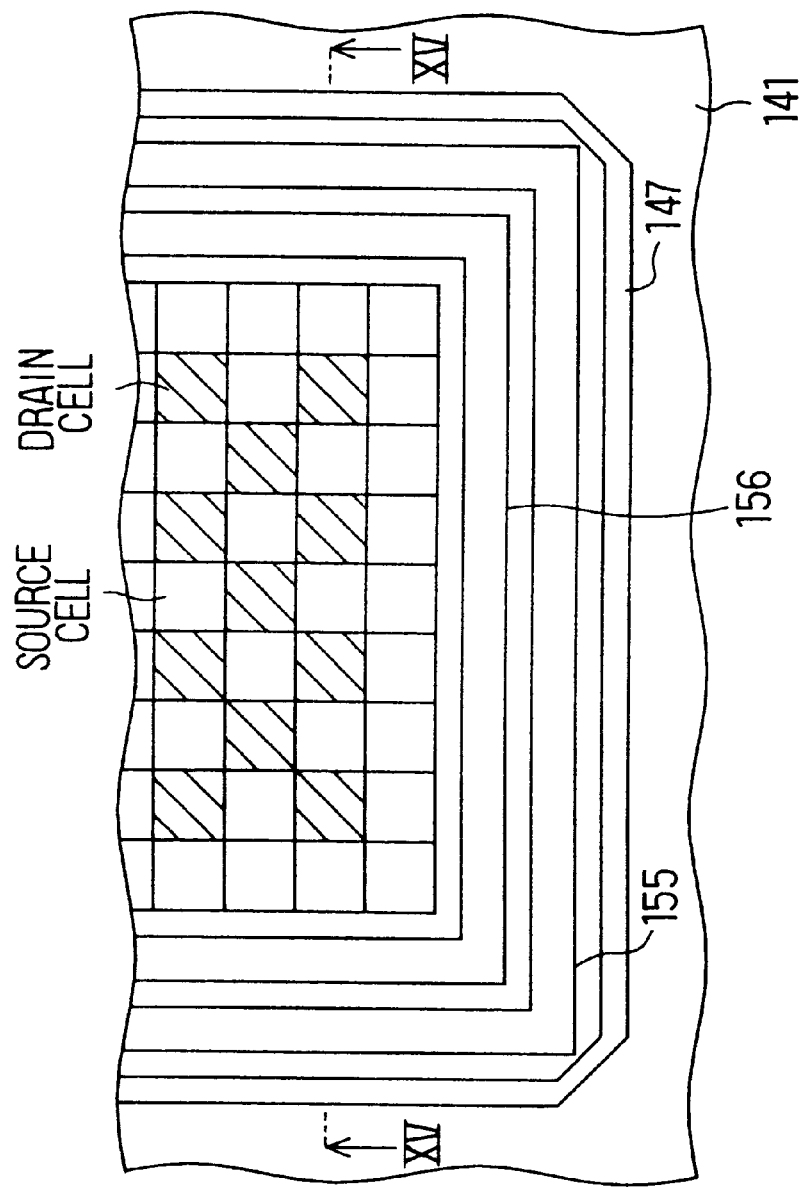
FIG. 14 is a plan view of a hybrid IC.

A trench 147 is formed in the silicon layer 144 for defining or partitioning more than one island as shown in FIG. 14. An LDMOSFET is formed at one island.

At the LDMOSFET formation island, a polysilicon gate electrode 149 is disposed at a top surface portion of the n$^-$type silicon layer 146 with a gate oxide film 148 laid therebetween as shown in FIG. 15. A p-type well region 150 for use as a channel is formed in a top surface of the n$^-$ silicon layer 146 at an edge portion of the polysilicon gate electrode 149 while an n$^+$-type region (source region of first conductivity type) 151 and p$^+$-type region 152 are formed in the surface within the p-well channel region 150. In this way the polysilicon gate electrode 149 is disposed via the gate oxide film 148 with respect to a partial region of at least the p-well channel region 150 at the n$^-$ silicon layer 146.

In addition an n-type drain region 153 is formed in the surface of the n$^-$ silicon layer 146; further, an n$^+$-type region 154 is formed in a surface of the drain region 153.

Further in this example, a deep n$^+$-type region (semiconductor region of first conductivity type) 155 is formed in the surface of the n$^-$ silicon layer 146 while a p-type base region 156 is formed to partly overlap the deep n$^+$ region 155, wherein the base region 156 is connected to a source terminal whereas the deep n$^+$ region 155 is coupled to a drain terminal. Whereby a surge bypass diode D3 is formed between the source and drain.

In addition, the surge bypass diode D3 is designed so that its cathode potential is less than the drain breakdown voltage of a transistor when letting a maximal current in conformity with surge current application conditions flow in the surge bypass diode D3.

With this LDMOS structure also, this does not employ any resurf structure; thus, the LDMOS structure is hardly destructible because, unlike the prior art, no parasitic transistors are present in a protective diode unit.

As per electrical lead wiring, the drain is connected to the protective diode's cathode (deep n$^+$ region 155) while coupling the source and anode (base region 156) together; accordingly, any current no longer flows in the surge bypass diode D3 during a normal MOS operation with the gate driven. Upon application of an over-voltage such as ESD to the drain in the turn-off state, the surge bypass diode D3 of low breakdown level behaves to break down allowing a surge current to flow therein.

Figure 16:
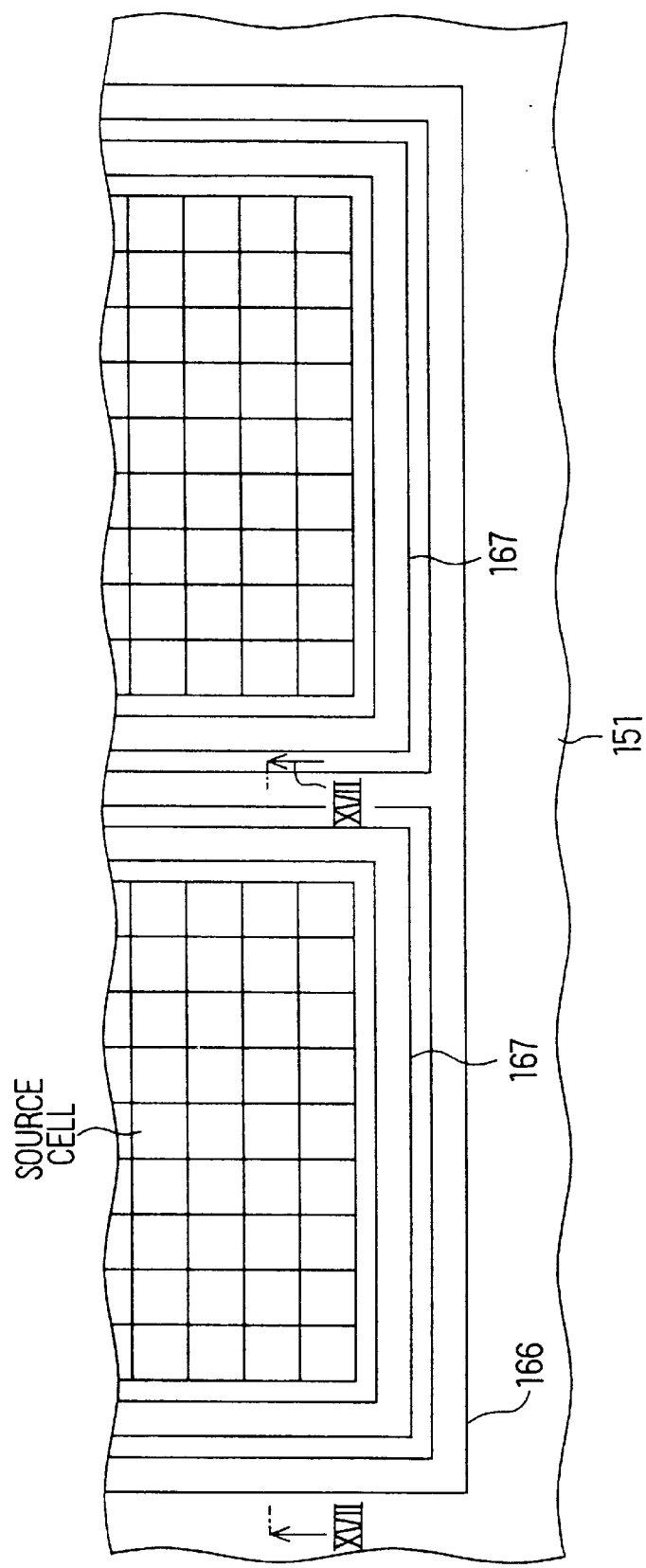
FIG. 16 is a plan view of a hybrid IC.
Figure 17:
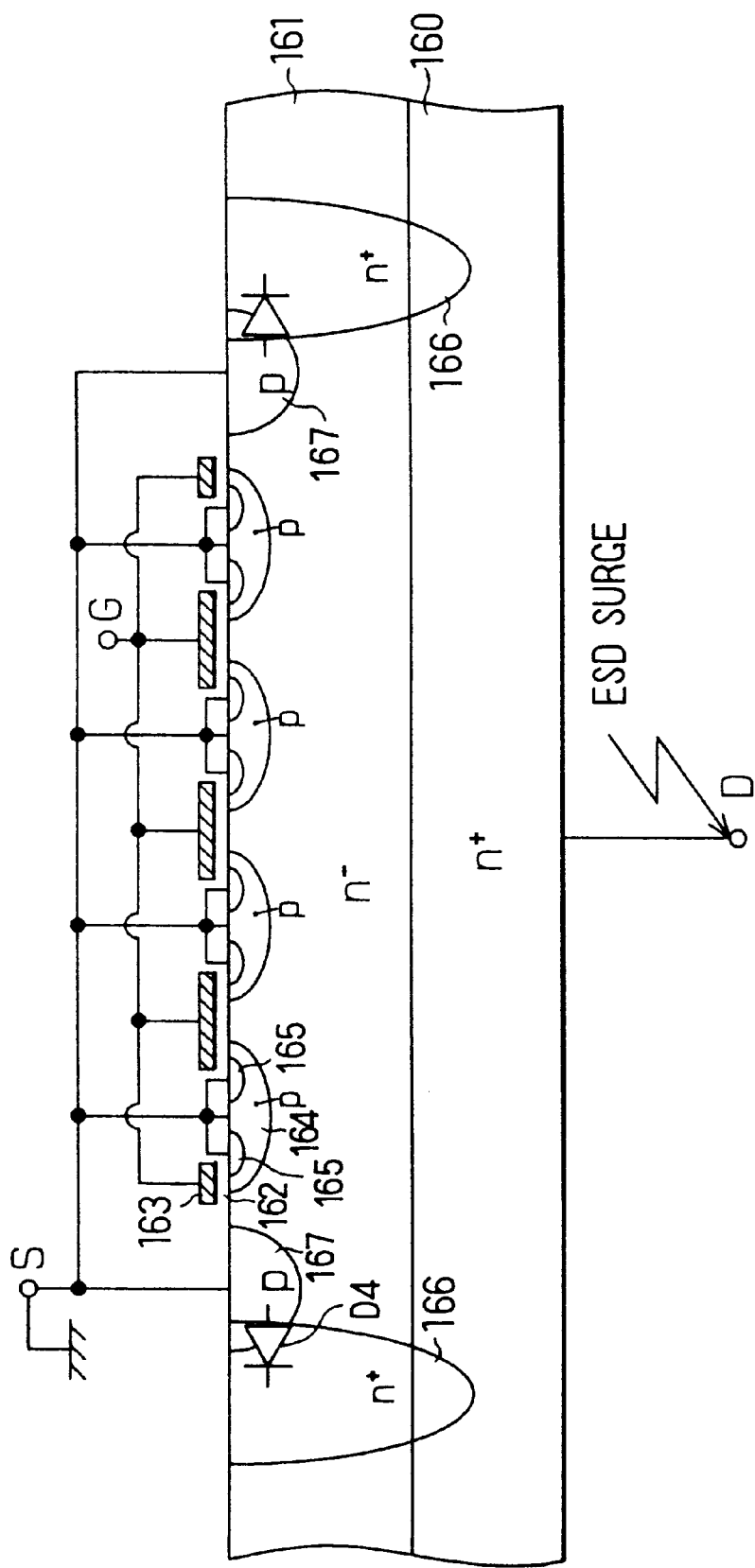
FIG. 17 is a longitudinal sectional view of the device of FIG. 16 along line XVII—XVII.

The present invention may alternatively be applied to a VDMOSFET as shown in FIGS. 16–17. In FIG. 17 an n$^-$-type silicon layer (surface-side semiconductor layer of first conductivity type) 161 is epitaxially grown on an n$^+$-type silicon substrate (semiconductor substrate of first conductivity type) 160 for use as a drain region. In other words the n$^-$ silicon layer 161 is formed on the n$^+$ silicon substrate 160 to have its impurity density lower than that of the same substrate 160. A polysilicon gate electrode 163 is disposed over a top surface of the n$^-$ silicon layer 161 via a gate oxide film 162. A p-type well region 164 for use as a channel is formed in a top surface of the n$^-$ silicon layer 161 at an end portion of the polysilicon gate electrode 163 while an n$^+$-type region (source region of first conductivity type) 165 is formed in the surface within the p-well channel region 164. In this way the polysilicon gate electrode 163 is disposed via the gate oxide film 162 with respect to a partial region of at least the p-well channel region 164 at the n$^-$ silicon layer 161.

Further in this example, a deep n$^+$ region 166 is formed which extends from the top surface of the n$^-$ silicon layer 161 to reach the n$^+$ silicon substrate 160 while forming in the surface of n$^-$ silicon layer 161 a p-type base region 167 which partly overlaps the deep n$^+$ region 166. The base region 167 is connected to a source terminal thereby forming a surge bypass diode D4 between the source and drain.

Figure 18:
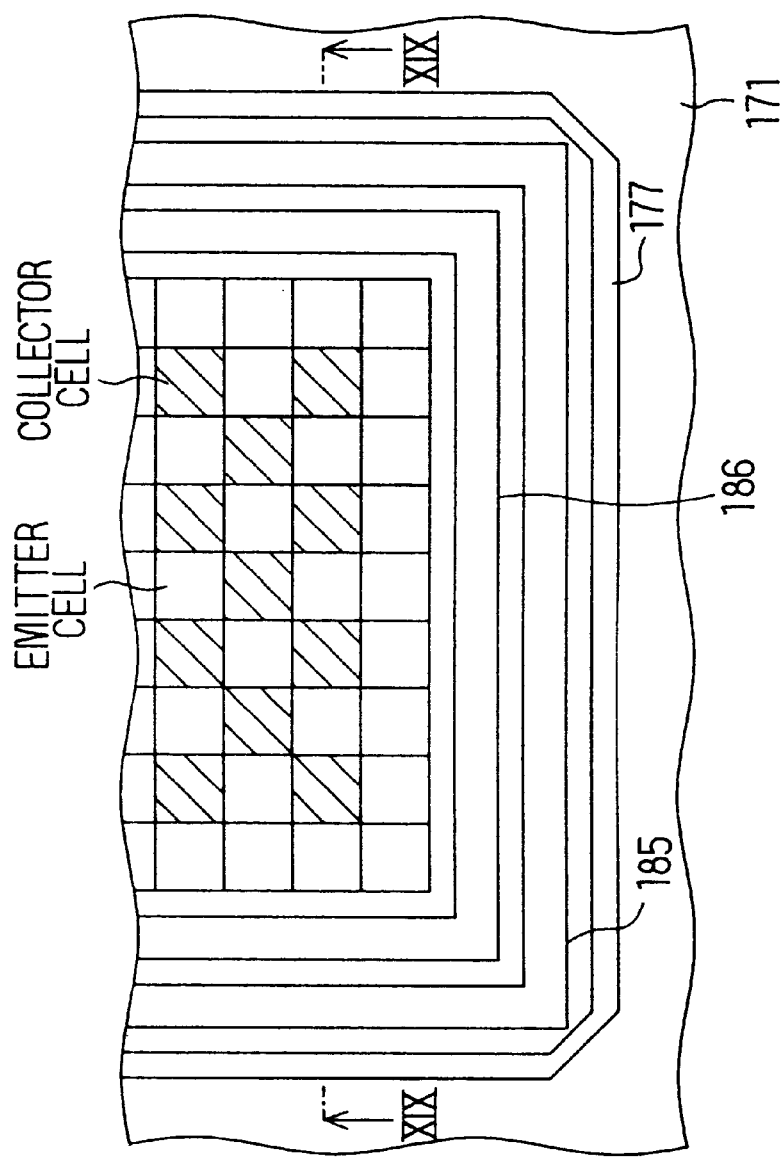
FIG. 18 is a plan view of a hybrid IC.
Figure 19:
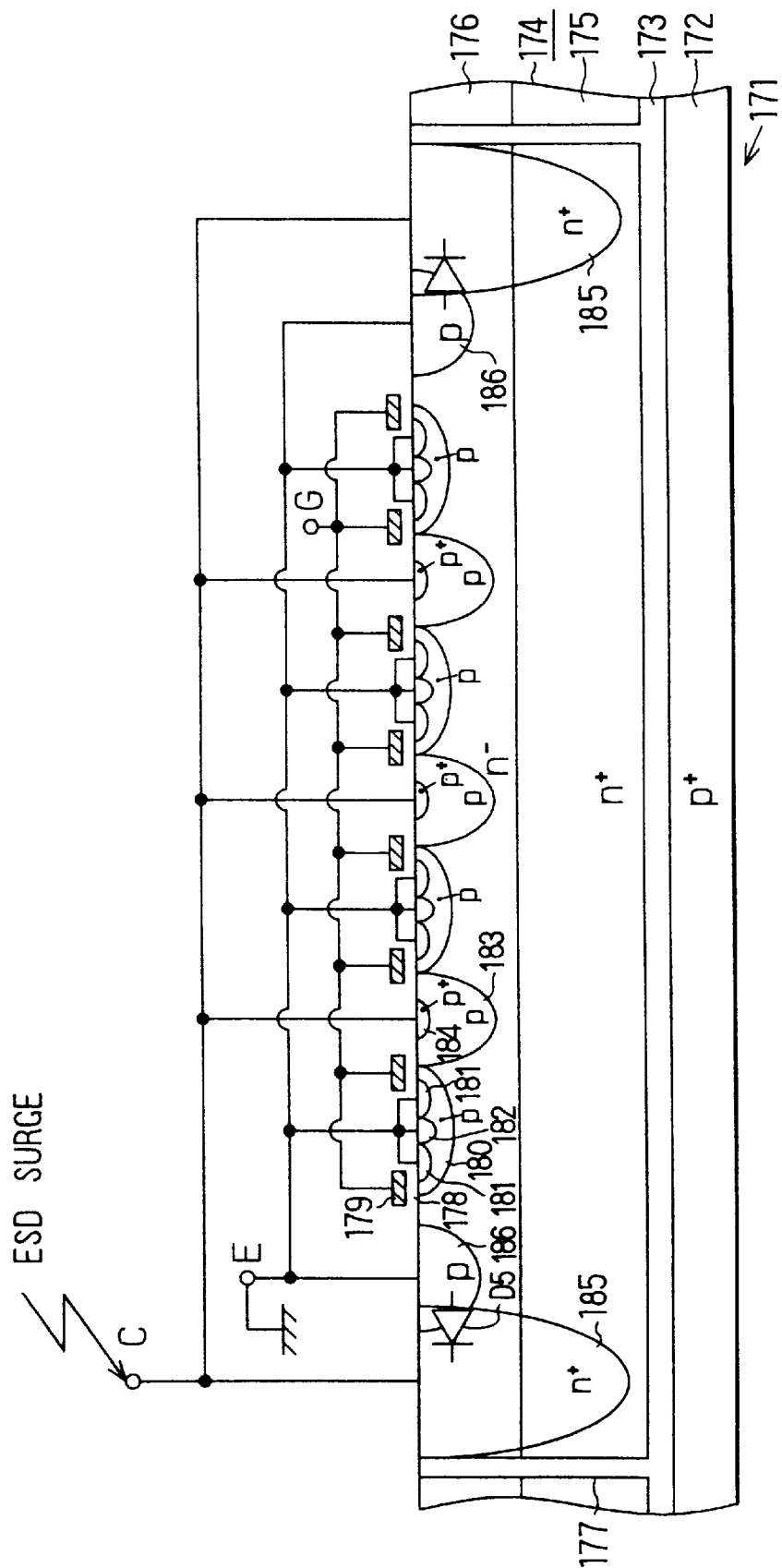
FIG. 19 is a longitudinal sectional view of the device of FIG. 18 along line XIX—XIX.
Figure 20:
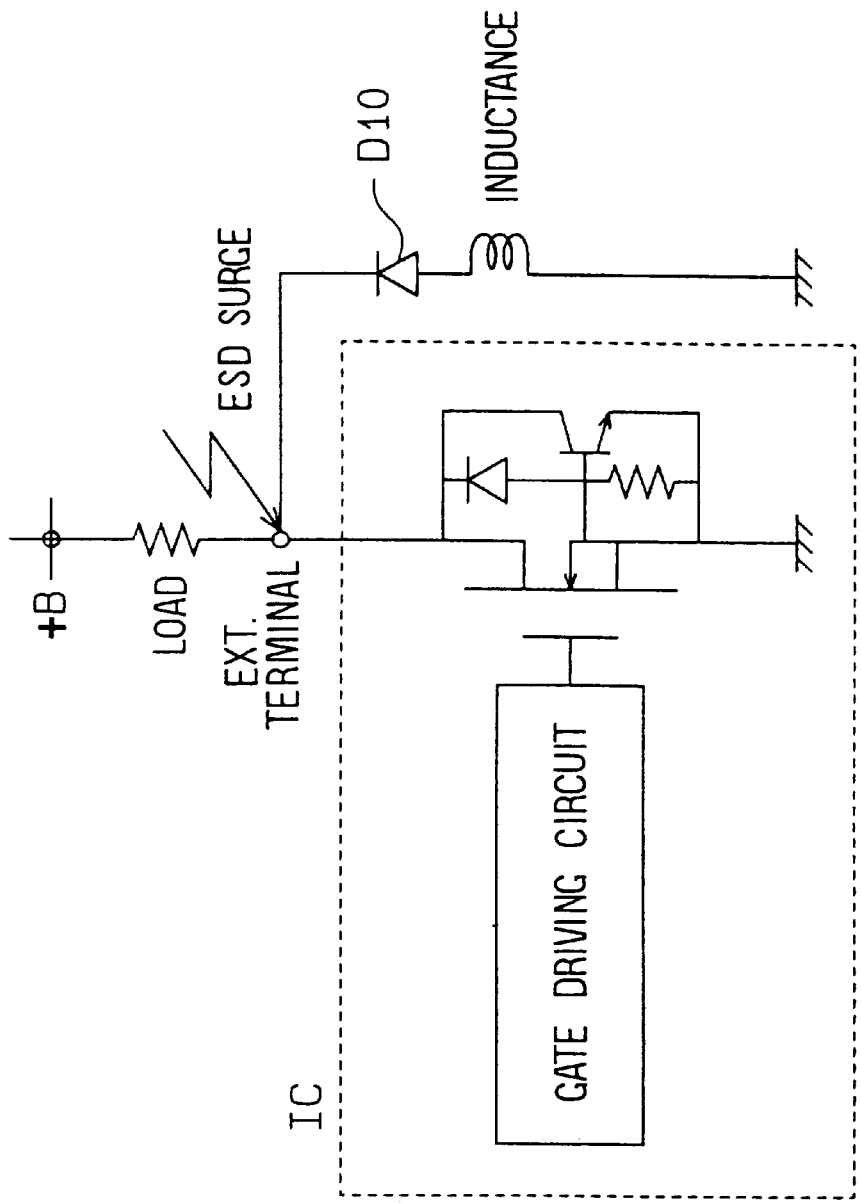
FIG. 20 is a diagram showing a circuit conFIGuration of prior art.

Furthermore, the invention may be applied to a lateral type insulated gate bipolar transistor (L-IGBT) as shown in FIGS. 18–19. In FIG. 19 an SOI substrate 171 is used, which is structured from a p$^+$-type silicon substrate 172 and a thin-film silicon layer 174 with a silicon oxide film 173 sandwiched between them. In the silicon layer 174 an n$^+$-type silicon layer (buried semiconductor layer of first conductivity type) 175 is buried or embedded beneath an n type silicon layer 176. More specifically the n$^-$ silicon layer (surface-side semiconductor layer of first conductivity type) 176 is formed on the n$^+$ silicon layer 175 and is less in impurity concentration than the same silicon layer 175.

A trench 177 is formed in the silicon layer 144 for defining or partitioning more than one island as shown in FIG. 18. A lateral type IGBT is formed at a single island.

At the lateral type IGBT formation island, a polysilicon gate electrode 179 is disposed at a top surface portion of the n$^-$ silicon layer 176 with a gate oxide film 178 laid therebetween as shown in FIG. 19. A p-type well region 180 for use as a channel is formed in a top surface of the n$^-$ silicon layer 176 at an edge portion of the polysilicon gate electrode 179 while an n$^+$-type region (emitter region of first conductivity type) 181 and p$^+$-type region 182 are formed in the surface within the p-well channel region 180. In this way the polysilicon gate electrode 179 is disposed via the gate oxide film 178 with respect to a partial region of at least the p-well channel region 180 at the n$^-$ silicon layer 176. Additionally a p-type collector region 183 is formed in the surface of the n$^-$ silicon layer 176 to have its top surface in which a p$^+$-type region 184 is formed.

Further in this example, a deep n$^+$-type region (semiconductor region of first conductivity type) 185 is formed in the surface of the n$^-$ silicon layer 176 while a p-type base region 186 is formed in the surface of the n$^-$ silicon layer 176 in such a manner as to partly overlap the deep n$^+$ region 185. The base region 186 is connected to an emitter terminal whereas the deep n$^+$ region 185 is coupled to a collector terminal. Whereby a surge bypass diode D5 is formed between the emitter and collector.

It should be noted that in both the VDMOS structure (FIG. 17) and lateral type IGBT structure (FIG. 19), the surge bypass diode as used therein is designed so that its cathode potential is less than the drain breakdown voltage (or collector breakdown voltage) of a transistor when letting a maximal current pursuant to surge current application conditions flow in the surge bypass diode.

Also note that in the LDMOS structure (FIG. 15) and VDMOS structure (FIG. 17) plus lateral type IGBT structure (FIG. 19), the surge bypass diode may be formed in another region different from the transistor formation island as has been explained in conjunction with FIGS. 12–13.

Further note that although the devices stated supra are of the N-channel type, these may be modified to have P-channel type—if this is the case, all the semiconductor components concerned are interchanged in conductivity type between the "p" and "n" types.

Second Embodiment

Another embodiment of a hybrid IC manufacturing method will next be set forth with reference to the related drawings below.

Figure 22:
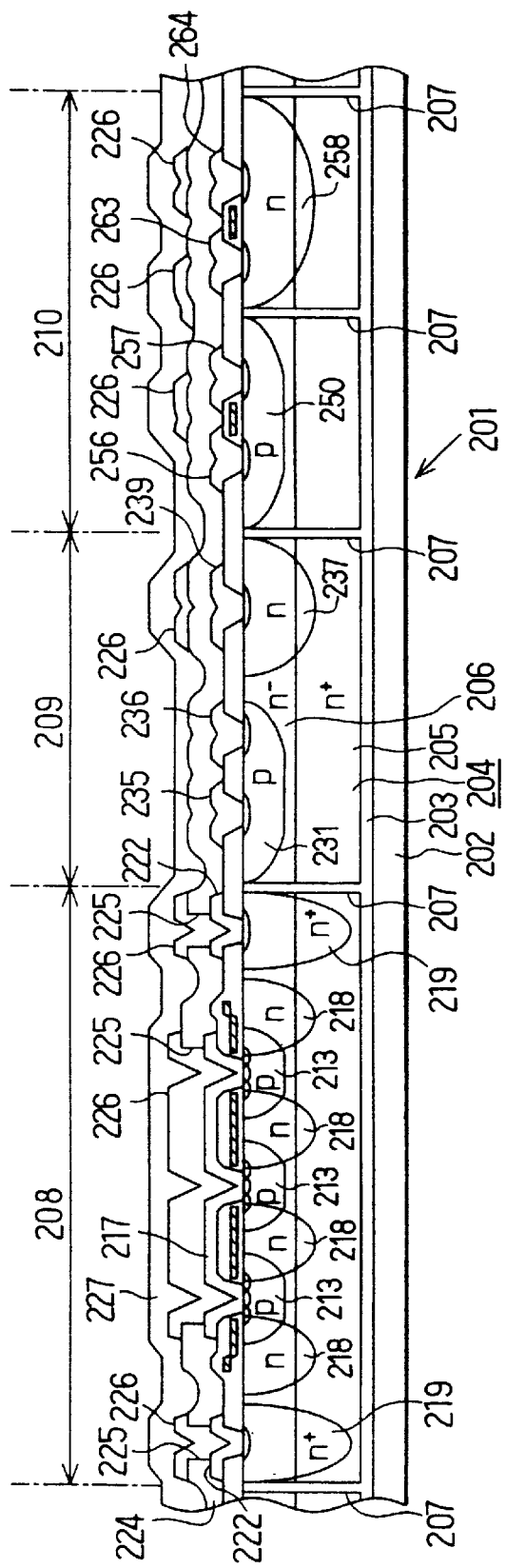
FIG. 22 is a longitudinal sectional view of a hybrid IC in accordance with a second embodiment of the invention.

See first FIG. 22, which shows a longitudinal cross-sectional view of a hybrid IC device in accordance with this embodiment. This hybrid IC is for use as a component constituting an electronic controller circuit for land vehicles, typically for driving certain loads including a fuel injector (electromagnetic valve).

The hybrid IC as shown herein includes an up-drain MOSFET 208, NPN transistor 209 and CMOS transistor 210 as integrated therein. The up-drain MOSFET 208, which is a power device having MOS structure, has its specifications in the order of several amperes and several tens of volt whereas the NPN transistor 209 and CMOS transistor 210 have their specifications (BiCMOS specifications) in the order of mill amperes with an application voltage of 10 volts, or more or less. The CMOS transistor 210 is of a double-well CMOS structure with both NMOS and PMOS transistors being formed within a well region.

In FIG. 22 an SOI substrate 201 is used as a semiconductor substrate. The SOI substrate 201 is structured from a p$^+$-type silicon substrate 202 and a thin-film silicon layer 204 with a silicon oxide film 203 sandwiched therebetween. In the silicon layer 204 an n$^+$ silicon layer 205 is buried or embedded beneath an n$^-$ silicon layer 206. The n$^+$ silicon layer 205 is the one that is doped with antimony (Sb).

A trench 207 is formed in the silicon layer 204 to have inner wall surface on which a silicon oxide film is formed while at the same time letting polysilicon be filled in the same trench 207. This trench 207 permits partitioning of multiple islands. NMOS and PMOS transistors making up the up-drain MOSFET 208 and NPN transistor 209 plus CMOS transistor 210 are formed at these islands respectively.

Figure 23:
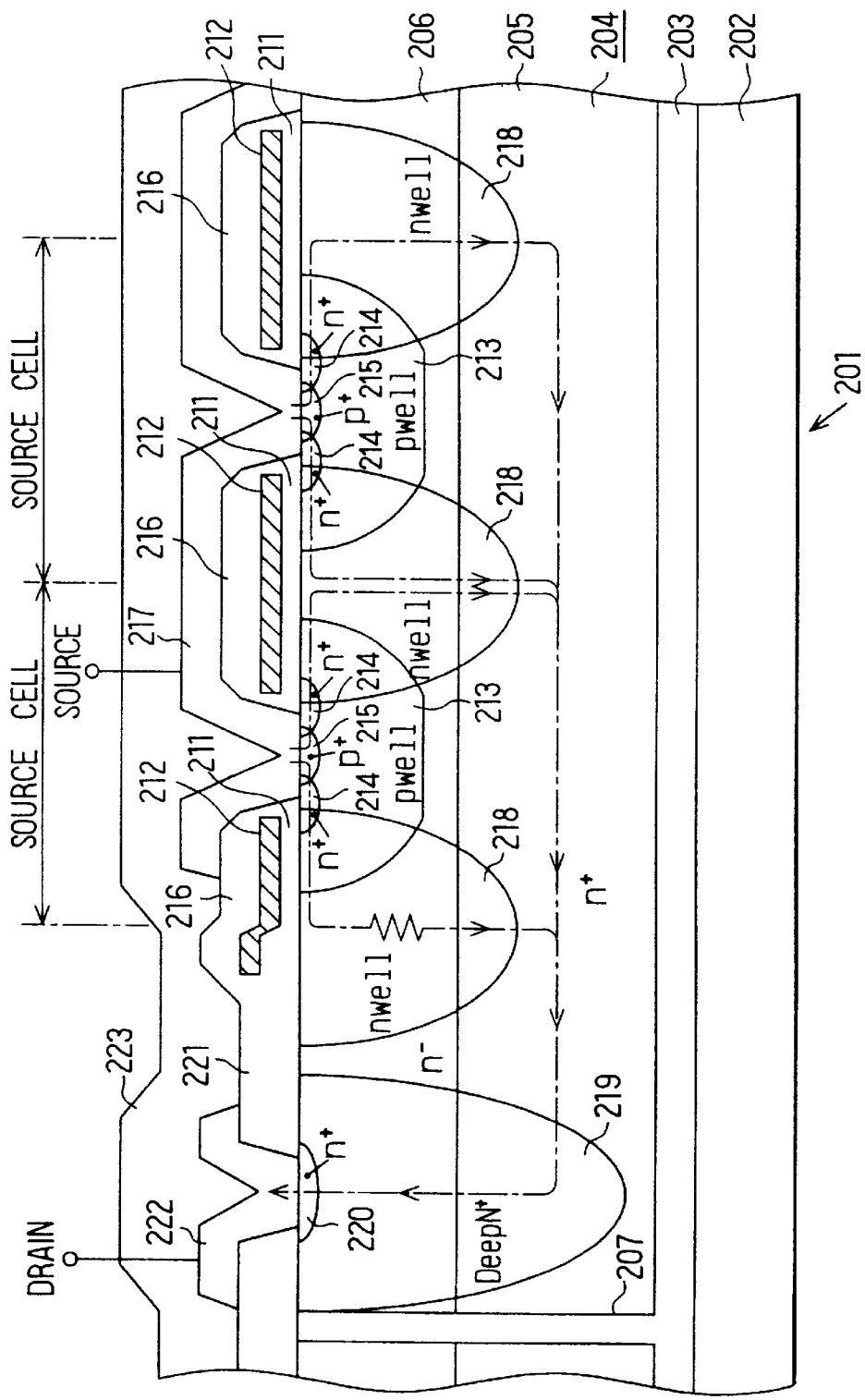
FIG. 23 is a diagram showing a structure of an up-drain MISFET.
Figure 24:
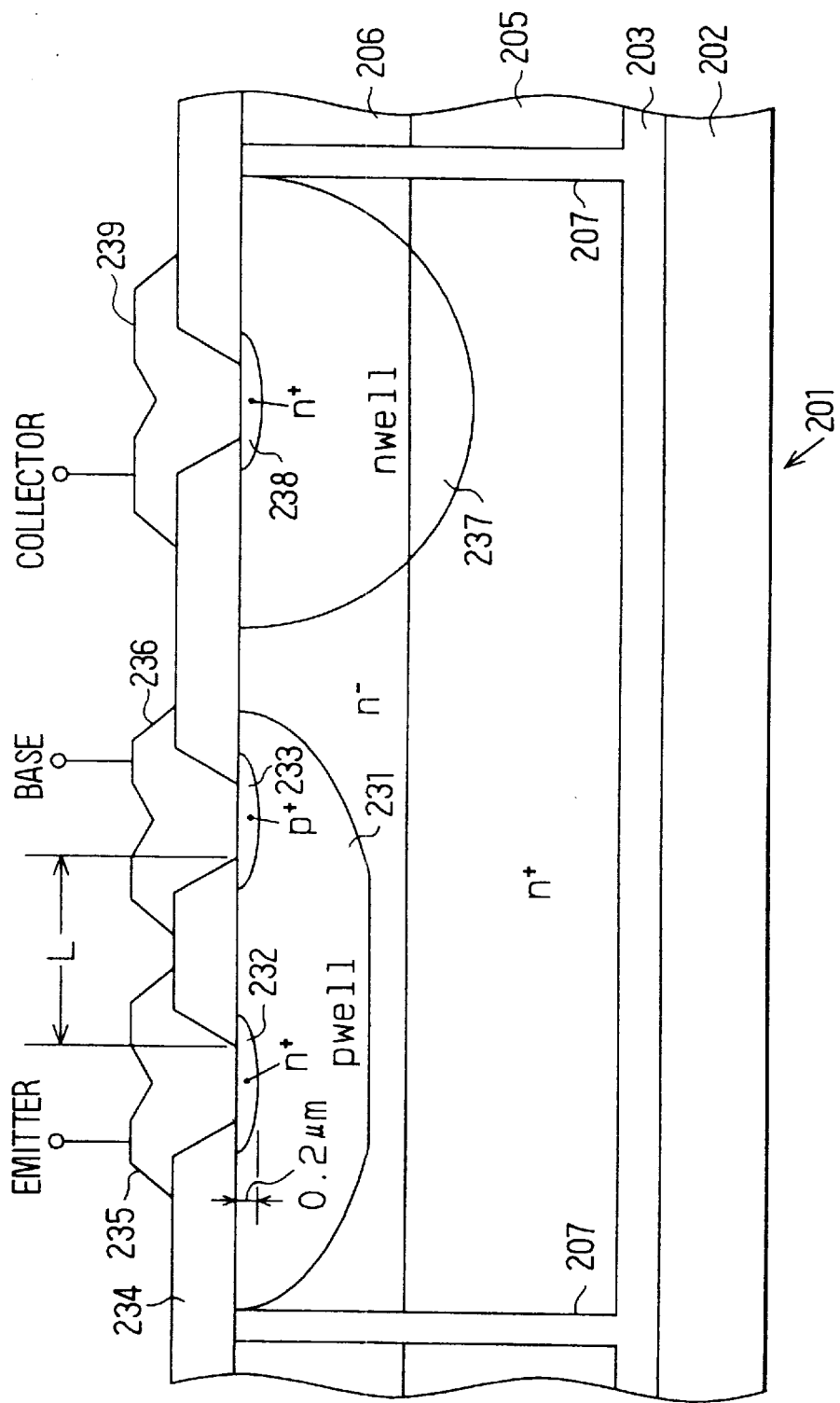
FIG. 24 is a diagram showing a structure of an NPN transistor.

A detailed arrangement of the up-drain MOSFET 208 is shown in FIG. 23. A detailed structure of the NPN transistor 209 of FIG. 22 is shown in FIG. 24. A structure of the CMOS transistor 210 of FIG. 22 is shown in detail in FIG. 25.

An explanation will first be given of the CMOS transistor 210 of FIG. 25.

At an NMOS transistor formation island, a p-well region 250 is formed at a top surface portion of n$^-$ silicon layer 206. A polysilicon gate electrode 252 is formed overlying the n$^-$ silicon layer 206 with a gate oxide film 251 laid therebetween. Within the p-well region 250, an n$^+$-type region 253 and n$^+$-type region 254 are formed in its surface at spaced apart locations. A source electrode (aluminum layer) 256 and drain electrode (aluminum layer) 257 are disposed on a LOCOS oxide film 255 over the n$^-$ silicon layer 206, wherein the source electrode (aluminum layer) 256 is in contact with the n$^+$ region 253 whereas the drain electrode (aluminum layer) 257 is contacted with the n$^+$ region 254.

Figure 25:
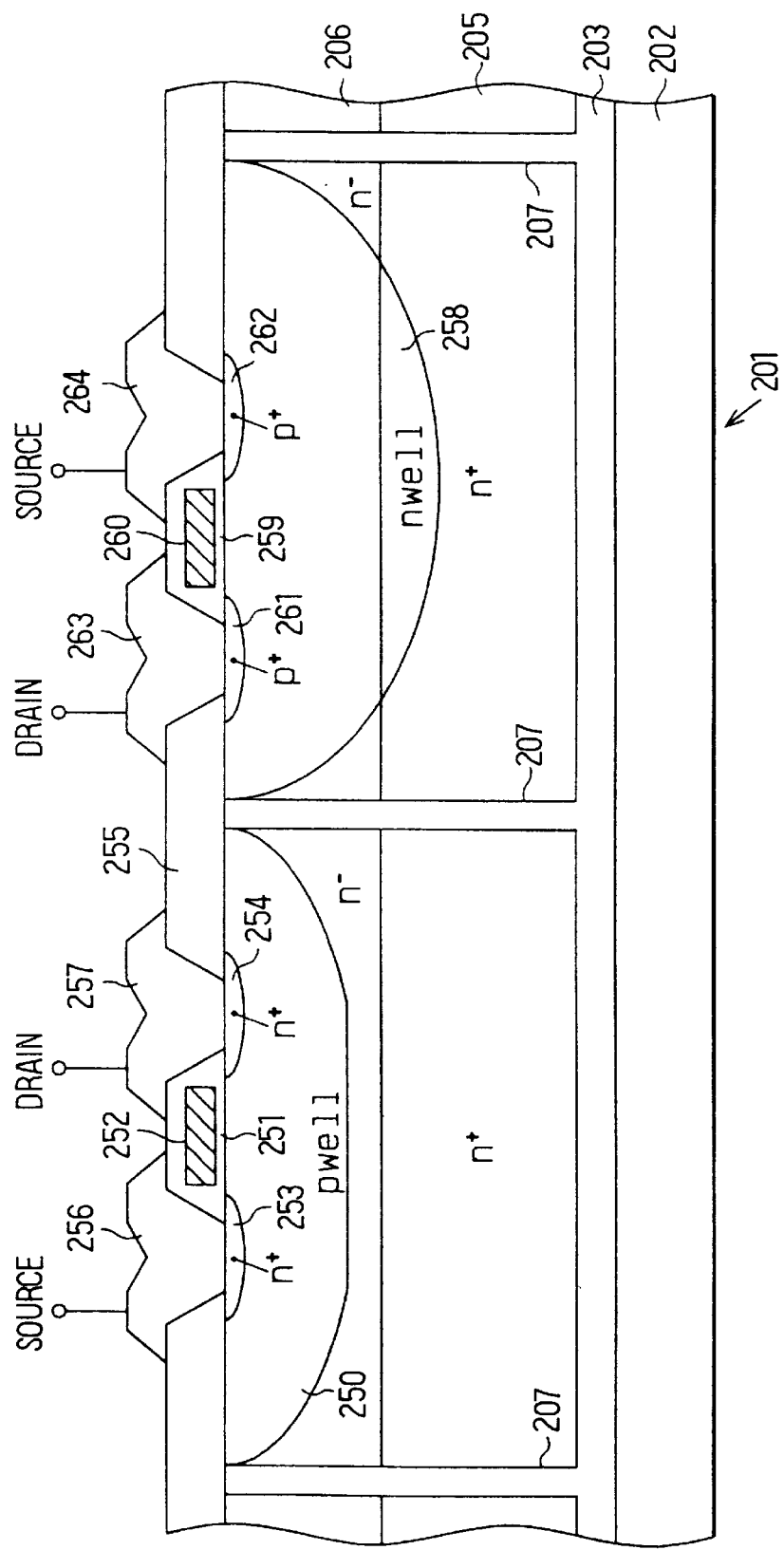
FIG. 25 is a diagram showing a structure of a double-well CMOS transistor.

At a PMOS transistor formation island of FIG. 25, an n-well region 258 is formed in a top surface of the n-type silicon layer 206 in such a manner that the n-well region 258 reaches to the n$^+$-type silicon layer 205 from the surface of the n$^-$ silicon layer 206. A polysilicon gate electrode 260 is formed over the n-well region 258 via a gate oxide film 259. Within the n-well region 258 a p$^+$-type region 261 and p$^+$-type region 262 are formed in the surface thereof at spaced-apart locations. A drain electrode (aluminum layer) 263 and source electrode (aluminum layer) 264 are disposed on a LOCOS oxide film 255 over the n$^-$ silicon layer 206, wherein the drain electrode (aluminum layer) 263 is in contact with the p$^+$ region 261 whereas the source electrode (aluminum layer) 264 is contacted with the p$^+$ region 262.

A structure of the up-drain MOSFET 208 of FIG. 23 is as follows. A polysilicon gate electrode 212 is disposed via a gate oxide film 211 over silicon layer 204. A p-well region 213 is formed in atop surface of n$^-$ silicon layer 206 at an edge portion of the polysilicon gate electrode 212. This p-well region 213 has been fabricated at the same time that the p-well region 250 of double-well CMOS transistor 210 (FIG. 25) is formed. Within the p-well region 213, an n$^+$ type region 214 and p$^+$ type region 215 are formed in the surface thereof. A polysilicon oxide film 216 is formed overlying the above-noted polysilicon gate electrode 212. A source electrode (aluminum layer) 217 is disposed on the silicon oxide film 216, wherein this source electrode (aluminum layer) 217 is in contact with the n$^+$ region 214 and p$^+$ region 215.

In addition an n-well region 218 is formed between p-well regions 213, i.e. between source cells, so that this n-well region 218 reaches the n$^+$-type silicon layer 205 from the surface of n$^-$ silicon layer 206. This n-well region 218 is the one that has been fabricated simultaneously during formation of the n-well region 258 of double-well CMOS transistor 210 (FIG. 25). Further, a deep n$^+$-type region 219 is formed in top surface of n-type silicon layers 205, 206 in such a manner that the deep n$^+$ region 219 is greater in depth than n-well region 218. Within the deep n$^+$ region 219, an n$^+$ region 220 is formed in its surface. A drain electrode (aluminum layer) 222 is disposed on a LOCOS oxide film 221 over the n type silicon layers 205, 206, wherein this drain electrode (aluminum layer) 222 is contacted with n$^+$ region 220. A silicon oxide film 223 is formed overlying the drain electrode (aluminum layer) 222 and source electrode (aluminum layer) 217.

In tie-up-drain MOSFET 208 thus arranged, applying a voltage to the polysilicon gate electrode 212 results in a current flowing from the source electrode (aluminum layer) 217 along a path of n$^+$ region 214 and p$^+$ region 215→surface of p-well region 213→n-well region 218→n$^+$ silicon layer 205→deep n$^+$ region 219→n$^+$ region 220→drain electrode (aluminum layer) 222.

An explanation of the NPN transistor 209 of FIG. 24 will be given below. A p-well region 231 is formed in a top surface of the n$^-$ silicon layer 206. This p-well region 231 is the one that has been fabricated during formation of the p-well region 250 of double-well CMOS transistor 210 (FIG. 25). Within the p-well region 231, an n$^+$-type region 232 and p$^+$-type region 233 are formed in the surface thereof at spaced-apart positions. An emitter electrode (aluminum layer) 235 and base electrode (aluminum layer) 236 are disposed on the LOCOS oxide film 234 over n silicon layer 206, wherein this emitter electrode (aluminum layer) 235 is in contact with the n$^+$ region 232 whereas the base electrode (aluminum layer) 236 is contacted with p$^+$ region 233.

In addition an n-well region 237 is formed in the surface of n silicon layer 206, wherein the n-well region 237 reaches n$^+$ silicon layer 205 from the surface of n$^-$ silicon layer 206. This n-well region 237 is the one that has been fabricated during formation of the n-well region 258 of double-well CMOS transistor 210 (FIG. 25). Further, within the n-well region 237, an n⁺-type region 238 is formed in its surface and is contacted with a collector electrode (aluminum layer) 239 over the LOCOS oxide film 234.

A method for manufacturing the hybrid IC device will next be explained in conjunction with FIGS. 26 to 36.

First, as shown in FIG. 26, prepare an SOI wafer (SOI substrate) 201. A silicon layer 204 measures approximately 13 μm in thickness; a buried n⁺ layer 205 is about 3 μm in thickness with an impurity concentration of about $1\times10^{15}$ cm⁻³ and ps is about 20Ω/□. And, form in this wafer 201 a trench 207 for element isolation. More specifically, use dry etch techniques to define a separation or "partitioning" groove to have a depth reaching a buried oxide film 203; then, perform chemical dry etching (CDE) and thermal annealing for recovery of any possible damages. Thereafter, oxidize sidewalls of such trench; then, perform burying of polysilicon material; further, perform chemical mechanical polishing (CMP) process for removal of any unnecessary polysilicon portions. Thereafter, let the trench's upper part be subject to planarization; then, perform surface oxidation of the buried polysilicon.

And, as shown in FIG. 27, the resultant structure is doped by implantation with phosphorus (P) at a dose of $1\times10^{15}$ cm⁻² for fabrication of a deep n⁺-type region 219; then, perform thermal processing at 1170° C. for about 3 hours.

Figure 28:
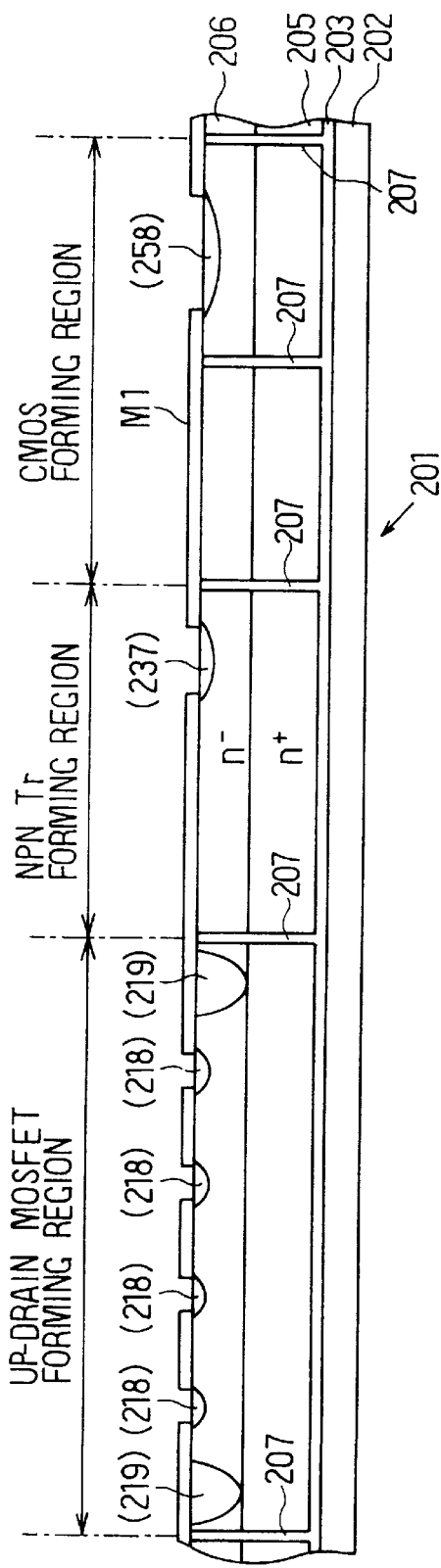

Further, as shown in FIG. 28, dispose a mask M1 on the wafer 201 and then perform implantation of phosphorus (P) at a dose of $1\times10^{12}$ cm⁻² to thereby fabricate n-well regions (218, 237, 258), which are then subject to thermal processing at 1170° C. for about 3 hours.

Figure 29:
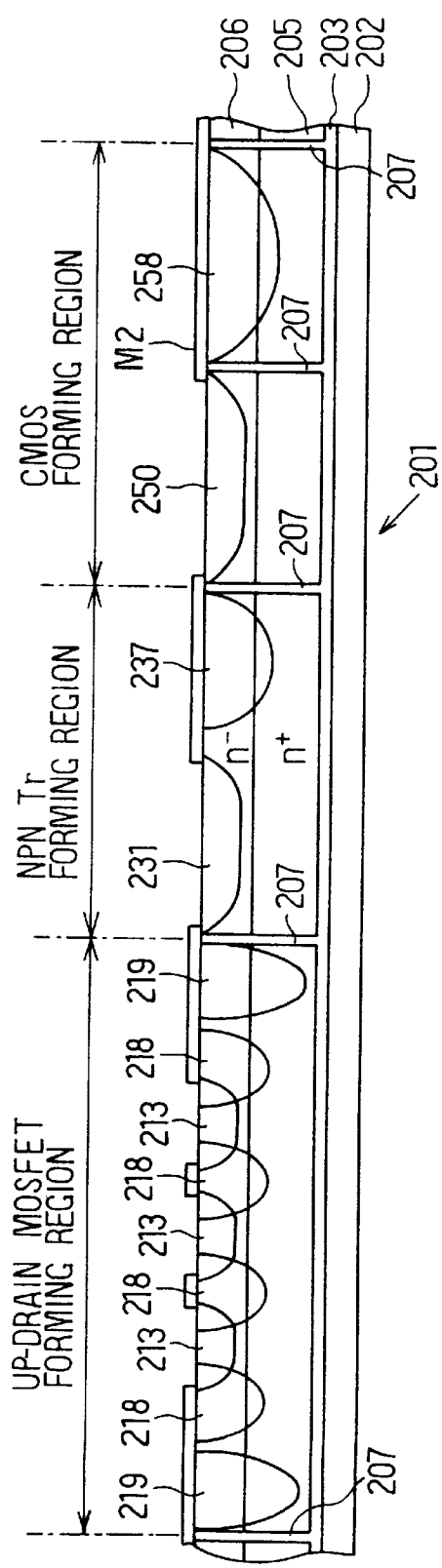
Figure 36:
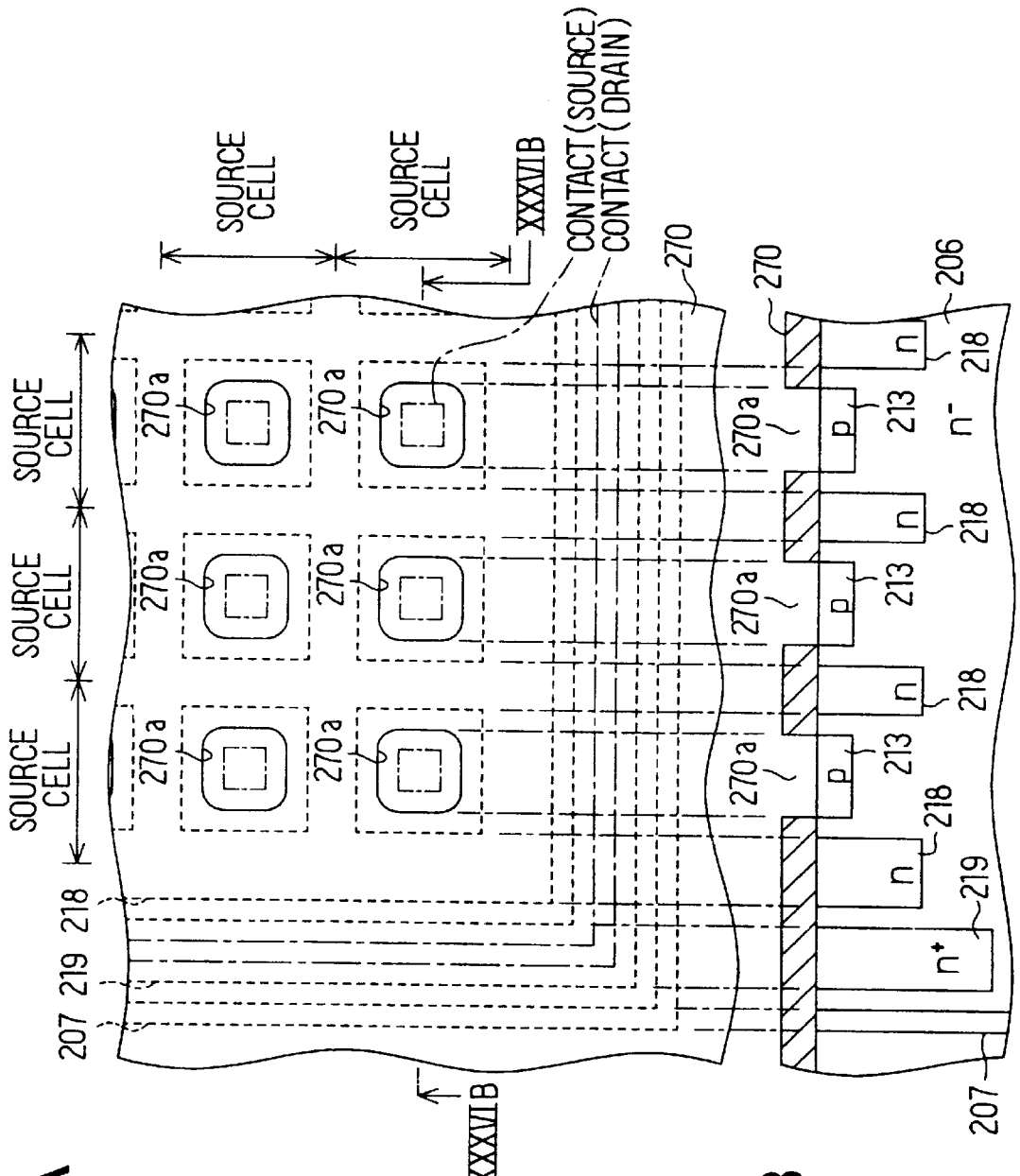
FIG. 36 is a diagram for explanation of a hybrid IC manufacturing process.

Subsequently, as shown in FIG. 29, dispose a mask M2 on the wafer 201 and then effectuate implantation of boron (B) at a dose of $1\times10^{13}$ cm⁻² to thereby form p-well regions (213, 231, 250), which are then subject to thermal processing at 1170° C. for about 3 hours. At this process step a chosen impurity is doped by ion implantation into a silicon layer 206 from openings 270a as defined in respective source cells in an up-drain MOSFET formation region with a mask 270 disposed thereon as shown in FIG. 36.

Figure 30:
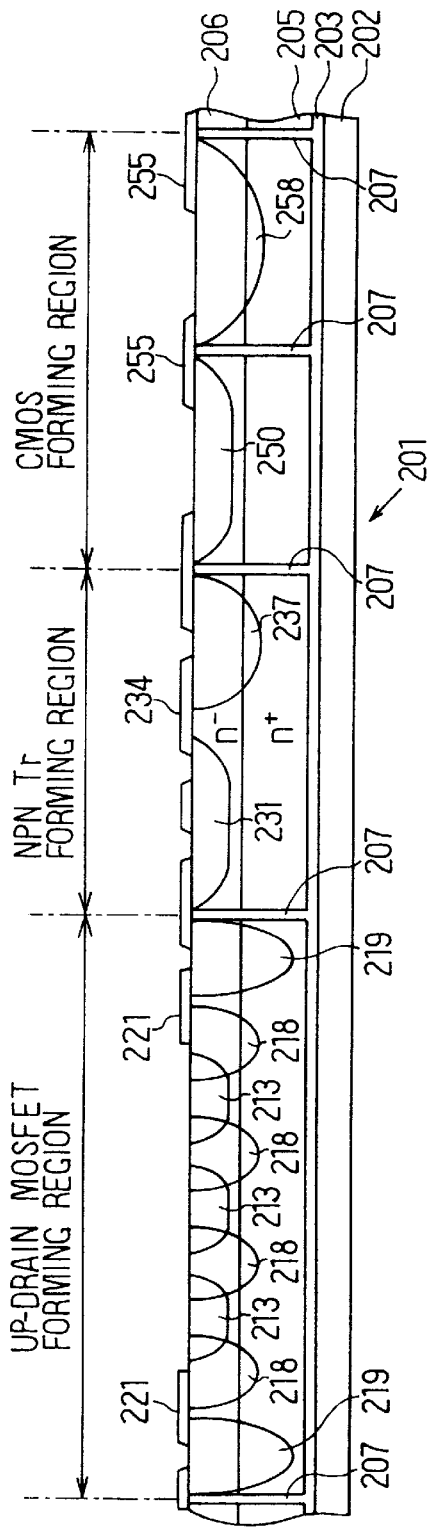
Figure 31:
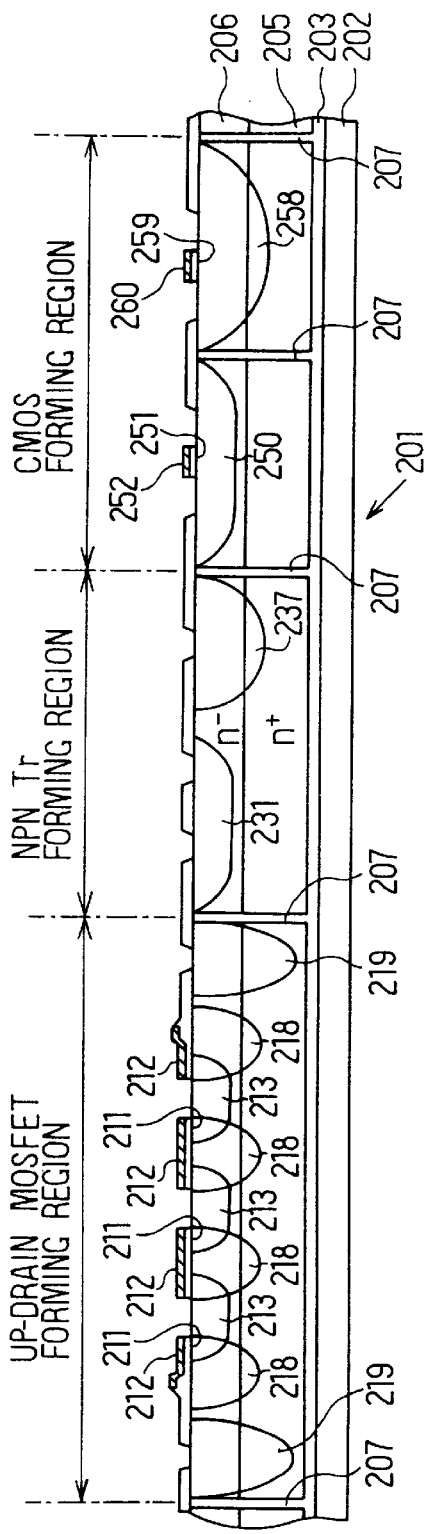

Thereafter, as shown in FIG. 30, fabricate LOCOS oxide films 221, 234, 255, each with a thickness of 1 μm. Further, as shown in FIG. 31, perform gate oxidation to form gate oxide films 211, 251, 259 each about 30 nm thick. Then, let the resultant structure be doped with boron by ion implantation with respect to entire surface area at a dose of $1\times10^{12}$ cm⁻² for threshold voltage adjustment; then, perform thermal processing. Thereafter, deposit a polysilicon film for later use as gates to a thickness of about 300 nm, which is then patterned to form gate electrodes 212, 252, 260.

Figure 32:
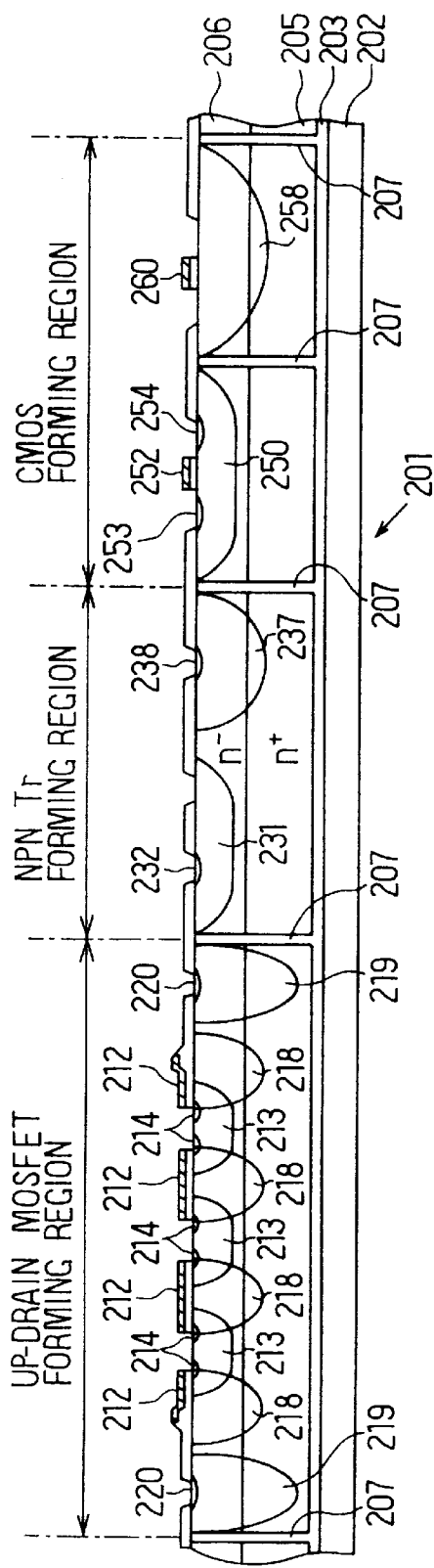
Figure 33:
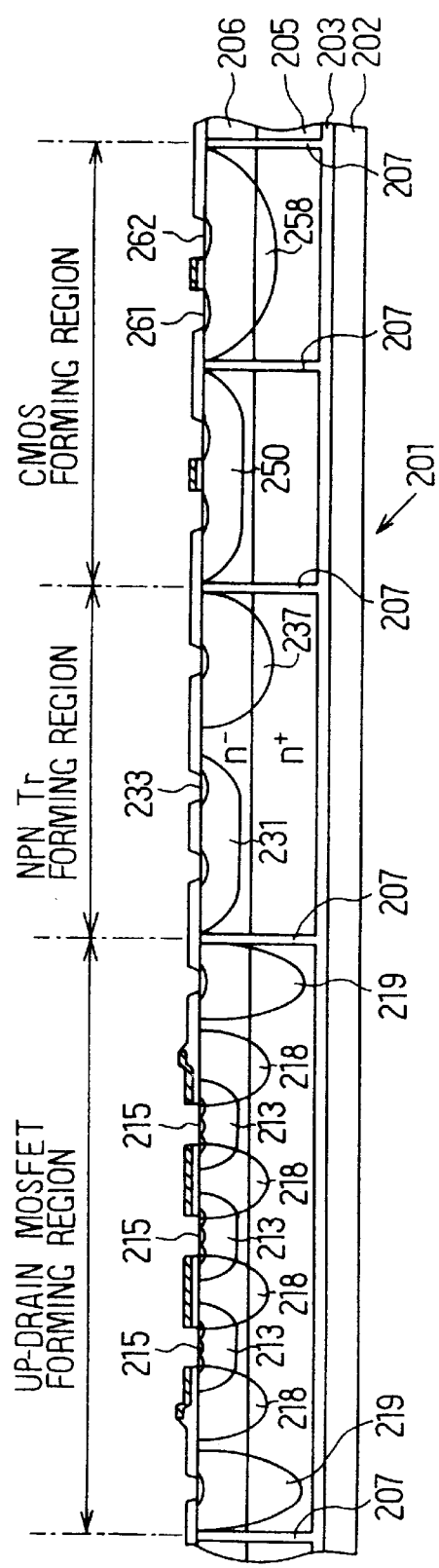

Subsequently, as shown in FIG. 32, perform ion implantation of arsenic (As) at a dose of about $5\times10^{15}$ cm⁻² to thereby form n⁺-type regions 214, 220, 232, 238, 253, 254. Further, as shown in FIG. 33, boron (B) is implanted at a dose of $5\times10^{16}$ cm⁻² to form p⁺-type regions 215, 233, 261, 262. Here, the process of forming the intended power MOS, bipolar and CMOS transistors is completed.

Figure 34:
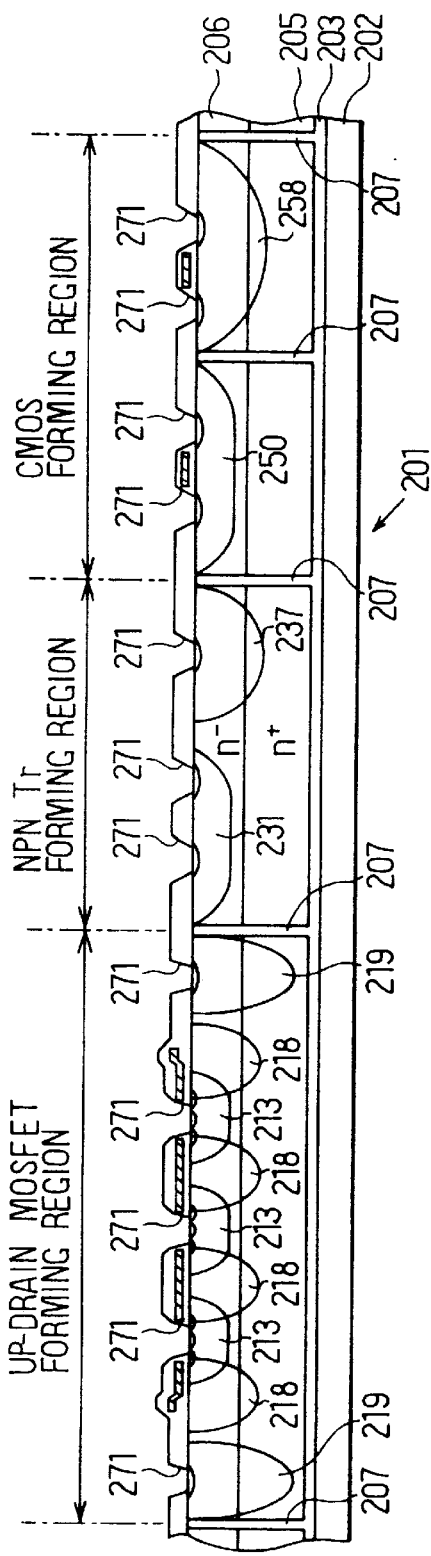
Figure 35:
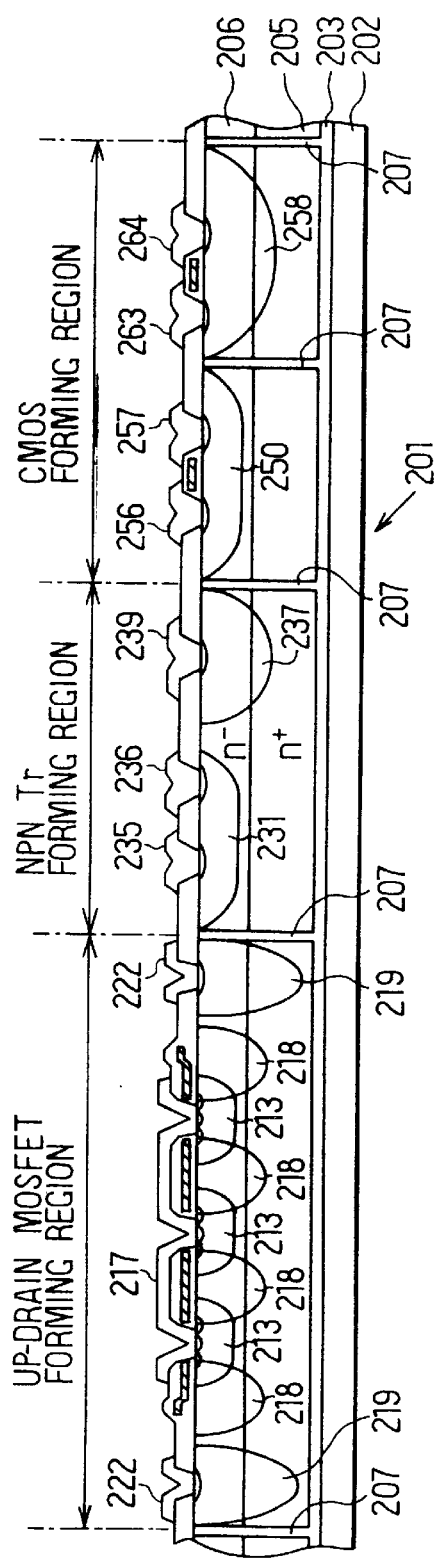

Further, as shown in FIG. 34, deposit a BPSG film; then, perform reflow processing and etching to form contact holes 172. Thereafter, as shown in FIG. 35, fabricate by aluminum sputtering an aluminum layer (first-layered material) to a thickness of 0.5 μm or more or less, which is then patterned forming aluminum layers 222, 217, 235–236, 239, 256–257, 263–264.

Thereafter, as shown in FIG. 22, deposit an insulative or dielectric film (TEOS film) 224 on the first-layered aluminum layers (222 and others) to a thickness of about 1 μm; then, form in this film 224 via holes 225 by known etch techniques. Next, perform sputtering to form thereon an aluminum layer (second-layered film) with a thickness of about 1 μm, which is then patterned to form a second-level aluminum layer 226. Thereafter, deposit an SiN film to a thickness of about 1.5 μm to thereby form a surface protection film 227. And, etch the surface protective film 227 causing pad sections of the second aluminum layer 226 to expose; then, complete interconnect lead wiring.

It is to be noted that although the hybrid IC device is manufactured through the procedure stated above, the formation of trench 207 may be done after completion of device fabrication required.

Figure 37:
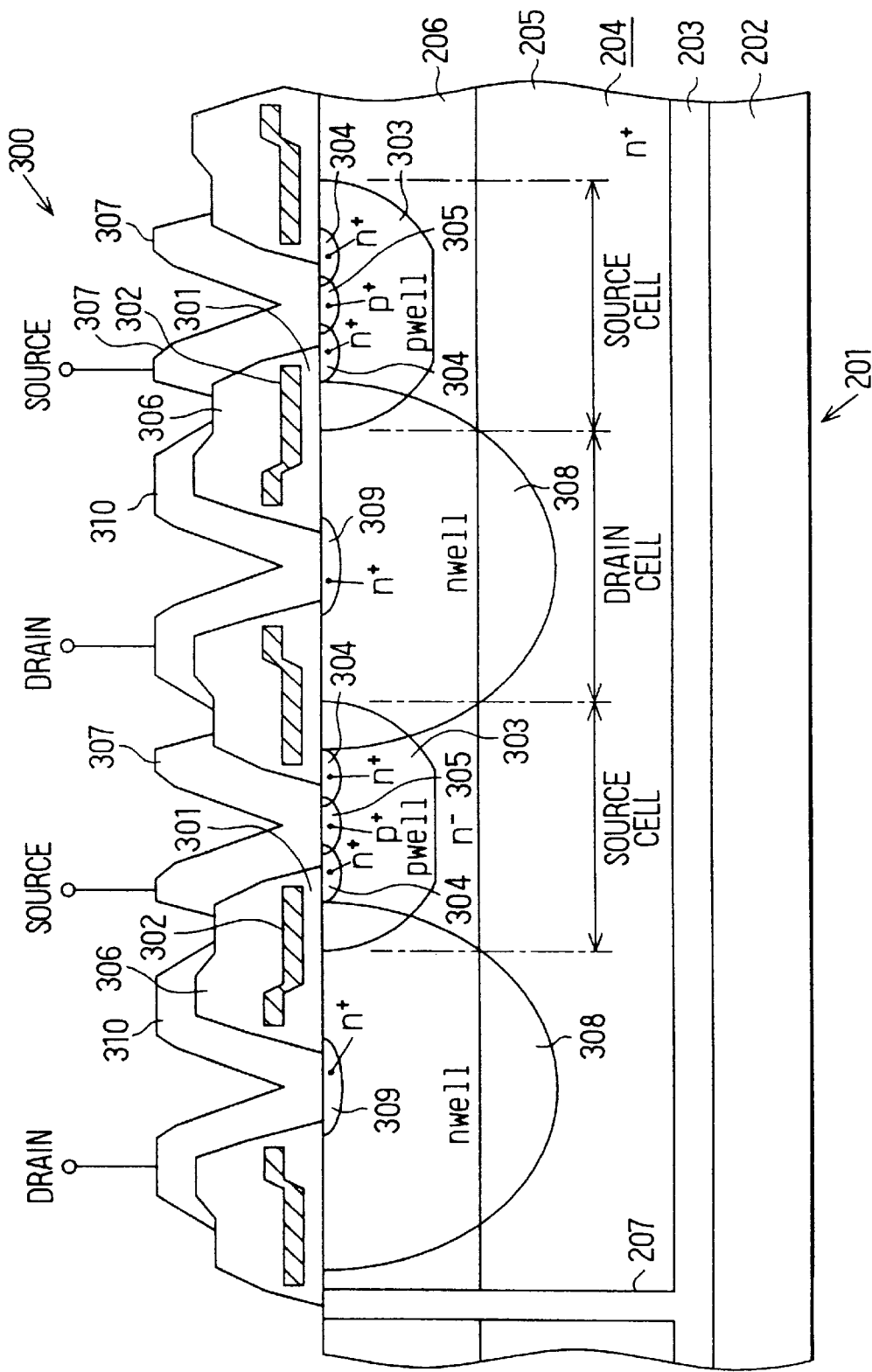
FIG. 37 is a diagram showing a structure of an LDMOS-FET.

The up-drain MOSFET 208 shown in FIG. 23 may be replaced with an LDMOSFET, which is also one of lateral type MOSFETS. This example is shown in FIG. 37. As shown in FIG. 37, a polysilicon gate electrode 302 is disposed over a silicon layer 204 with a gate oxide film 301 laid therebetween. A p-well region 303 is formed in a surface of n silicon layer 206 at an end of the polysilicon gate electrode 302; within the p-well region 303, an n⁺-type region 304 and p⁺-type region 305 are formed in the surface thereof. A silicon oxide film 306 is formed to overlie the polysilicon gate electrode 302. A source electrode (aluminum layer) 307 is disposed on the silicon oxide film 306 so that this source electrode (aluminum layer) 307 is in contact with the n⁺ region 304 and p⁺ region 305. The p-well region 303 is the one that was fabricated simultaneously during formation of the p-well region 250 of the double-well CMOS transistor 210 (FIG. 25).

In addition, an n-well region 308 is formed between p-well regions 303 of FIG. 37—i.e. between adjacent source cells—while causing the n-well region 308 to reach the n⁺ silicon layer 205 from the surface of then ⁻-silicon layer 206. An n⁺-type region 309 is formed within the n-well region 308 in a surface thereof, wherein the n⁺ region 309 is in contact with a drain electrode (aluminum layer) 310. The n-well region 308 is the one that was fabricated simultaneously during formation of the n-well region 258 of the double-well CMOS transistor 210 (FIG. 25).

Figures 38A, 38B:
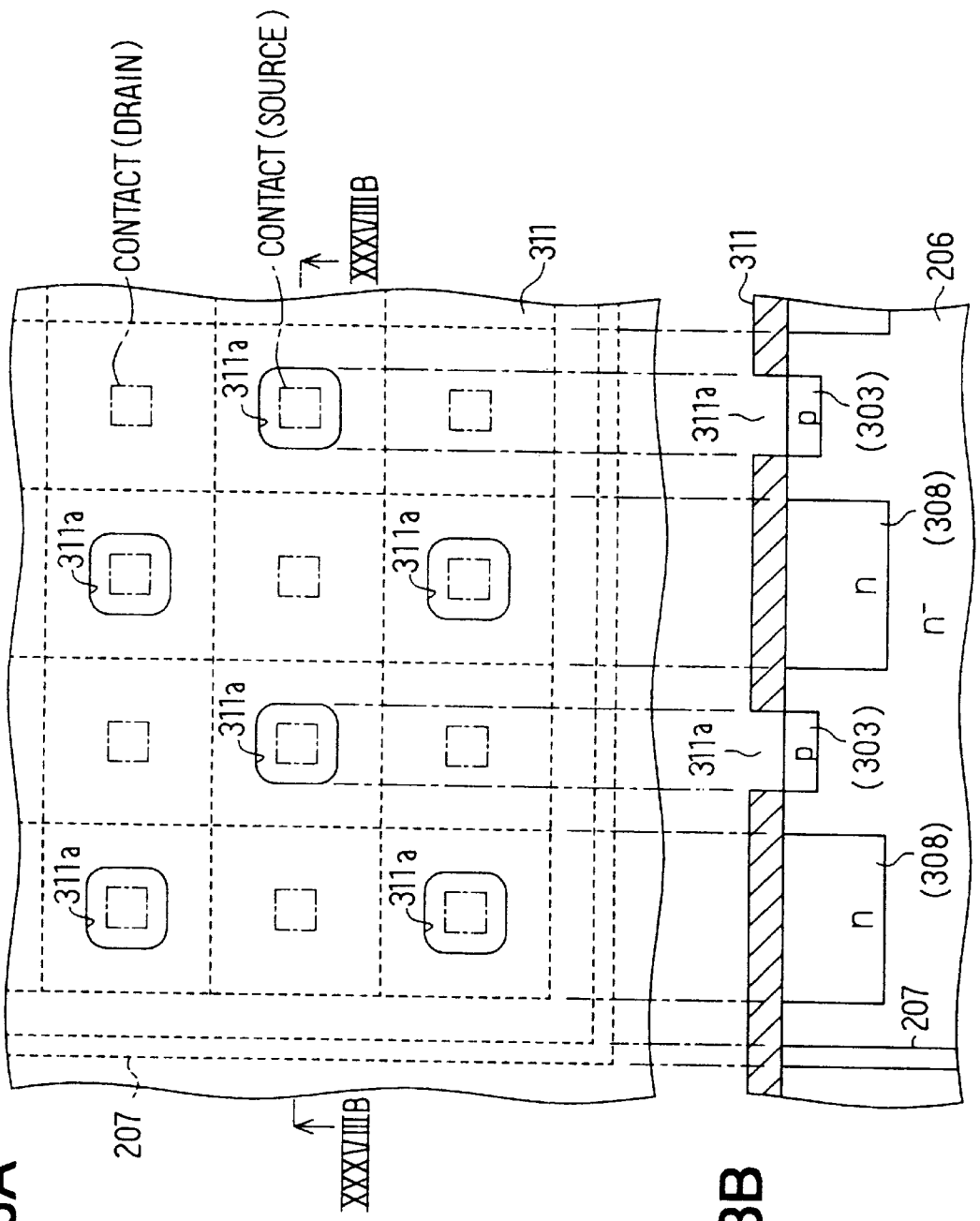
FIGS. 38A and 38B is a diagram for explanation of a hybrid IC manufacturing process.

During manufacture of this LDMOSFET 300, as shown in FIG. 38, a mask layer 311 is disposed with openings 311 defined therein in a way positionally corresponding to respective source cells, through which a dose of impurities is doped by ion implantation into the underlying silicon layer 206.

Figure 39:
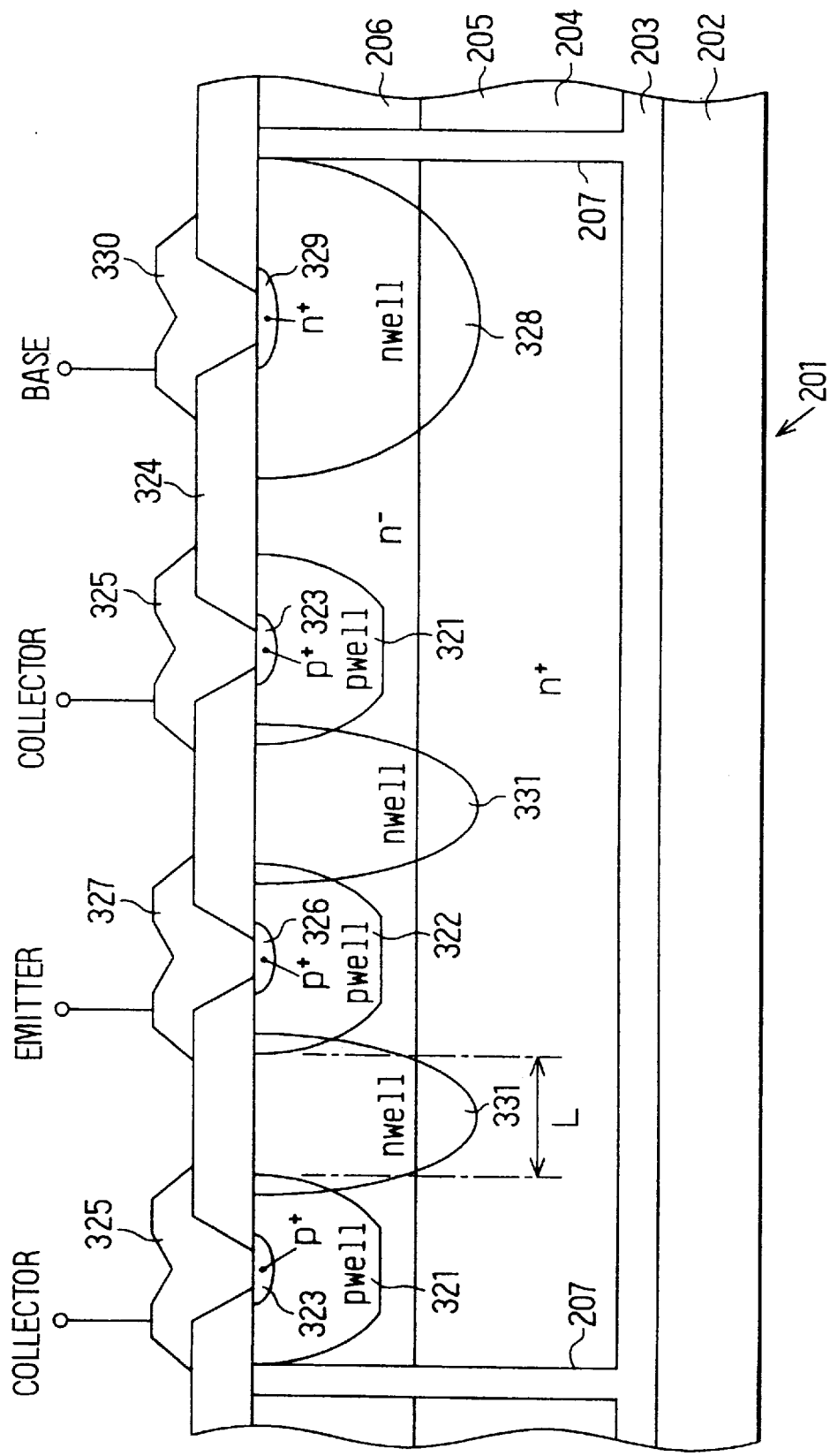
FIG. 39 is a diagram showing a structure of a PNP transistor.

Note that the NPN transistor of FIG. 24 may be replaced with a PNP transistor shown in FIG. 39. In this case p-well regions 321, 322 are formed in the surface of n⁻-type silicon layer 206. The p-well regions 321, 322 are the ones that were fabricated simultaneously during formation of the p-well region 250 of the double-well CMOS transistor 210 (FIG. 25). Within the p-well region 321, a p⁺-type region 323 is formed in the surface thereof. A collector electrode (aluminum layer) 325 is disposed on a LOCOS oxide film 324 overlying the silicon layer 204, wherein this collector electrode (aluminum layer) 325 is in contact with the p⁺ region 323. Within the p-well region 322, a p⁺-type region 326 is formed in the surface thereof so that this region is contacted with an emitter electrode 327.

In addition an n-well region 328 is formed in the surface of n⁻-type silicon layer 206, wherein the n-well region 328 reaches the n⁺ silicon layer 205 from the surface of n⁻ silicon layer 206. Further, within the n-well region 328, an n⁺-type region 329 is formed in the surface thereof to be in contact with a base electrode (aluminum layer) 330 overlying the LOCOS oxide film 324. Similarly, an n-well region 331 is formed between the p-well region 321 and p-well region 322 in the surface of the n⁻ silicon layer 206. The n-well regions 328, 331 are the ones that were fabricated simultaneously during formation of the n-well region 258 of the double-well CMOS transistor 210 (FIG. 25).

Figure 44:
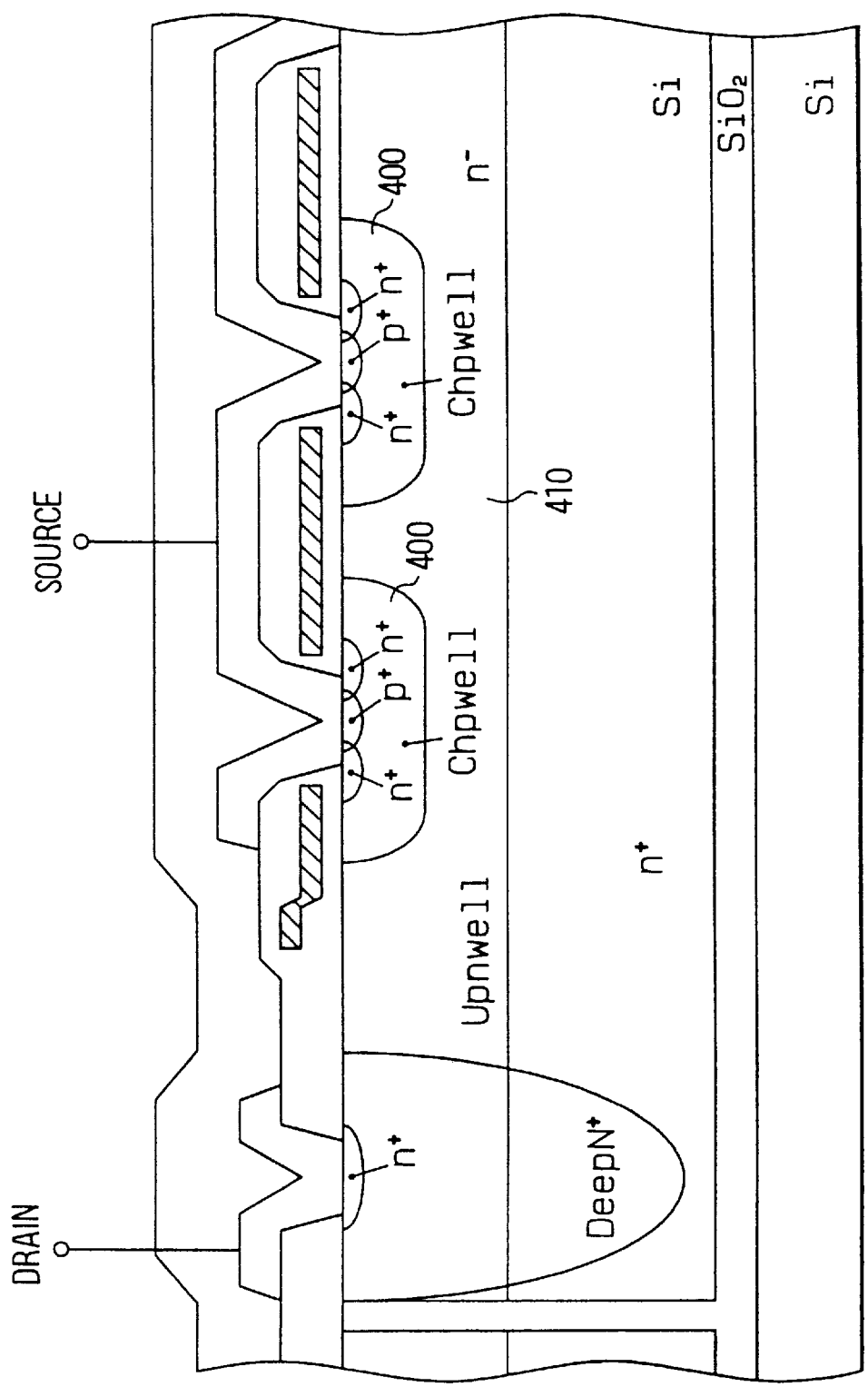
FIG. 44 is a diagram showing a structure of an up-drain MOSFET of related art.
Figure 45:
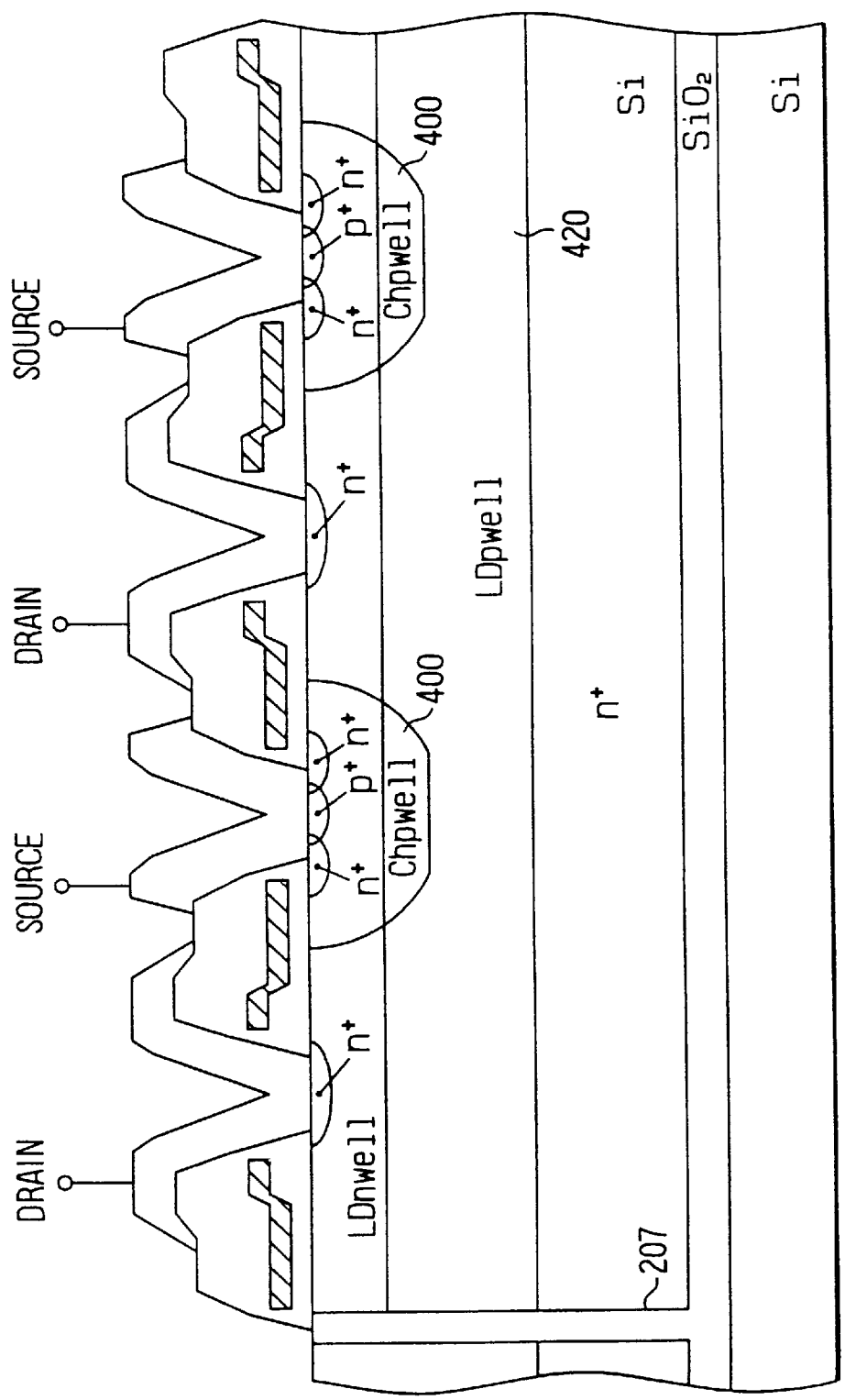
FIG. 45 is a diagram showing a structure of an LDMOS-FET of related art.

In this way, optimal design of the required breakdown voltage and turn-on resistivity is achievable by partly adding the p-well region 250 of the double well CMOS transistor 210 of FIG. 25 to the p-well channel region 213 of the power device 208 of FIG. 23 while also adding the n-well region 258 of the double-well CMOS transistor of FIG. 25 to the n-well region 218 of the up-drain MOSFET 208 of FIG. 23 and the well region 308 of the LDMOSFET of FIG. 37. One example is that whereas in prior known double-diffused self-aligned MOS (DSAMOS) device structures shown in FIGS. 44–45 a p-well channel region 400 is such that a gate polysilicon is formed through implantation and thermal diffusion using a mask layer, the intended well region equivalent to the prior known p-well channel region is fabricated by implantation techniques while letting the p-well regions 213, 231, 250 be widened or expanded by about 1 $\mu$m for example from a presumptive polysilicon layout region (namely, from a polysilicon window) at a preceding process step of layout of polysilicon as shown in FIG. 29. Additionally the n-well region 218 of the up-drain MOSFET of FIG. 23 is such that while this region is considered to be fabricated through implantation for impurity diffusion over the entire surface area of an element formation region as shown in FIG. 45, if it is simply replaced with the n-well region 258 of the CMOS transistor of FIG. 25 then the breakdown voltage level decrease because of an excessive increase in impurity concentration. In view of this, performing implantation at the same time that the n-well region 258 is formed at CMOS part and then effectuating thermal diffusion to let it reach its underlying buried n⁺ diffusion layer 250 makes it possible to reduce the channel resistivity and epitaxial substrate resistance, thereby enabling reduction of the turn-on resistance alone without lowering the breakdown voltage thereof.

Similarly, with regard to the LDMOSFET of FIG. 37 also, this may be designed so that an n-well region is added to the overall surface area of an element region for optimal design of the breakdown voltage and turn-on resistance as shown in FIG. 45, a further improvement is expectable in a way such that implantation is done simultaneously during formation of the n-well region 258 of the CMOS device of FIG. 25 to thereby provide the n-well region 308, which in turn makes it possible to attain optimization of the breakdown voltage and turn-on resistance even in the presence of a heavily-doped "dense" well region with increased impurity concentration.

Figure 46:
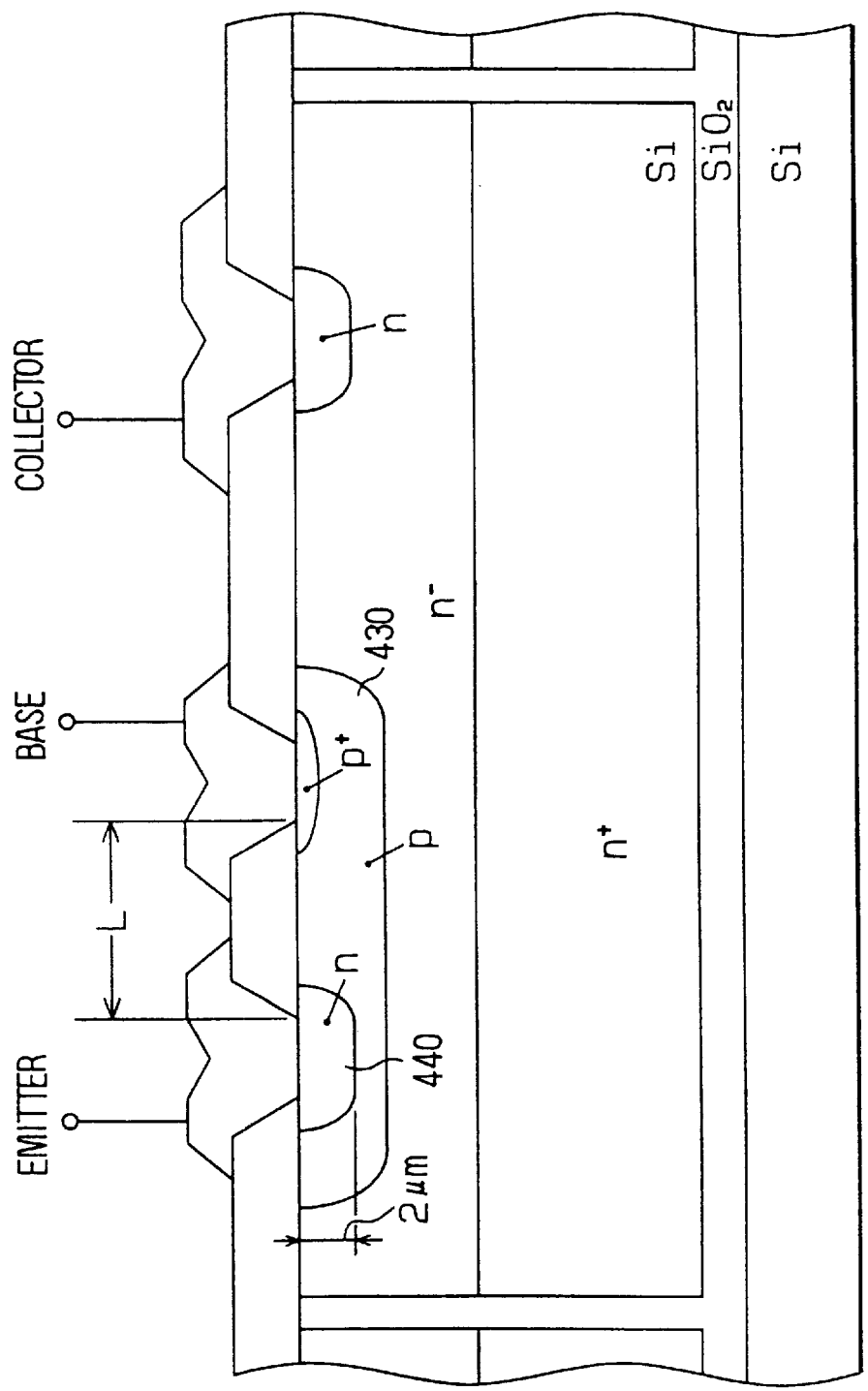
FIGS. 46 and 47 are diagrams each showing a structure of an NPN transistor of related art.

In regard to the NPN transistor of FIG. 24, it may be considered that a base and emitter shown in FIG. 46 are fabricated at the same time that the p-well region 250 and n⁺ type regions 253, 254 of the CMOS device of FIG. 25 are formed. Regarding the PNP transistor of FIG. 39, its emitter and collector regions 321, 322 are formed of the p-well region 250 of such CMOS device whereas a base region 328 is formed of the CMOS device's n-well region 258. This makes it possible to reduce the requisite number of process steps while permitting size reduction or "shrinkage."

An explanation will next be given of a respective one of the p- and n-well regions.

First, the p-well region will be set forth below.

Traditionally, power MOSFETs (up-drain type and LDMOS type) for use in hybrid IC architectures are such that the intended device is fabricated by a method including the steps of performing ion implantation using a gate polysilicon layer as a mask and then thermal processing to thereby form a "dedicated" well region (p-well channel region) for exclusive use as a channel region in a power device, and performing ion implantation using the same polysilicon layer as a mask to thereby form an n⁺-type source region, thus completing the intended device structure. Such double-diffused MOS (DMOS) architecture utilizing the gate polysilicon as implantation diffusion windows was developed in the 1970s under the technical background which follows: the semiconductor manufacturing process technologies at that time stay less in device fabrication accuracies of major production tools such as exposure equipment or else (the minimum feature size is merely about 10 $\mu$m), thus suffering from an inability to manufacture highly miniaturized MOS devices that are less in channel resistance, i.e. sufficiently shortened in gate channel length (about 1 $\mu$m); to avoid this problem, the DMOS architecture was thought up for fabrication of the intended channel region and n⁺-type region(s) with the gate polysilicon being used as a mask therefor. This architecture has also been employed today for manufacture of discrete power semiconductor devices including VDMOS transistors and IGBTs because of the fact that positional alignment between an ion implantation layer for use in forming a channel region and a gate polysilicon mask may be automated while permitting exact determination of resultant channel length through adjustment of the diffusibility of doped impurities during thermal processing and also offering increased stability and reliability even for shortened or "micro" channel lengths. Currently available power device assisted hybrid IC device technologies continue to employ such prior known power MOS device design schemes and gate channel fabrication techniques.

Fortunately, modern very-large-scale integration (VLSI) and ultralarge-scale integration (ULSI) technologies have grown up to enable microfabrication of further miniaturized devices with the minimum feature size in the order of submicrons (about 0.1 $\mu$m or below) while offering dramatically higher mask alignment accuracies than in the 1970s (standard deviation 3δ is less than or equal to 0.1 $\mu$m). As per the technology for microfabrication of hybrid IC devices having bipolar transistors and CMOS transistors plus power devices integrated together on a single chip, this requires use of patterning/exposure equipment with high accuracy equivalent to that in LSI fabrication processes; accordingly, conventional double diffusion techniques using polysilicon masks are becoming less important in recent years. In other words these are replaceable with DMOS manufacturing methodology including the CMOS process steps, while using a CMOS p-well region in place of each DMOS channel region, of fabricating a polysilicon layer and forming an n⁺-type region for use as a source—even in this case also, it is possible to channel resistance-reduced power MOS transistors with a channel length of about 1 $\mu$m as in the traditional double diffusion methods.

Note here that the layout of p-well regions must be carefully designed in view of the fact that gate formation and channel region formation are reversed in the order of process steps. More specifically, as would be readily occur to experts in the semiconductor device art, designing the channel length to measure about 1 $\mu$m should require that a p-well region (such as the one shown by 213 in FIG. 23) be formed by implantation to have a prespecified size of less than or equal to 1 μm which permits overlapping with its associative polysilicon window, which may be achievable by ion implantation over the entire surface area of source cell unit as shown in FIG. 44.

In other words the channel length is to be determined through p-well formation and polysilicon mask size rather than through adjustment of thermal process temperatures and time durations. The intended channel length and cell inside symmetry are sufficiently attainable with the mask accuracy (alignment, minimal size) of 0.1 μm or less.

An explanation will next be given of a technique for adding an n-well region of a CMOS transistor.

In case an n-well region of CMOS transistor is added for the purpose of reducing the epitaxial resistance (in the case of an up-drain MOSFET) or drift resistance (for LDMOS device), the use of a prior art technique for performing ion implantation over the entire surface area of a power device formation region can result in a decrease in impurity concentration of resultant p-well region at a channel section due to overlapped or "double" impurity doping with an n-well region (for example, the p-type region 213 of FIG. 23 is subject to double impurity doping to undesirably overlap the n-well region 218 as formed in the entire surface), which causes punch-through in such channel section, leading to a decrease in drain withstand voltage rating. This can be the because standard CMOS device's p-well region is generally less in impurity concentration (about 1/5 in dose amount) than a p-well region for use as the channel of prior known DMOS device since the CMOS device's threshold voltage Vth (about 1 volt) is potentially lower than the DMOS's threshold voltage Vth (about 2 volts), and, on the contrary, the CMOS's n-well is (about two times) greater in impurity concentration than prior art DMOS's n-wells (such as those in up-drain MOS and LDMOS transistors). Hence, the n-well (for CMOS) is to be formed through specifically designed ion implantation processes which preclude fabrication of it over the entire surface of a power MOS transistor to ensure that the n-well does not overlap any channel well section. One practical approach to attaining this is to add the well to limited portions, which are those parts each lying between the p-well region 213 and p-well channel region 213 (i.e. between neighboring source cells) in the case of the up-drain MOS transistor shown in FIG. 23, or alternatively drain cells adjacent to source cells in the case of the LDMOS transistor of FIG. 37.

With such an arrangement, it is possible to permit the CMOS device's n- and p-well regions to be used in place of the power MOS transistor's p-well channel region and up-drain MOSFET's n-well region plus LDMOSFET'S n-well region, thereby reducing the requisite number of photography and implantation process steps while at the same time reducing in number the masks used.

An explanation will be added relative to the bipolar transistor.

Figure 47:
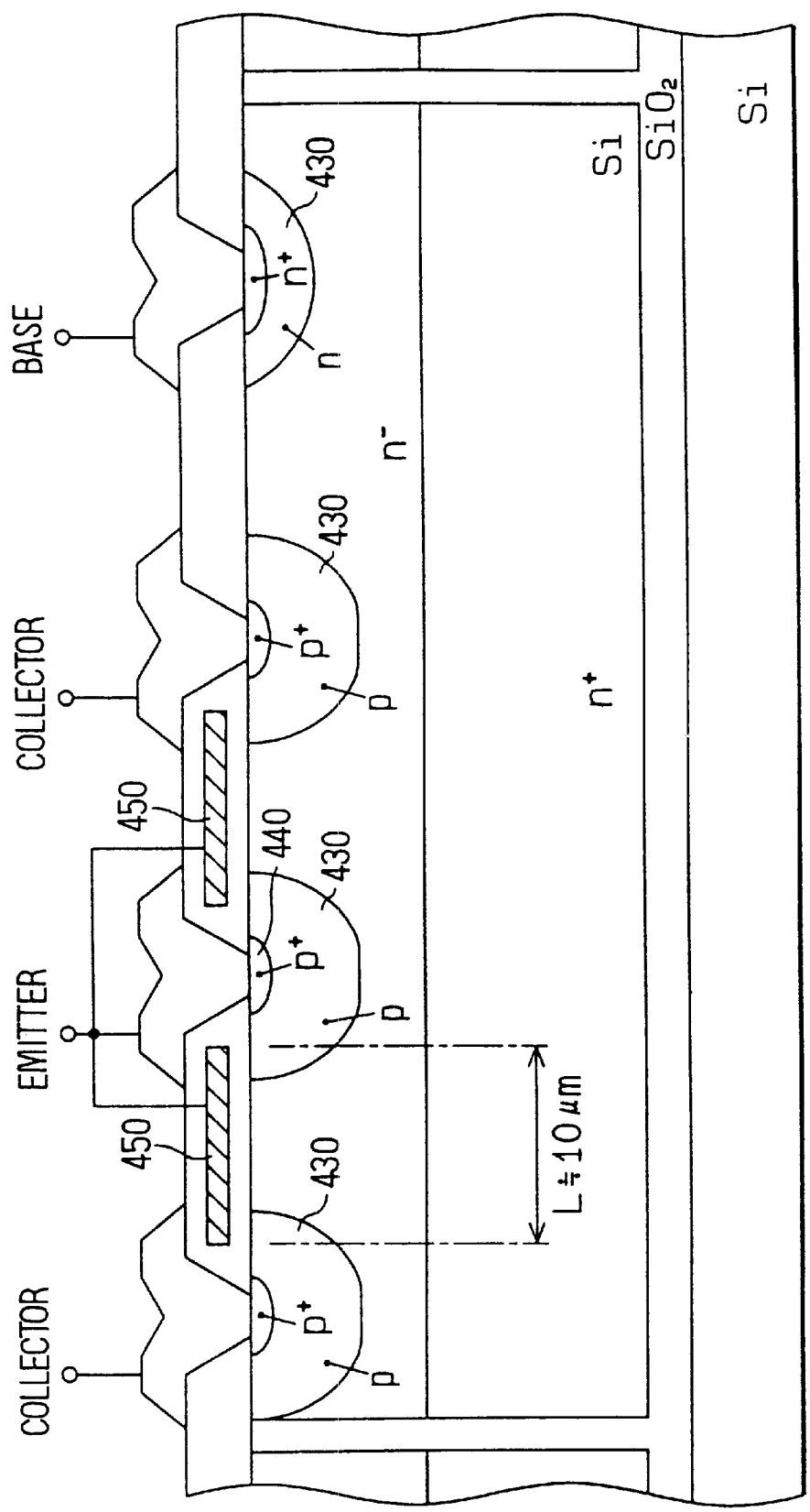

In a lateral type PNP transistor structure such as the one shown in FIG. 47, it is required that its emitter and collector be laid out at an increased distance L defined therebetween in order to retain the breakdown voltage between the emitter and collector. More precisely, the PNP transistor structure of FIG. 47 is designed so that its n-type substrate with a decreased impurity concentration of about $1 \times 10^{15}$ cm$^{-3}$—this is for obtaining the required collector breakdown voltage of such NPN transistor (the collector breakdown voltage $V_{eco}$ measures 25 volts or higher to satisfy the specifications for land vehicles such as automobiles)—is utilized for the base layer of a lateral type PNP transistor. With such an arrangement, punch-through can often take place between the collector and emitter thereof. Avoiding this punch-through does require that the collector and emitter be spaced part from each other (typically, by about 1 μm if $V_{eco}$ is at 25 volts), which results in miniaturization or shrinkage of device sizes. Unfortunately, such device shrinkage is not permissible in the presence of limitations originated from inherent withstand voltage design criteria. For the same reason, it is also required to employ special techniques for retainment of the intended breakdown voltage level by precluding unwanted extension of a depleted layer, which is achievable by disposing the polysilicon layer of interest (such as the one shown by numeral 450 in FIG. 47) on or over an n-type base layer to thereby permit common use or "commonization" of a polysilicon potential with an emitter potential. With a method for letting this polysilicon 450 be formed of an inverse field plate, it is possible to retain the collector-to-emitter breakdown voltage in cases where the collector voltage stays higher in potential than the emitter voltage ($V_{eco}$ is set about 60 volts); however, adversely, in case the former is potentially lower the latter, the emitter-collector breakdown voltage must decrease ($V_{eco}$ is about 6 volts). In view of this, special care should be taken to circuit design activities, such as preventing establishment of any inverse relation in potential between them.

To this end, the example shown in FIG. 39 is specifically arranged so that the CMOS transistor's n-well region 331 is formed or "entered" at part of the n$^-$-type base region to thereby increase the n$^-$ region in impurity concentration, thus preventing any possible extension of a depleted layer concerned. This in turn makes it possible to achieve the intended PNP transistor capable of retaining any required emitter-collector breakdown voltage with a shortened distance (the size L in FIG. 39) as compared to the prior art while simultaneously reducing complexities in circuit design and minimal feature size since the transistor has no polarities in breakdown voltage otherwise occurring in polysilicon inverse field plate methods. Concerning the current amplification factor, any appreciable decrease in current amplification $h_{fe}$ will hardly occur because of the fact that the n-well region 131 is substantially centrally disposed between the emitter and collector to prevent reduction of impurity concentration at an interface between the emitter and collector, thereby narrowing the resultant emitter-collector distance or interval without lowering the impurity doping efficiency at the emitter, which in turn forces holes as injected from the emitter to stay substantially constant in transportation efficiency.

Similarly, even in case the p-well region 250 and source/drain regions 253–254, 261–262 of the CMOS device of FIG. 25 are used as the base and emitter of the NPN transistor of FIG. 24, an active base layer (specific part of a base layer 430 with an overlap-doped emitter layer 440 deleted therefrom) at the dedicated base/emitter fabrication process step is nearly equal to the CMOS device's p-well region in impurity concentration (about $1 \times 10^{16}$ cm$^{-3}$) while letting the emitter layer 440 be substantially the same as source/drain region in concentration ($1 \times 10^{20}$ cm$^{-3}$); thus, the impurity doping efficiency and transportation efficiency are kept unchanged resulting in the current amplification factor $h_{fe}$ being hardly reduced in value. In addition, letting by use of the n$^+$-type region of the CMOS device of FIG. 24 the emitter layer 440 of FIG. 46 with a diffusion depth of about 2 μm be replaced with a region 232 with its diffusion depth of about 0.2 μm makes it possible to shrink a distance between a base contact and emitter contact (the size L in FIG. 24), thus reducing the element size.

Regarding the switching rate, this rate may likewise increase with a decrease in shrinkage of the element size. This can be the because resultant residual holes decrease in number accordingly. Note that in SOI/trench separation structures, the switching rate is principally determined by a delay time as taken when change from a turn-on to turn-off operation. This delay time is inherently due to the presence of those holes residing within oxide-film isolated device regions. Obviously, such residual holes decrease in absolute number with a decrease in element size, thus allowing the resulting switching operation rate to increase accordingly.

It has been stated that letting all of the channel well required for fabrication of a power device and n-well at MOSFET plus well region at LDMOSFET be replaced with CMOS wells makes it possible to greatly reduce the requisite number of dedicated process steps for fabrication of the power device. It is also possible to reduce production costs by reducing or minimizing in number the bipolar transistor dedicated processes through replacement of bipolar transistor's base and emitter with CMOS device's p-well and $n^+$ well regions.

As apparent from the foregoing, the illustrative embodiment offers unique features which follow.

(i) For the manufacture of a semiconductor device having on the same SOI substrate 201 at least the up-drain MOSFET 208 and NPN transistor 209 plus double-well CMOS transistor 210, the first mask M1 disposed over the SOI substrate 201 is used to simultaneously fabricate n-well regions (well regions of first conductivity type) 218, 237, 258 in respective formation regions of the up-drain MOSFET 208 and NPN transistor 209 plus double well CMOS transistor 210 as shown in FIG. 28; then, the second mask M2 overlying the SOI substrate 201 is used to simultaneously fabricate p-well regions (well regions of second conductivity type) 213, 231, 250 in respective formation regions of the up-drain MOSFET 208 and NPN transistor 209 plus double-well CMOS transistor 210 as shown in FIG. 29; thereafter, as shown in FIG. 31, the polysilicon gate electrodes 212, 252, 260 are disposed simultaneously in the formation regions of the up-drain MOSFET 208 and double-well CMOS transistor 210.

In short, as shown in FIG. 22, n- and p-well regions 250, 258 for use in the double-well CMOS transistor 210 are also formed in the formation regions of the up-drain MOSFET 208 and NPN transistor 209 respectively, permitting the up-drain MOSFET 208 and NPN transistor 209 to be constituted at specific well regions (213, 218, 231, 237).

Hence, while taking account of the fact that power MOSFETs used in electronic controller circuitry for motor vehicles are generally under strict requirements as to low costs and low turn-on resistance along with high withstand voltage characteristics, it becomes possible to fabricate on the SOI substrate 201 both the power device 208 and bipolar transistor 209 without requiring use of any masks for exclusive use with the up-drain MOSFET 208 and NPN transistor 209. This in turn makes it possible to reduce production costs in the manufacture of the hybrid IC device with the power device 208 and BiCMOS device on the same SOI substrate 201.

Note that although the explanation above is directed to the case of N-channel MOS transistors, the same results are also expectable in the case of P-channel MOS transistors with n-well regions being simply replaced with p-wells.

Also note that the power device used should not be limited only to the MOSFET and may alteratively be replaced with any one of other types of power devices including, but not limited to, IGBTs and thyristors when the need arises.

Figure 40:
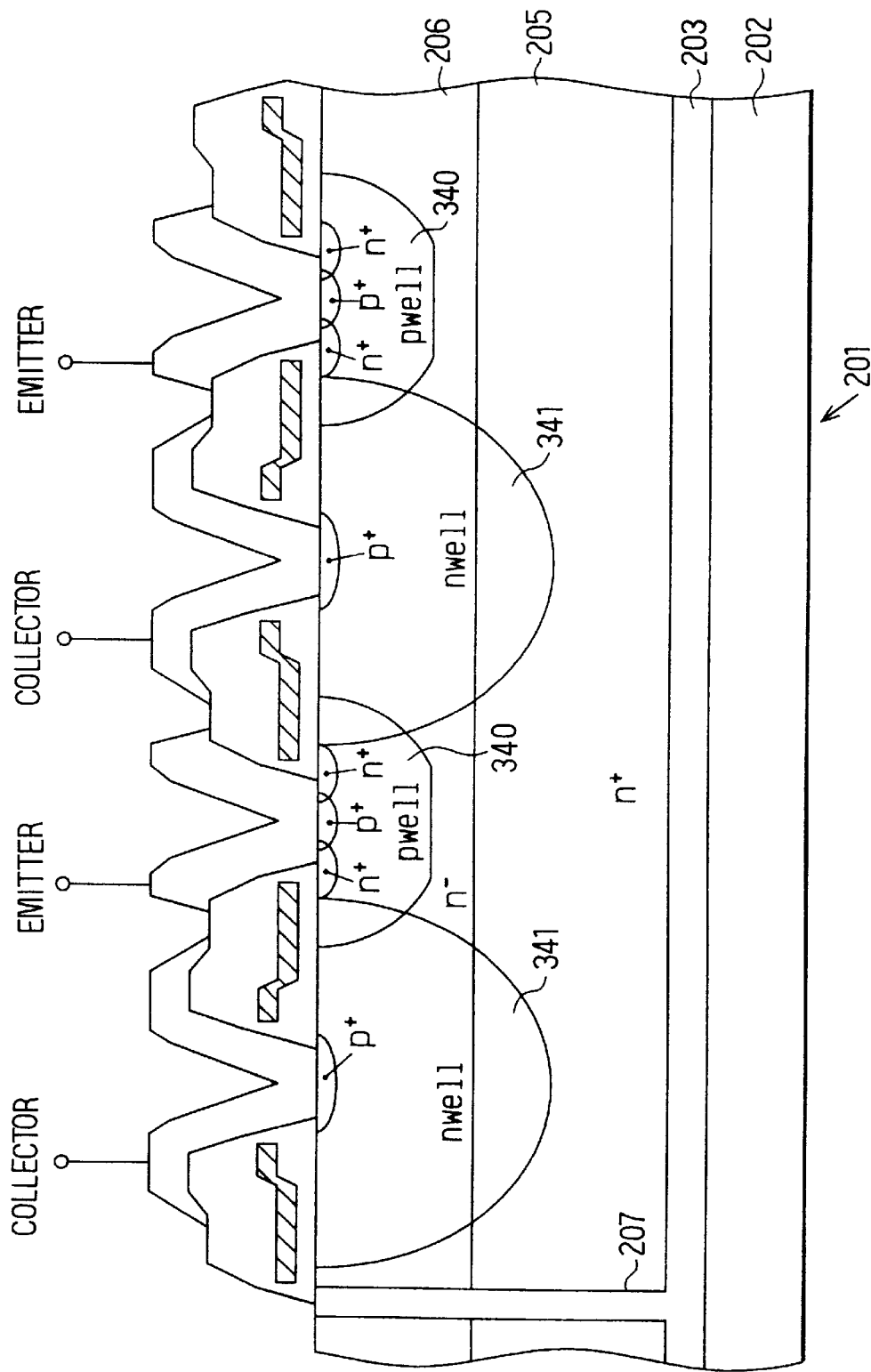
FIG. 40 is a diagram showing a structure of an IGBT of this embodiment.
Figure 41:
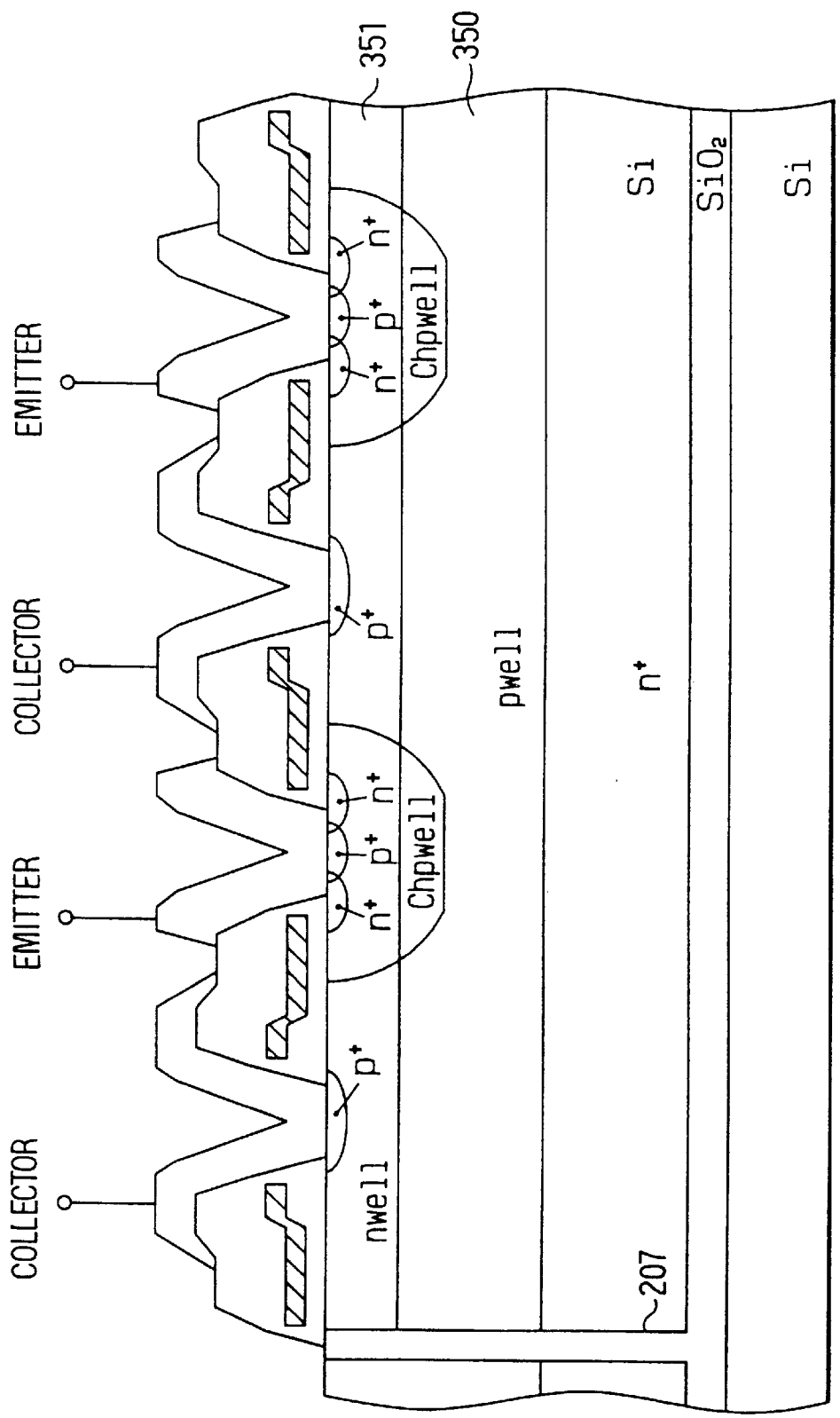
FIG. 41 is a diagram showing a structure of an IGBT of related art.

See FIG. 40. This diagram shows one exemplary device structure in the case of an IGBT employed as the power device. As shown herein, a p-type well region 340 is locally formed at an emitter whereas an n-well region 341 is formed locally at a collector. It is considered that as shown in FIG. 41, a typical IGBT structure is with a p-well region 350 being formed in a surface of a silicon layer overlying an $SiO_2$ layer and also with an n-well region 351 in the surface thereof. In contrast, the IGBT of FIG. 40 is structured using the p-well region 340 and n-well region 341 which are fabricated at the same time that CMOS wells are formed.

Figure 42:
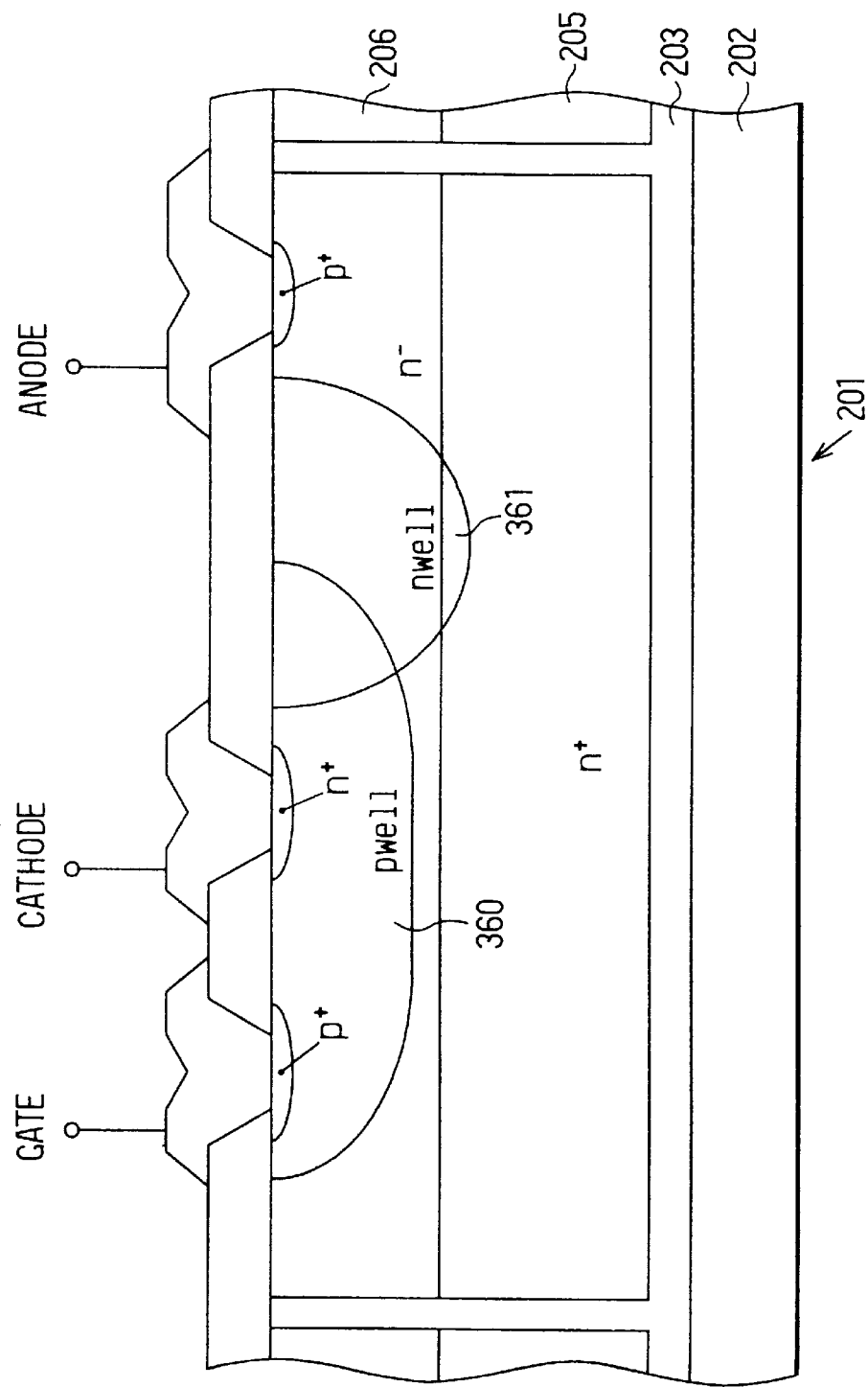
FIG. 42 is a diagram showing a structure of a thyristor of this embodiment.
Figure 43:
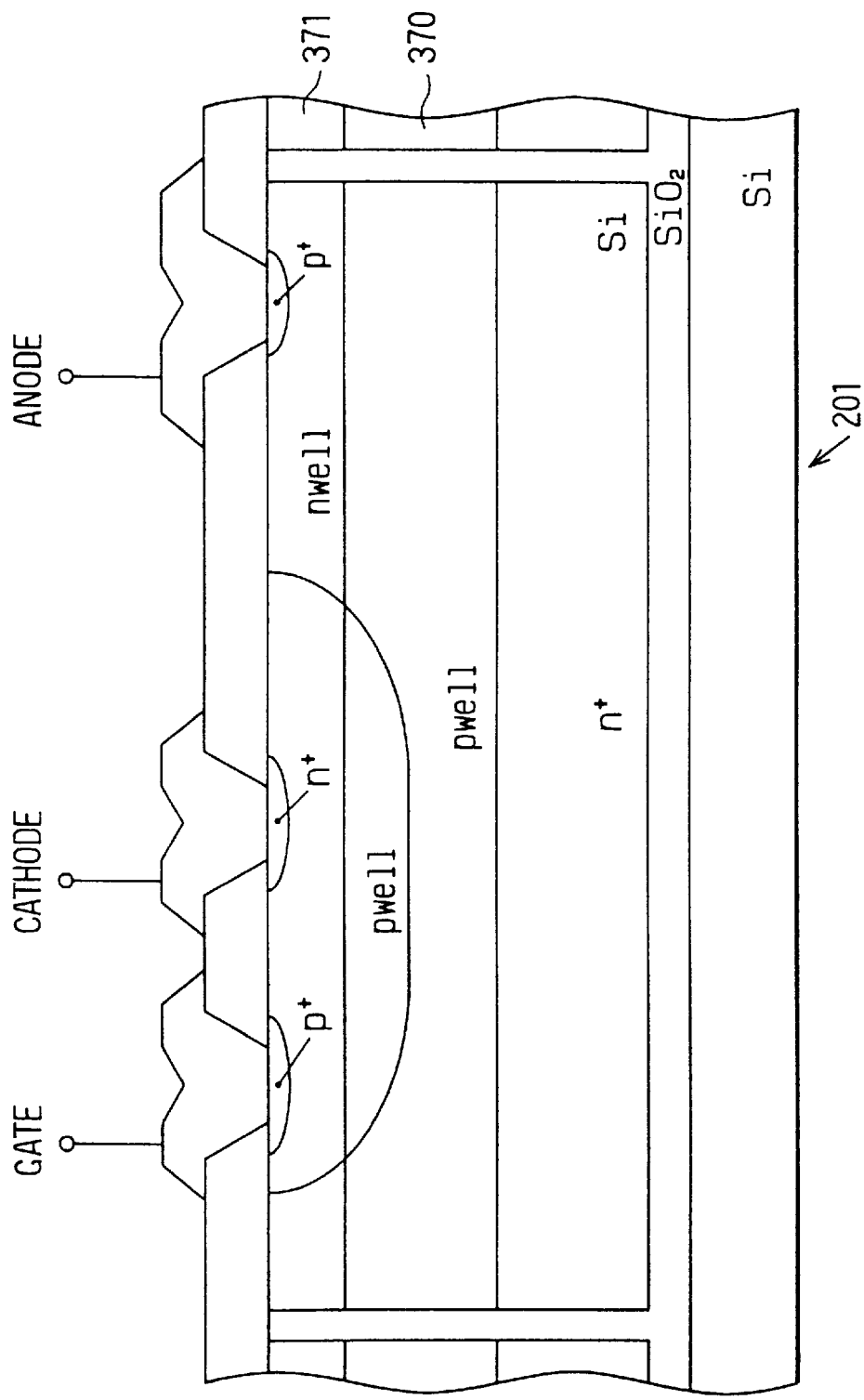
FIG. 43 is a diagram showing a structure of a thyristor of related art.

Regarding the case of a thyristor used as a power device, see FIG. 42. As shown, a p-well region 360 is locally formed at the thyristor's gate and cathode while also letting an n-well region 361 be locally formed at part lying between the gate/cathode and anode. Although it might also be possible to design the thyristor structure in such a way that a p-well region 370 is formed in a top surface of a silicon layer overlying an $SiO_2$ film with an n-well region 371 being entirely formed in the surface as shown in FIG. 43, the thyristor structure of FIG. 42 is distinguished thereover in that the intended thyristor is structured using the n-well region 361 and p-well region 360 which are fabricated simultaneously during formation of CMOS wells.

Third Embodiment

An embodiment as discussed herein is directed to a hybrid IC device for automobile load drive, which includes a BiCMOS circuit and lateral power MOSFETs integrated together on an IC chip. The MOSFETs are of the so-called "resurf" structure type capable of offering increased co-operativity with BiCMOS transistors.

Figure 48:
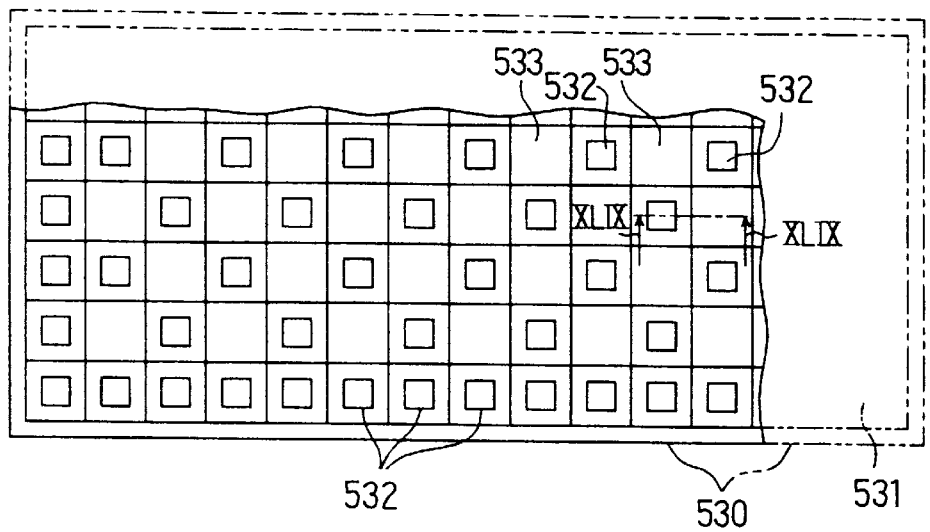
FIG. 48 is a diagram showing a plan view of a lateral type MOS transistor in accordance with a third embodiment of the invention.
Figure 49:
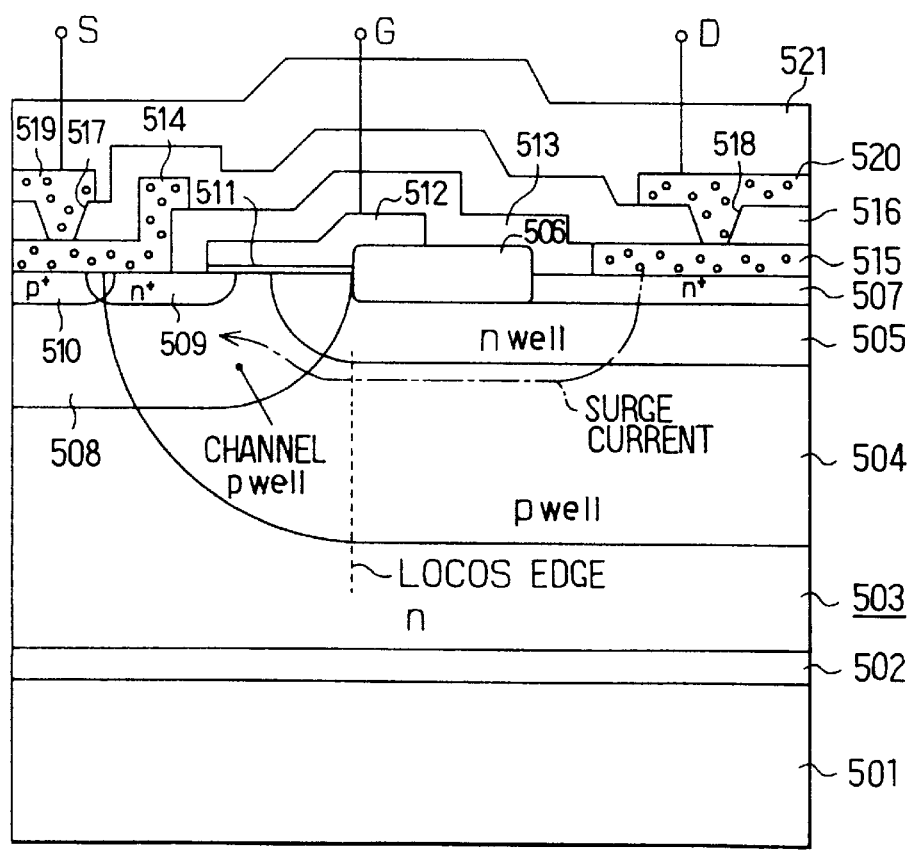
FIG. 49 is a diagram showing a sectional view of the device of FIG. 48 along line XLIX—XLIX.

Referring to FIG. 48, there is shown a plan view of part of a chip substrate surface in which MOSFETs are formed in accordance with this embodiment. FIG. 49 shows a partial sectional view of the structure taken along line XLIX—XLIX of FIG. 48.

As shown in FIG. 49, the hybrid IC has a silicon substrate 501 over which an n-type silicon substrate 503 is disposed with a dielectric film (buried oxide film) 502 sandwiched therebetween, thus providing an SOI structure. The n-type silicon substrate 503 has a thickness of 16 μm and is doped with a chosen impurity to a concentration of approximately $1 \times 10^{15}$ $cm^{-3}$. Further, as shown in FIG. 48, a trench 530 is formed in the n-type silicon substrate 503 to have its inner walls on which an oxide film is formed while being filled with polysilicon. In the SOI substrate a certain silicon region as surrounded by the trench 530 is a transistor island 531. In this transistor island 531, multiple source cells 532 and drain cells 533 are formed in the form of a matrix. More specifically, these cells are laid out at a cell pitch of 8 μm in such a manner that source cells 532 are disposed at the outermost periphery of the transistor island 531 and that, in its inner area, source cells 532 and drain cells 533 are disposed alternately in surface directions crossing at right angles each other to have a checkered or "diced" pattern.

In FIG. 49, a deep p-well region 504 and shallow n-well region 505 are formed by double diffusion techniques in a top surface of the n-type silicon substrate 503 with a drain cell being as its center. This p-well region 504 is $1 \times 10^{16}$ $cm^{-3}$ in impurity concentration and about 5 μm in diffusion depth. The n-well region 505 is $1 \times 10^{16}$ $cm^{-3}$ in impurity concentration and about 1 μm in diffusion depth.

A LOCOS oxide film 506 is disposed between source cells and drain cells over the silicon substrate 503 (n-well region 505). This LOCOS oxide film 506 is placed at an end portion of the n-well region 505. In addition, at the drain cells, an n⁺-type drain contact region 507 is formed in the surface of n-well region 505 and is disposed so that a drain electrode 515 is in contact with the n⁺ drain contact region 507.

A p-well channel region 508 is formed in a surface portion of the n-type silicon substrate 503 in a source cell, wherein the p-well channel region 508 has its end portion which overlaps the well regions 504, 505 in the surface of the silicon substrate 503. To be brief, in FIG. 49, the right side end of the p-well channel region 508 overlaps the left side ends of p- and n-well regions 504, 505.

In the source cell, an n⁺-type source region 509 is formed in a surface of such overlap section of the p-well region 504 and p-well region 508. Also in the source cell a p⁺-type region 510 is formed in the surface of the p-well channel region 508. A source electrode 514 is provided so that it is in contact with the n⁺ source region 509 and p⁺ region 510.

In short, the n-well region 509 laterally extends from a drain cell up to a nearby portion of an edge of the n⁺-type source region 509 underlying a gate oxide film 511 as will be described later in the description. The p-well region 504 laterally extends from the drain cell to reach part underlying the n⁺ source region 509.

On the other hand, a polysilicon gate electrode 512 is disposed via a gate oxide film 511 between part of the n⁺ source region 509 and the LOCOS oxide film 506 in the surface of the substrate 503 (i.e. over the p-well channel region 508). More precisely, the gate electrode 512 is disposed via the gate oxide film 511 to overlie the overlap portion of the n-well region 505 and p-well channel region 508 and the right side edge of n⁺ source region 509 plus the p-well channel region 508's upper surface therebetween. The polysilicon gate electrode 512 is provided to extend overlying the LOCOS oxide film 506 to completely cover the gate oxide film 511 spanning from the edge of source cell to LOCOS oxide film 506.

The polysilicon gate electrode 512 is covered with an insulative or dielectric film 513. The source electrode 514 and drain electrode 515 are made of aluminum; these electrodes 514, 515 form the first-level aluminum layer. An interlayer dielectric film 516 is disposed on the first aluminum layer 514, 515, over which source/drain aluminum leads 519, 520 are disposed as a second-level aluminum layer. This source-use aluminum lead 519 is connected via a via hole 517 to the source electrode 514 whereas the drain-use aluminum lead 520 is coupled via a via hole 518 to the drain electrode 515. Further, a passivation film 521 is disposed on the source/drain aluminum leads 519, 520.

A manufacturing method of the MOSFET employing the resurf structure will be set forth below.

Figure 50:
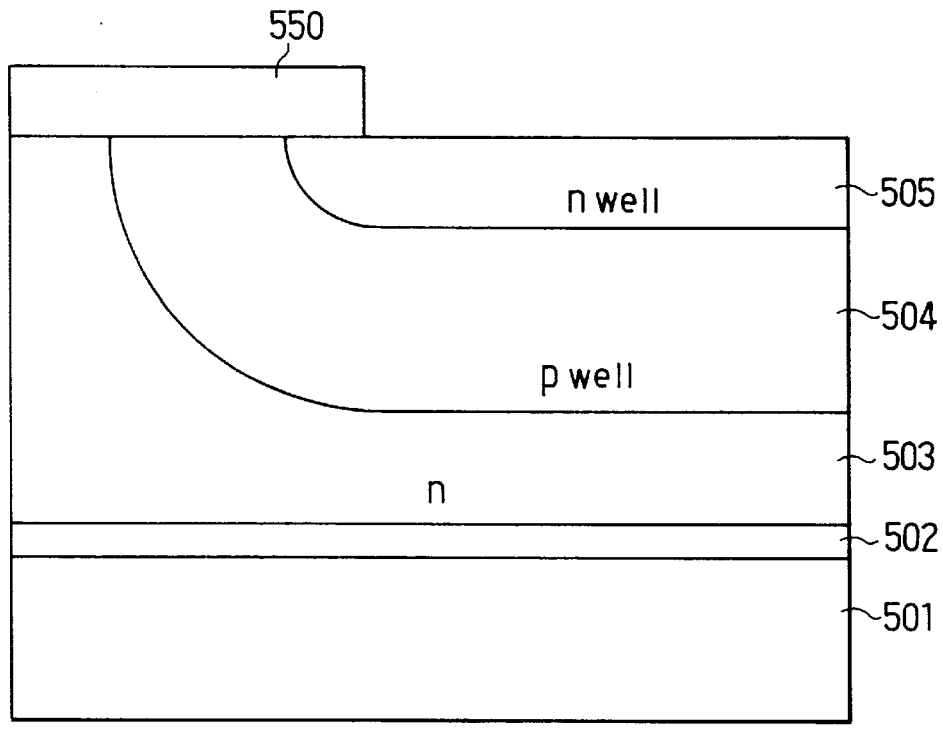
FIGS. 50 to 53 depict in cross-section some of the major steps in the manufacture of a lateral type MOS transistor.

First, as shown in FIG. 50, prepare an SOI substrate; then, use a resist film 550 as a common mask to fabricate a p-well region 504 and n-well region 505 by ion implantation and thermal diffusion techniques. More specifically, let boron (B) and arsenic (As) be ion-implanted with the same mask 550 on the substrate and then subject to thermal diffusion. A dose amount at this time is $1 \times 10^{13}$ cm$^{-2}$ for boron and $5 \times 10^{12}$ cm$^{-2}$ for arsenic; thermal processing is done at 1170° C. for 15 hours.

Here, the implantation of double-well regions 504, 505 is carried out in a way such that out-diffusion expands to cover almost the entire region spanning from the source cell's LOCOS edge to the drain region to thereby ensure that, in the resultant device structure (state of FIG. 47) with all thermal processing steps are completed, the arsenic doped is reachable by lateral diffusion to a target portion adjacent to the edge of the n⁺ source region 509 underlying the gate oxide film 511 while permitting the doped boron to reach a base resistance layer underlying the n⁺ source region 509.

Note here that although in this example the double-well regions 504, 505 are arranged to employ the same mask 550, separate masks may be used for fabrication of the p-well region 504 and n-well region 505 at any desired locations.

Figure 51:
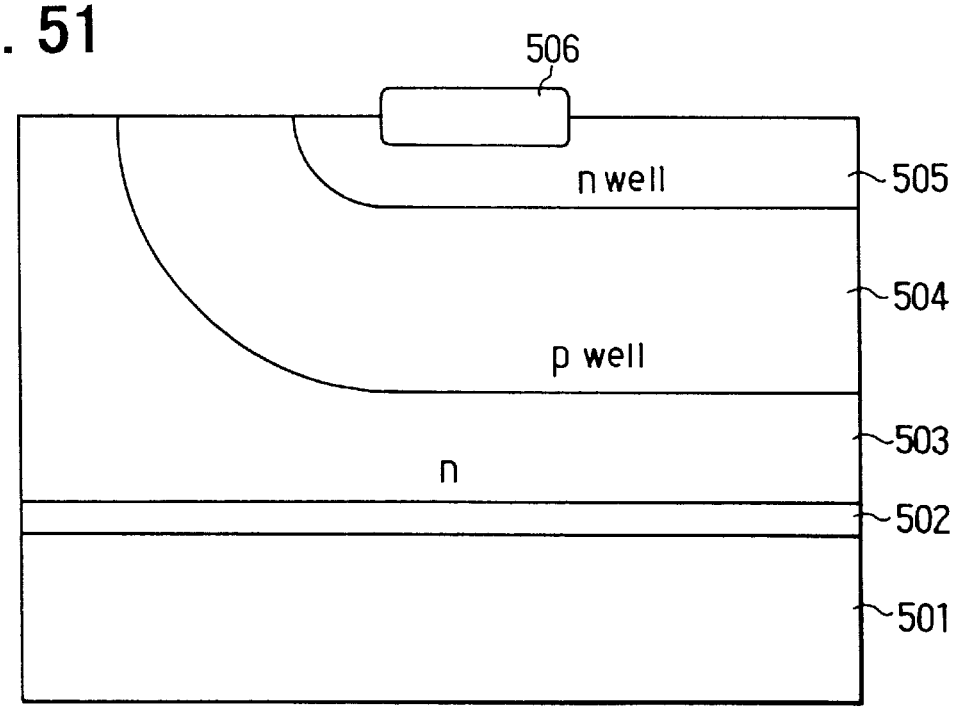

Subsequently, as shown in FIG. 51, fabricate a LOCOS oxide film 506 on the substrate 503. This LOCOS oxide film 506 is about 500 nm thick and 2 μm wide.

Figure 52:
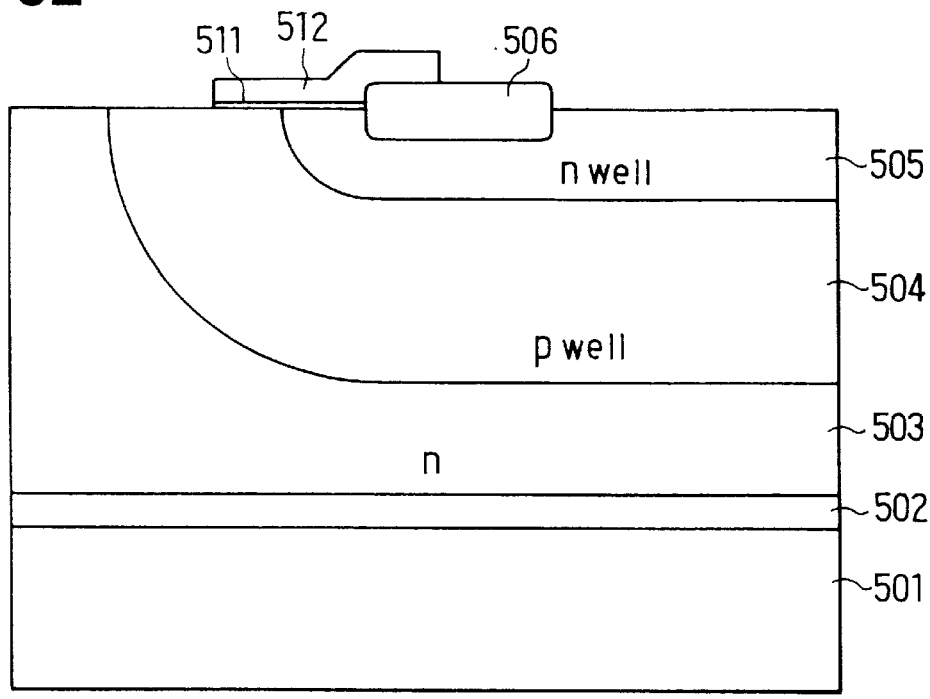

Further, as shown in FIG. 52, form a gate oxide film 511 to a thickness of about 30 nm; then, deposit and pattern a polysilicon layer for later use as a gate electrode 512. The polysilicon gate layer 512 is about 300 nm thick.

Figure 53:
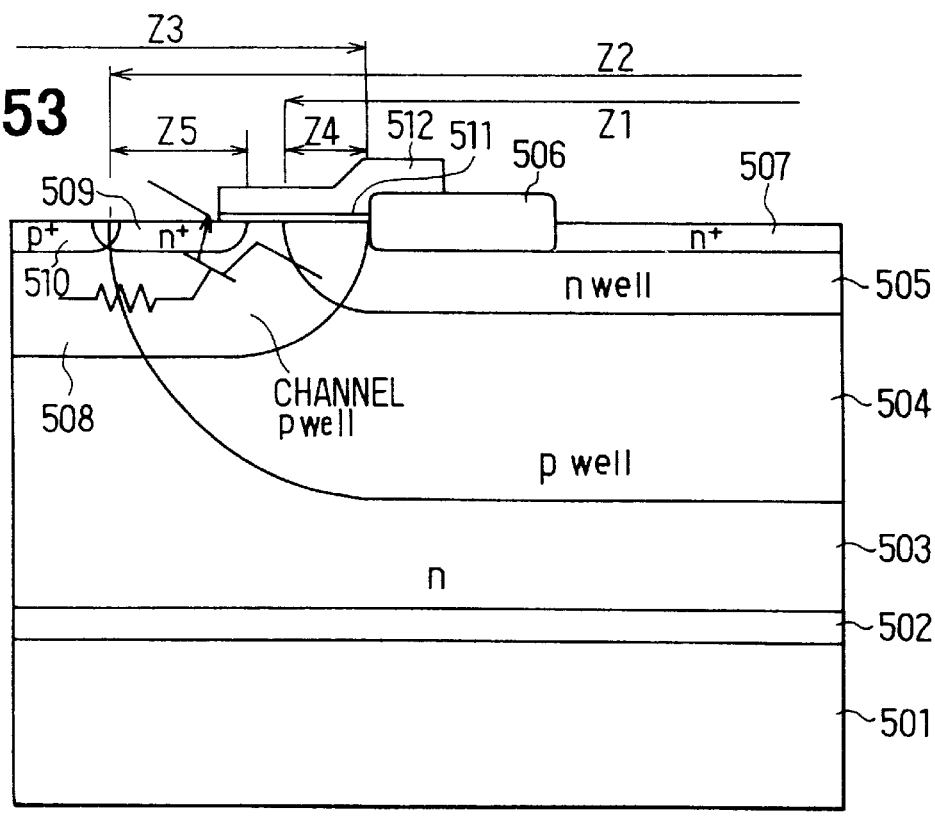

Thereafter, as shown in FIG. 53, perform implantation from an edge of the polysilicon gate electrode 512; then, perform thermal diffusion thus forming a p-well channel region 508. The implantation condition is such that boron (B) is doped at a dose of $5 \times 10^{13}$ cm$^{-2}$, and thermal processing is done at 1050° for about 7 hours. Additionally, perform implantation with the polysilicon gate electrode 512 used as a mask to thereby form an n⁺-type source region 509. More practically, arsenic is doped at a dose of about $5 \times 10^{15}$ cm$^{-2}$. Simultaneously, form an n⁺-type drain contact layer 507. Further, form a p⁺-type region 510.

In FIG. 53, a fabrication range of the n-well region 505 is indicated by "Z1"; the p-well region 504's formation range is shown by "Z2"; the p-well channel region 508's range is by "Z3"; the overlap part of the n-well region 505 and p-well channel region 508 is by "Z4"; and, the overlap part of p-well region 504 and p-well channel region 508 beneath n⁺ source region 509 is by "Z5."

Thereafter, as shown in FIG. 49, deposit a dielectric film (BPSG film) 513 to a thickness of 700 nm, which is then subject to reflow treatment at 950° C. for 20 minutes, thus forming more than one contact hole in this BPSG film 513.

Then, deposit by sputter techniques a first-level aluminum layer of 0.5 μm thick, which is then patterned to fabricate source and drain electrodes 514, 515. Deposit thereon an interlayer dielectric film 516 while forming via holes 517, 518 in this interlayer dielectric film 516. Further, deposit by sputtering a second-level aluminum layer to a thickness of 1.5 μm, which is then patterned to form interconnect leads 519, 520. Then, perform sintering at 450° C. Thereafter, deposit a passivation film (SiN) 521, 1.6 μm thick, thus completing a MOSFET employing the resurf structure.

An operation of the MOSFET thus arranged will be explained below.

As shown in FIG. 53, the n-well region 505 and p-well region 504 are formed at limited portions Z1, Z2 on the drain side, rather than in the entire LOCOS structure. Hence, upon application of a surge voltage between the source and drain, it is possible to increase the impurity concentration of the p-well channel region 508 immediately underlying the n⁺ source region 509 (at Z5) with respect to a parasitic transistor, which in turn makes it possible to reduce the base resistance of such parasitic transistor.

In summary, in view of the fact that a decrease in surge withstand rating is due to an operation of a parasitic transistor created between the source and drain, in order to prevent such parasitic transistor operation, the p- and n-well regions 504, 505 for the intended resurf structure are limitatively formed by implantation at only selected portions on the drain side rather than in the entire LDMOS structure whereby the resultant n⁺ source region 509 is disposed in the overlap portion of the p-well region 504 and p-well channel region 508 so that this overlap portion of such both well regions 504, 508 increases in impurity concentration while letting the part underlying the n⁺ source region 509 also increase in impurity concentration. In this way, increasing the impurity concentration of the p-well channel region 508 immediately underlying the n⁺ source region 509-that is, decreasing the base resistance of parasitic transistor-makes it possible to prevent any possible bipolar transistor operation, which in turn enables improvement in surge withstand rating without accompanying penalties as to the LDMOS breakdown voltage and turn-on resistivity.

Additionally, in the channel region (especially in the rage of Z4), its impurity concentration (channel density) stays lower due to cancellation effect of the p-well channel region 508 and n-well region 505. This makes it possible to reduce the turn-on resistance.

A characteristic portion of this embodiment will be explained below.

In the LDMOS device structure shown in FIG. 53, the p-well channel region 508 underlying the n⁺ source region 509 overlaps the p-well region 504 whereby the p-well channel region 508 beneath the n⁺ source region 509 is high in impurity concentration so that the base resistance is less. Due to this, even when a surge current flows in the base layer of a parasitic bipolar transistor due to breakdown of pn junction between the drain and source upon surge application thereto, a bias between the base and emitter is suppressed rendering such parasitic transistor inoperative. This permits the surge withstand rating to improve.

Further, in the LDMOS device structure of FIG. 53 embodying the invention, the p-well region 504 is coupled to the p-well channel region 508 by diffusion (spreading) in the lateral direction. Due to this, a p-well voltage potential is made common to a source potential; thus, the excellent characteristics inherent to the double-well LDMOS device are kept unchanged, such as high withstand rating and low turn-on resistance.

In this way, while those power MOSFETs generally used in motor cars are strictly required to offer conflicting or "trade-off" characteristics such as high breakdown voltage and low turn-on resistivity plus high surge withstand rating, letting the double-well region for the intended resurf structure be partly formed in a drain cell of n conductivity type makes it possible to preclude any possible parasitic transistor operation at a source cell thereby improving the surge withstand rating while at the same time retaining high breakdown voltage and low turn-on resistance which are the inherent merits of the resurf structure.

Some principal features of this embodiment are as follows.

(i) While letting part of the p-well channel region 508 overlap the well regions 504, 505, the n⁺ source region 509 is formed at the surface of such overlap section of the p-well region 504 and p-well channel region 508 with the polysilicon gate electrode 512 being disposed over the overlap section between n-well region 505 and p-well channel region 508 with gate oxide film 511 sandwiched therebetween. Hence, the n⁺ source region 509 is laid out at the overlap section between n-well region 505 and p-well channel region 508 whereby the resultant impurity concentration increases while permitting an underlying portion of the n⁺ source region 509 to stay high, which makes it possible to reduce the base resistance of a parasitic bipolar transistor thereby preventing any bipolar transistor operation. In addition, the polysilicon gate electrode 512 electrically isolated by the gate oxide film 511 is disposed over the overlap section between n-well region 505 and p-well channel region 508 causing the impurity concentration (channel density) to decrease due to a cancellation effect of impurities doped therein, which in turn enables the turn-on resistance to decrease successfully.

It is thus possible to prevent any possible bipolar transistor operation thus improving the surge withstand rating without accompanying penalties as to breakdown voltage and turn-on resistance.

(ii) As the semiconductor substrate of the first conductivity type is formed of an n-type substrate, practical applicability becomes preferable.

Note here that the embodiment device structure is specifically designed so that part of the p-well region 504 (or most part thereof) overlap the p-well channel region 508 immediately underlying the n⁺ source region 509 that defines the base resistance (pinch resistance).

In addition, as has been set forth previously, this embodiment is arranged to preclude the n-well region 505 from overlapping the base resistance layer as shown in FIG. 53 in order to prevent reduction of the surge withstand rating while simultaneously increasing the impurity concentration of such base resistance layer to thereby increase the breakdown voltage whereby the resultant structure is well balanced in the high breakdown voltage and low turn-on resistance plus high surge withstand rating.

Furthermore, in a view point of the turn-on resistance, the embodiment of FIG. 53 is such that certain part of the n-well region 505 for formation of the resurf structure overlaps part (i.e. the portion indicated by Z4 in the drawing) of the p-well channel region 508 underlying the gate oxide film 511; thus, the channel decreases in impurity concentration thereby enabling the LDMOS device to decrease in turn-on resistance.

Fourth Embodiment

A fourth embodiment will now be explained mainly as to its difference from the third embodiment stated supra.

Figure 54:
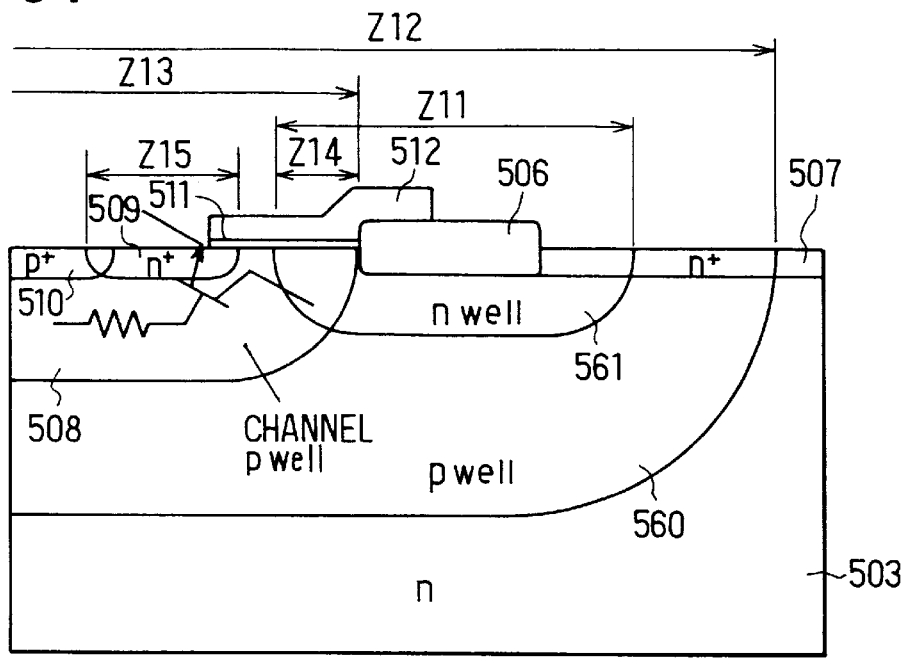
FIG. 54 is a diagram showing a sectional view of a lateral type MOS transistor in accordance with a fourth embodiment of the invention.

See FIG. 54, which shows a MOSFET of this embodiment. This is different from that of FIG. 53 in layout positions Z11, Z12 of a p-well region 560 and n-well region 561. The p-well region 560 is formed to span from a portion including an under part of n⁺-type source region 509 up to LOCOS oxide film 506.

Figure 55:
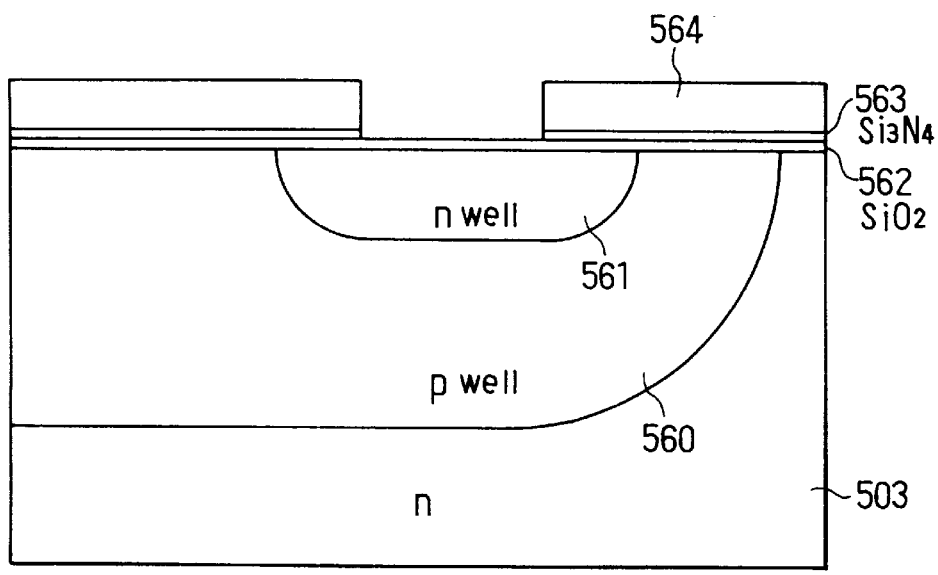
FIGS. 55 to 57 depict in cross-section some of the major steps in the manufacture of a lateral type MOS transistor.

A manufacturing method of it is as follows. As shown in FIG. 55, fabricate the p-well region 560 of LDMOS transistor of this example in the entire region of source cells during formation of p-well regions of CMOS transistors in a hybrid IC device. Boron concentration at this time is set at $1 \times 10^{17}$ cm⁻³. In addition, fabricate by implantation an n-well region 561 with use of a mask for LOCOS oxide film formation. More specifically, fabricate on the substrate 503 a silicon oxide film ($SiO_2$) 562 and silicon nitride film (Si3N4) 563; then, use a patterned photoresist film 564 to remove away those portions of the silicon nitride film 563 in selected regions. Next, form an n-well region 561 in a specified region with the resist 564 used as a mask.

Figure 56:
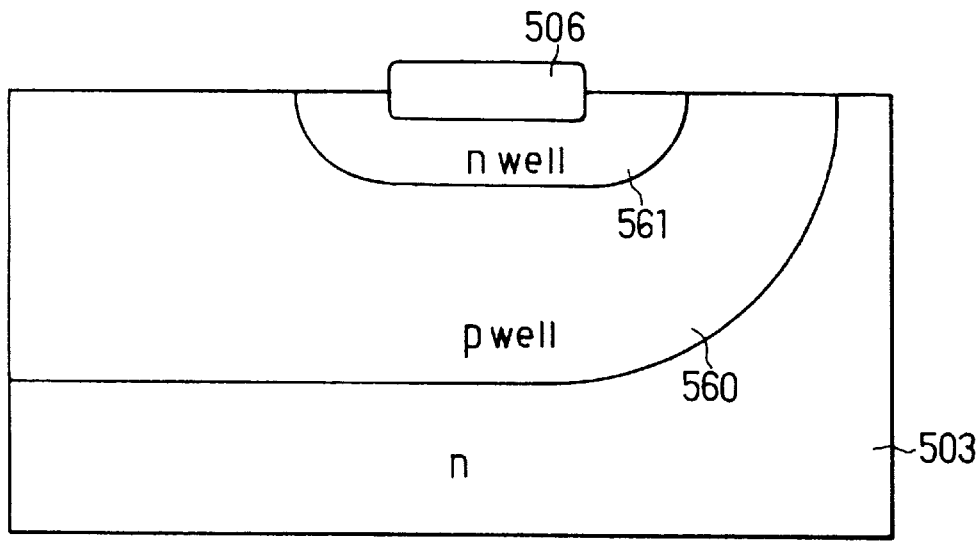

Then, as shown in FIG. 56, form LOCOS oxide film 506.

Figure 57:
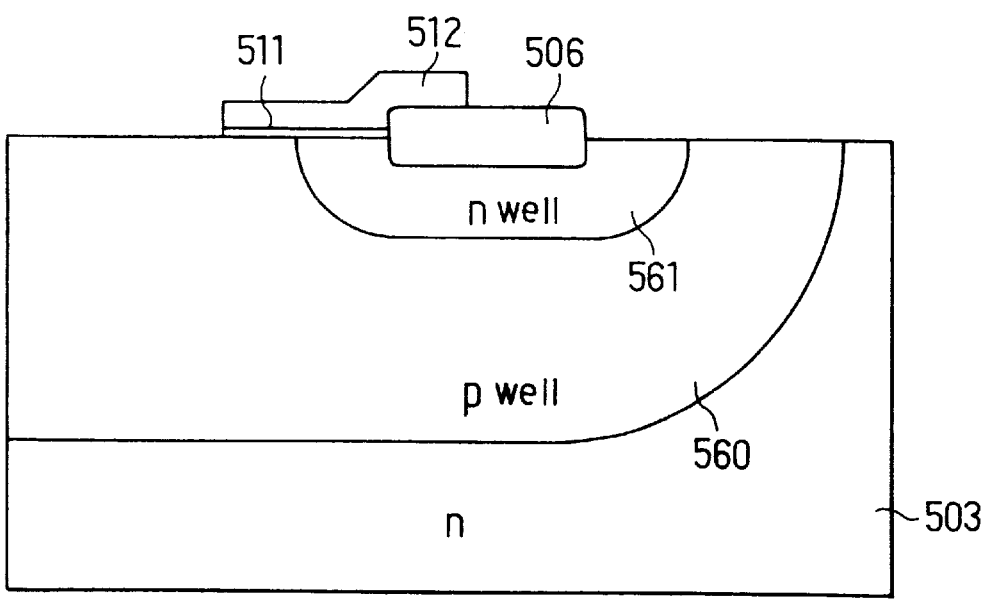

Thereafter, as shown in FIG. 57, form gate oxide film 511 and polysilicon gate electrode 512.

Subsequently, as shown in FIG. 54, perform implantation from an edge of the polysilicon gate electrode 512 and then thermal diffusion, thus forming p-well channel region 508

(its range is shown by Z13). At this time the n-well region 561 and p-well channel region 508 overlap each other in the region Z14 while causing p-well channel region 508 to be disposed within p-well region 560.

Then, fabricate n$^+$-type source region 509 and n$^+$ region 507 along with p$^+$ region 510. The following fabrication procedure is the same as that of the third embodiment; thus an explanation thereof will be eliminated herein.

As apparent from the foregoing, this embodiment is arranged so that the n-well region 561 is formed by implantation by utilization of the silicon nitride film for use in LOCOS formation, which makes it possible to selectively fabricate automatically the n-well region 561 only on the drain side. Additional advantage is that the fabrication is achievable without requiring any extra photolithography process steps.

In brief, regarding the well fabrication method, the p-well region 560 is formed with common use of a p-well region of CMOS transistor while forming the n-well region 561 with utilization of the SiN mask that has been used for formation of the LOCOS oxide film 506.

Furthermore, as the p-well region 508 is formed within the p-well region 560, the n$^+$ source region 509 becomes higher in impurity concentration than that of the third embodiment stated above, thus further improving the surge withstand rating.

Fifth Embodiment

A fifth embodiment will next be explained mainly as to its difference from the third embodiment discussed previously.

Figure 58:
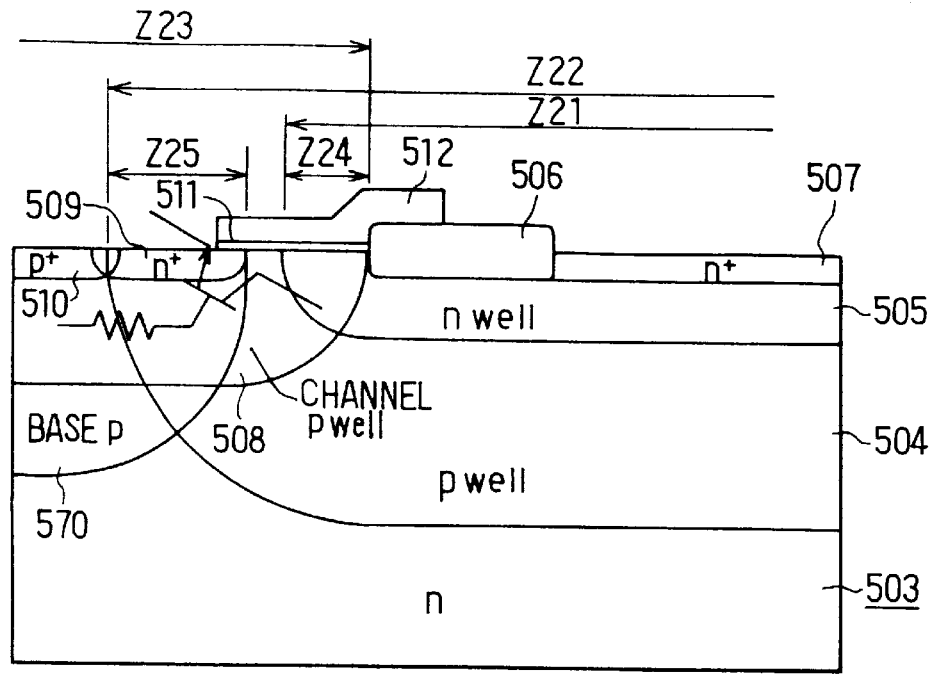
FIG. 58 is a diagram showing a sectional view of a lateral type MOS transistor in accordance with a fifth embodiment of the invention.

See FIG. 58, which shows a MOSFET of this embodiment.

In the fifth embodiment shown herein, a p-type well region 570 for use as a base (internal diode) is formed at the center of a source cell, which region is deeper than p-well region 508. The p-type base region 570 is also formed at part beneath n$^+$ source region 509.

In short, fabricating the p-type base region 570 by partial or selective implantation at the center of a source in the manufacturing process makes it possible for the p-well channel region 508 underlying the n$^+$ source region 509 (at the part shown by Z25 in FIG. 58) to increase in impurity concentration. The p-type base region 570 uses boron as an impurity doped thereinto at a dose of $2 \times 10^{14}$ cm$^{-2}$, followed by thermal processing at 1050° C. for 4 hours.

Sixth Embodiment

A sixth embodiment will next be explained mainly as to its difference from the third embodiment stated previously.

Figure 59:
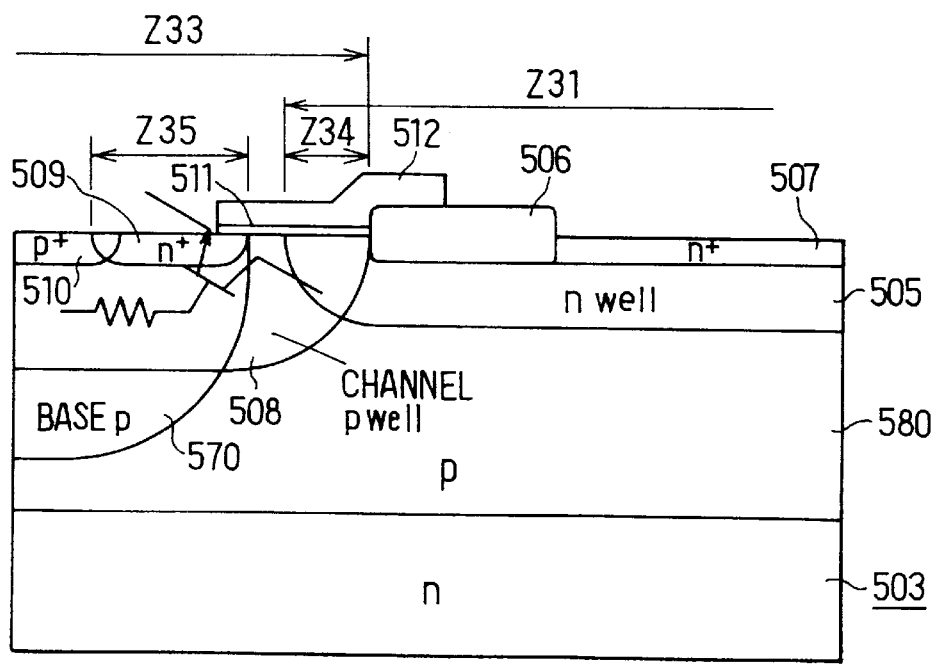
FIG. 59 is a diagram showing a sectional view of a lateral type MOS transistor in accordance with a sixth embodiment of the invention.

See FIG. 59, which shows a MOSFET of this embodiment.

In this embodiment, the p-well region 580 is formed in a widened region. In addition, it has a p-type base region 570 (the one as used in the fifth embodiment of FIG. 58) deeper than p-well channel region 508, the p-type base region 570 forming a deep pn junction, i.e. internal diode.

Figure 60:
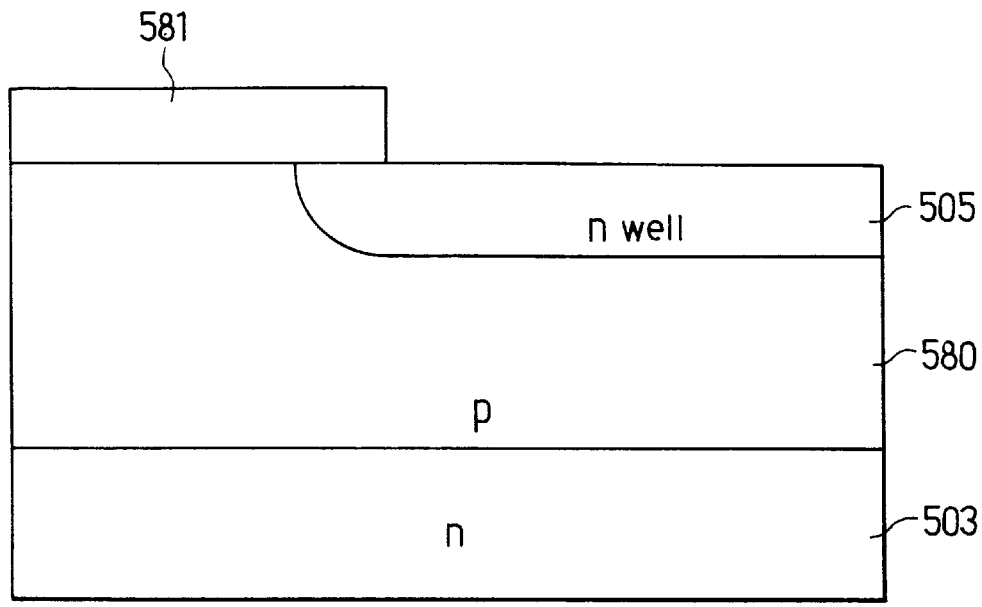
FIGS. 60–62 illustrate in cross-section some of the major steps in the manufacture of a lateral type MOS transistor.

The embodiment device structure is manufacturable by a method which follows. As shown in FIG. 60, an SOI substrate is prepared. Then fabricate therein a p-well region 580. Next, form n-well region 505 using a patterned photoresist layer 581.

Figure 61:
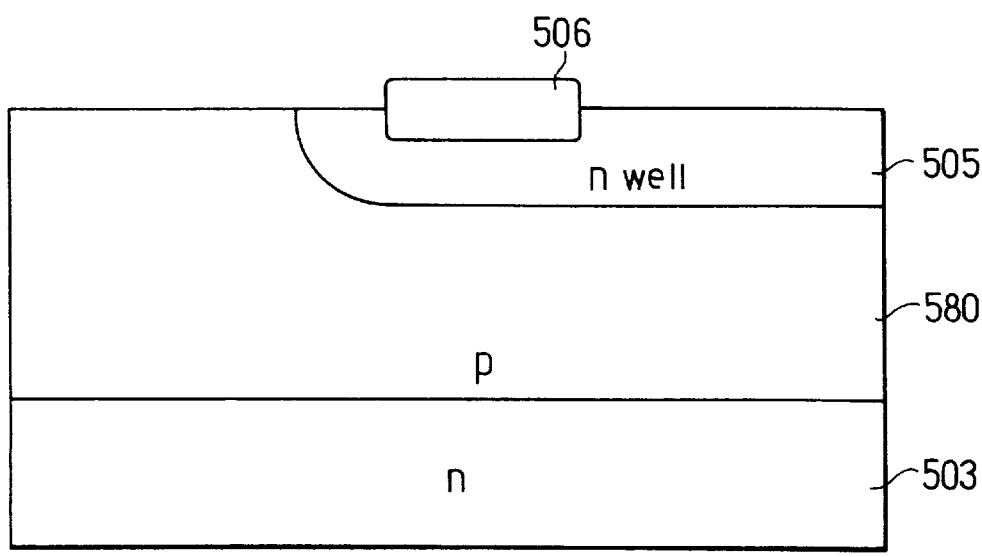
Figure 62:
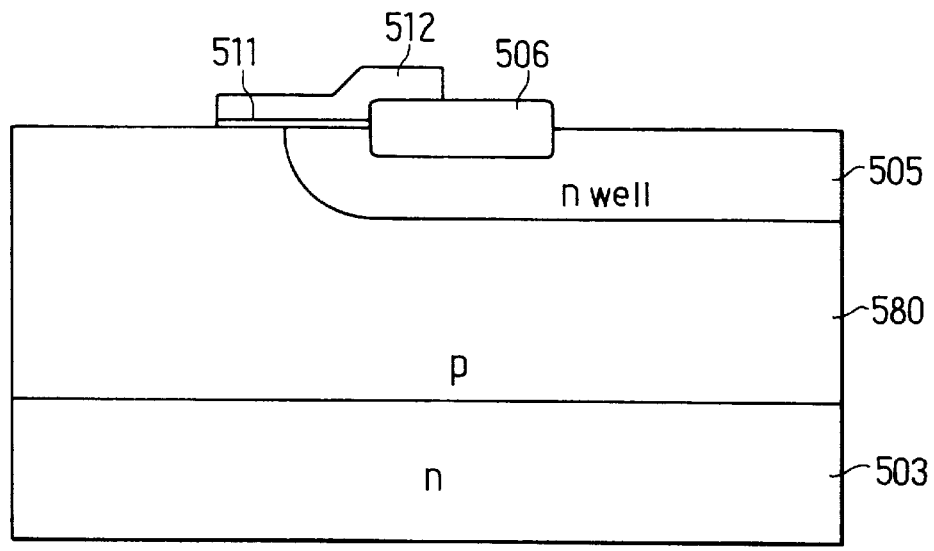

Then, as shown in FIG. 61, form LOCOS oxide film 506 on the substrate 503. Further, as shown in FIG. 62, form gate oxide film 511 and polysilicon gate electrode 512.

Subsequently, as shown in FIG. 59, form n$^+$ source region 509 and n$^+$ drain contact region 509 along with p$^+$-type region 510 and p-type base region 570. The following procedure is the same as that of the third embodiment, and thus an explanation thereof will be omitted herein.

Although in the discussion above the substrate is designed to have n type conductivity as shown for example in FIG. 49, the device may be modified to a lateral type MOS transistor with conductivity types reversed. In other words the present invention may also be applied to the case of using a substrate of p-type conductivity (the case where the "p" and "n" types of FIG. 49 are interchanged with each other into inverse ones).

Figure 63:
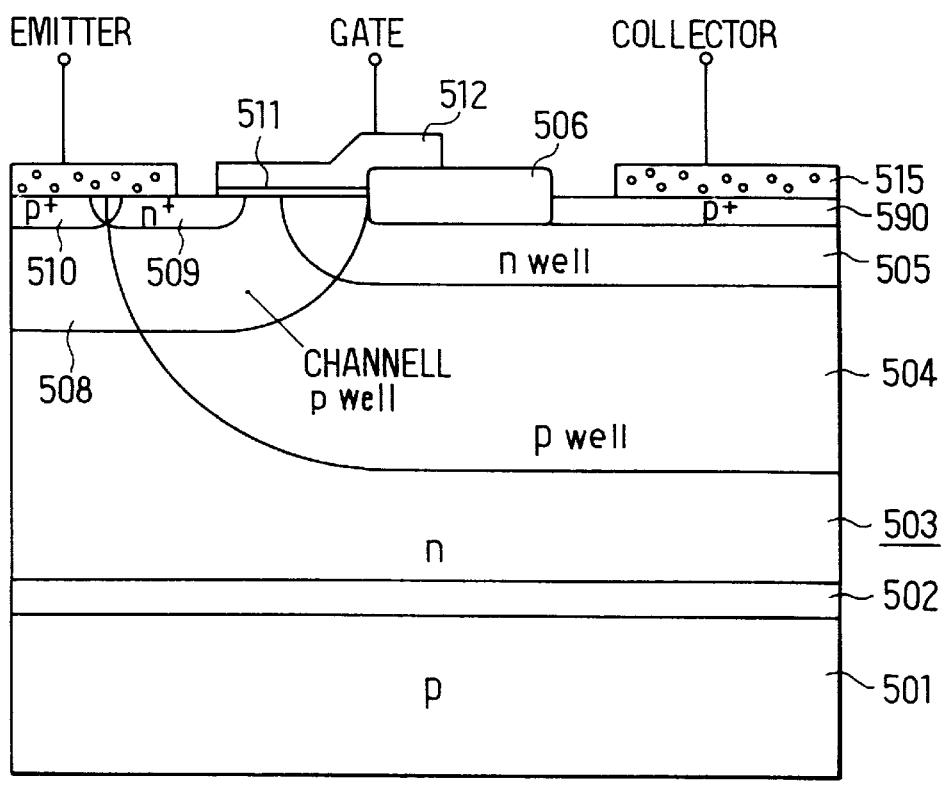
FIG. 63 depicts a sectional view of a lateral type IGBT also embodying the invention.

Turning to FIG. 63, there is shown an embodiment of an IGBT device structure with the n$^+$ type of drain being replaced by p$^+$ type. To be brief, this is a lateral type IGBT having a p$^+$-type collector region 590 as formed in a surface of n-well region 509. A manufacturing method of this device is similar to that of the LDMOS device except for such replacement of the n$^+$ type with p$^+$ type.

Seventh Embodiment

This embodiment is practically implementable as a hybrid IC device for automobile electronics modules, which includes power MOSFETs and bipolar transistors plus CMOS transistors as integrated on a single IC chip. The power MOSFETs may be up-drain type DMOSFETs.

Figure 64:
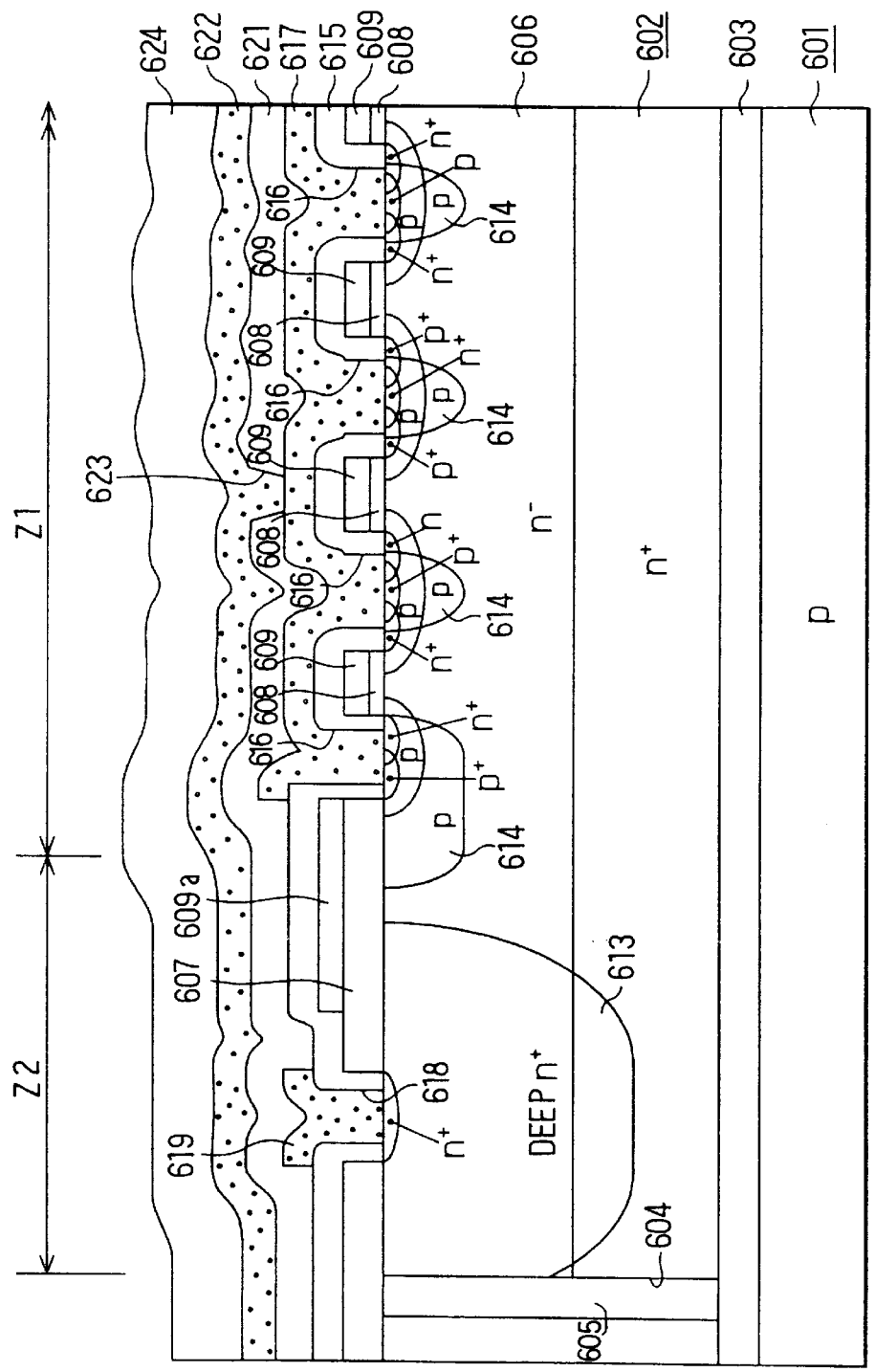
FIG. 64 is a diagram showing a sectional view of an up-drain type DMOSFET in accordance with a seventh embodiment of the invention.
Figures 65A, 65B:
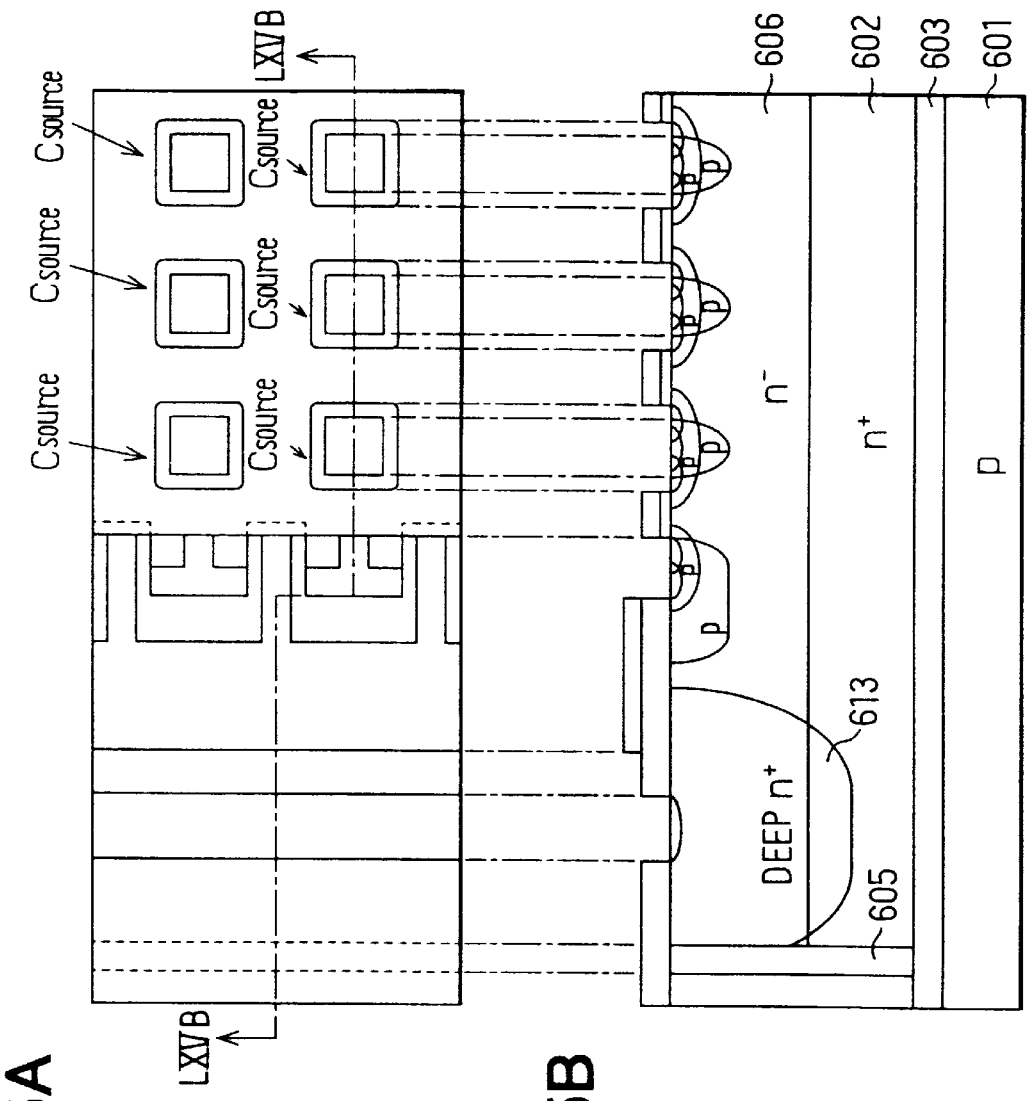
FIG. 65A is a diagram showing a plan view of a device structure with an electrode material and its overlying layers removed away.
FIG. 65B depicts a corresponding sectional view of the device of FIG. 65A.
Figure 66:
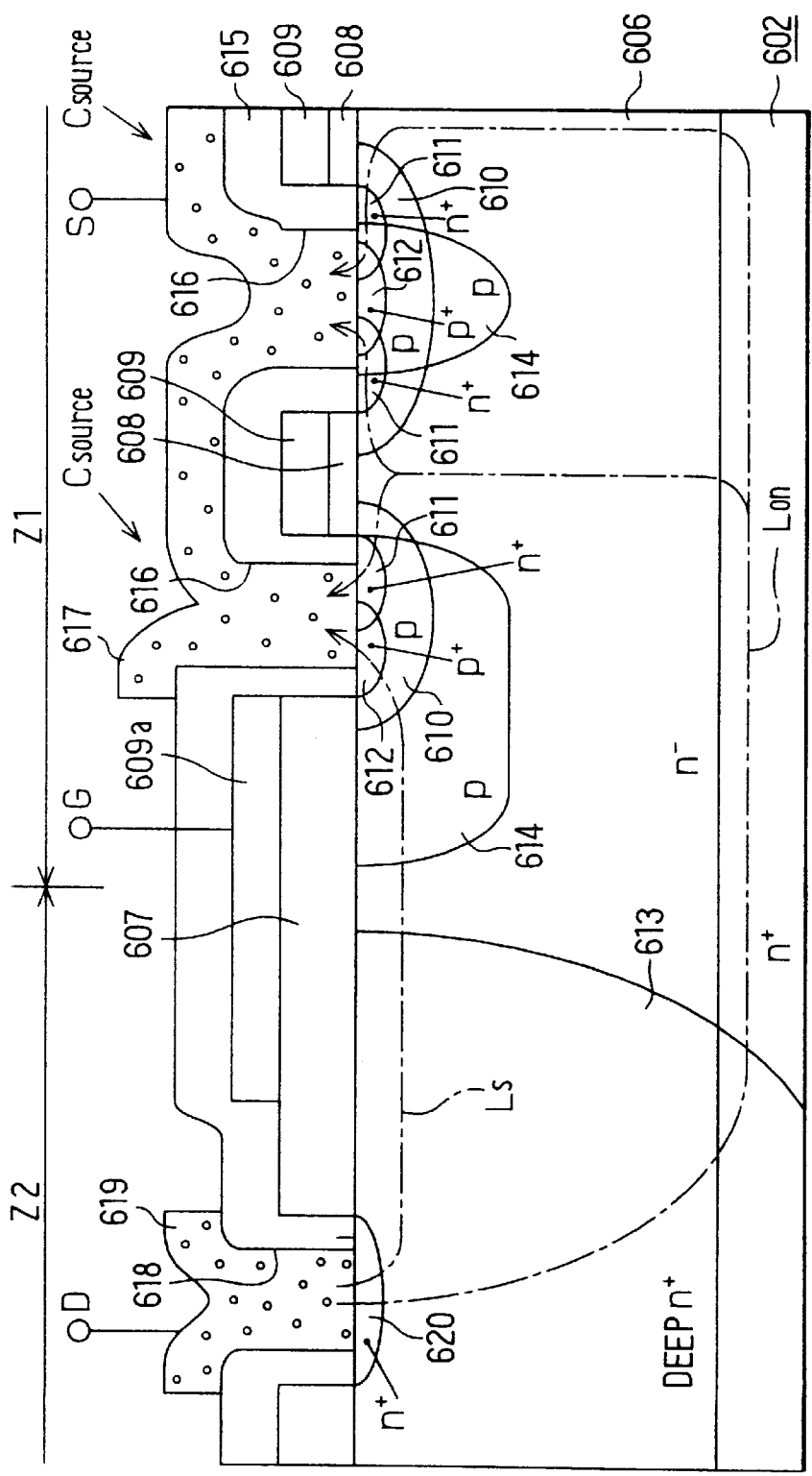
FIG. 66 is an enlarged sectional view of the device of FIG. 64.

See FIG. 64, which shows a cross-sectional view of part of the hybrid IC device including an up-drain DMOSFET. FIG. 65A shows a plan view of a portion of the device with an electrode material and its overlying materials removed away for illustration purposes only; FIG. 65B is a corresponding sectional view of the device portion of FIG. 65A. FIG. 66 is an enlarged sectional view of the FIG. 64 device structure.

This embodiment is designed to form islands by utilization of a silicon on insulator (SOI) structure and isolation structure using a trench oxide film. More specifically, as shown in FIG. 64, a p-type silicon substrate 601 and n$^+$-type silicon substrate 602 are contacted together with a silicon oxide film (buried oxide film) 603 sandwiched therebetween, providing the SOI structure. The n$^+$ silicon substrate 602 has a trench 604 formed in its surface extending from the surface to reach the buried oxide film 603, wherein the trench 604 is filled with an oxide film 605 and polysilicon (not shown) and wherein a silicon region as surrounded by the silicon oxide film (buried oxide film) 603 and oxide film 605 is defined as an island.

The n$^+$-type silicon substrate 602 has its surface in which an n$^-$-type region 606 is formed. Here, the n$^-$ region 606 of the SOI substrate measures $1 \times 10^{15}$ cm$^{-3}$ in impurity concentration, and has a thickness which is determinable depending on the breakdown voltage required—for example, approximately 13 $\mu$m for a 35-V npn transistor. The n$^+$ region 602 beneath the n$^-$ region 606 is $1 \times 10^{18}$ cm$^{-3}$ in impurity concentration and about 3 $\mu$m in thickness.

Note that the SOI substrate may be designed to employ an n-type epitaxial wafer.

As shown in FIG. 64 a MOSFET formation island is partitioned into two separate regions: a source formation region Z1 and drain formation region Z2. In the source formation region Z1 a number of source cells C$_{source}$ are formed.

A LOCOS oxide film 607 is formed in the surface of substrate 602 at selected part lying between the source formation region Z1 and drain formation region Z2. This LOCOS oxide film 607 is for electrical separation or isolation between the source formation region Z1 and drain formation region Z2 on the substrate 602.

At each source cell $C_{source}$ a gate oxide film 608 is formed as a gate oxide film on the surface of the substrate 602. A polysilicon gate electrode 609 is disposed over the gate oxide film 608. As shown in FIG. 66, a p-type base region (p-type well region) 610 and n⁺-type source region 611 are formed by double diffusion through implantation doping of boron (B) and arsenic (As) with the polysilicon gate electrode 609 being as diffusion windows. Further formed in the p-base region 610 is a p⁺-type contact region 612. A p-type region is formed in the surface of substrate 602 so that it is deeper than p-base region 610 for formation of a body diode.

As better shown in FIG. 64, the drain formation region Z2 is spaced apart from the source formation region Z1 causing a deep n⁺-type region 613 to be formed in a surface of the substrate 602 (n-type region 606) in this drain formation region Z2. This deep n⁺ region 613 is deeper than the n⁻ region 606.

In this way, the illustrative up-drain MOSFET is structurally arranged so that multiple source cells $C_{source}$ similar to discrete ones are laid out with the drain formation region Z2 (deep n⁺ region 613) being disposed at the periphery of the source formation region Z1.

On the other hand, a BPSG film 615 is disposed on the polysilicon gate electrode 609. In addition, as shown in FIG. 66, contact holes 616 are formed in the BPSG film 615, through which holes a source electrode 617 is contacted with the n⁺ source region 611 and p⁺ contact region 612. This source electrode 617 is made of aluminum. BPSG film 615 also has a contact hole 618 through which a drain electrode 619 is in contact with the deep n⁺ region 613. The drain electrode 619 is made of aluminum. Additionally an n⁺-type contact region 620 is formed at the contact portion between the deep p⁺ region 613 and drain electrode 619.

The source electrode 617 and drain electrode 619 form the first aluminum layer. As shown in FIG. 64 a second-level aluminum layer 622 is disposed over the first-level aluminum layer (617, 619) with an interlayer dielectric film (TEOS) 621 laid between them, the aluminum layer 622 being connected via a via hole 623 to the source electrode 617. The second aluminum layer 622 is greater in thickness than the first aluminum layer 617, 619. The second aluminum layer 622 is covered with a passivation film (SiN) 624.

In this embodiment the LOCOS oxide film 607 is extended to reach a source contact portion (616) of a source cell $C_{source}$ that is nearest to the drain in the source formation region Z1. In other words the LOCOS oxide film 607 thicker than the gate oxide film 608 is also disposed at an edge portion on the source formation region Z1 side as a dielectric film overlying the substrate 602 at part between the drain formation region Z2 and source formation region Z1. A polysilicon layer 609a for use as gate lead material is provided and elongated overlying the extended LOCOS oxide film 607—at this polysilicon layer 609a, the gate is externally pulled out of a source cell $C_{source}$. In addition, as shown in FIG. 66, at the source cell $C_{source}$ nearest to the drain, p-type region 614 is formed under LOCOS oxide film 607 in the state that it is extended from the source side to the drain side. Further, at the source cell $C_{source}$ nearest to the drain, the n⁺ source region 611 is absent at the p-type region 614's elongate formation location toward the drain side while arranging other source cells $C_{source}$ so that the n⁺ source region 611 as provided therein is partly removed.

Figure 67:
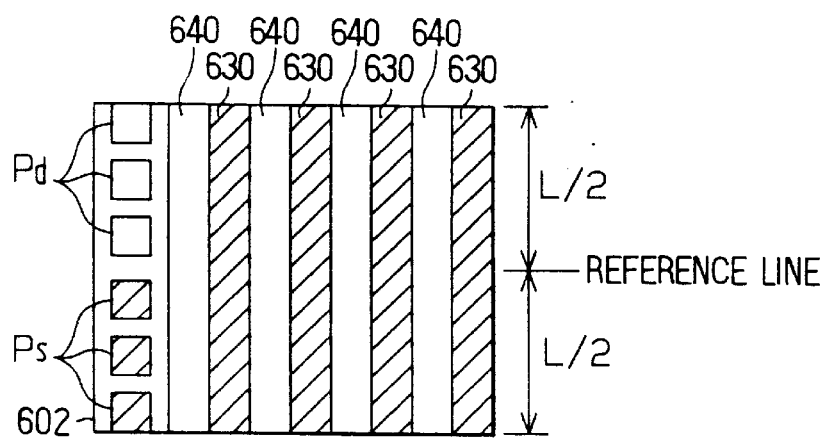
FIG. 67 is a diagram showing a layout pattern of first-layered aluminum leads.

Referring to FIG. 67, there is shown a planar layout pattern of the first aluminum layer (corresponding to the layers 617, 619 in FIG. 64). Also see FIG. 68, which shows a planar layout pattern of the second aluminum layer (622 of FIG. 64). FIG. 60 shows a layout pattern of via holes (623 in FIG. 64).

Figure 68:
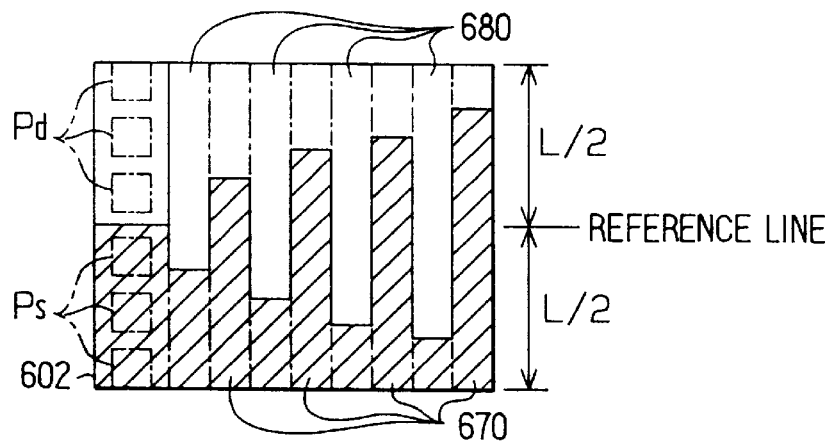
FIG. 68 is a diagram showing a layout pattern of second-layered aluminum leads.
Figure 69:
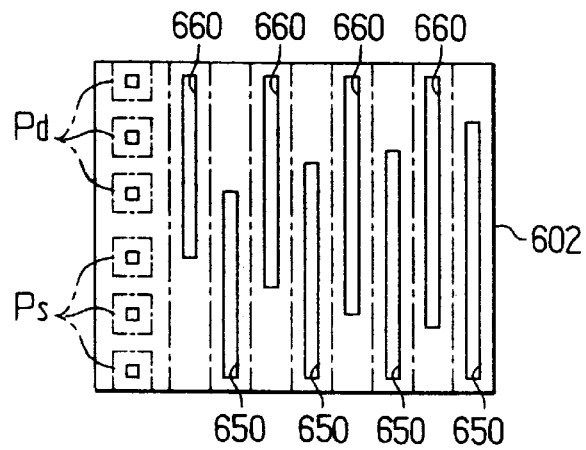
FIG. 69 is a layout diagram of a via hole pattern.

In short the aluminum interconnect leads 617, 619 of FIG. 64 have the layout pattern shown in FIG. 67; via holes 623 formed in its overlying interlayer dielectric film (SiN) 621 have the layout of FIG. 69; its overlying aluminum leads 622 have the layout of FIG. 68.

As shown in FIGS. 67–69, those leads associated with the source and drain for use in taking out of source and drain potentials are provided across two stacked layers over the substrate 602 while causing source pads Ps and drain pads Pd for wire bonding to be provided so that these are offset in position to one side of a chip. Additionally in the layout of FIG. 67, parallel band-like source connect leads 630 and parallel band-like drain connect leads 640 are provided alternately. In the layout of FIG. 69 parallel narrow rectangular source via holes 650 and drain via holes 660 are provided alternately.

In the layout of FIG. 68 source leads 670 are disposed over the source leads 630 of FIG. 67 whereas drain leads 680 are over the drain leads 640 of FIG. 67, wherein the source/drain leads 670, 680 are designed to increase in length with a change in position from the left side to the right side of the drawing.

Here, the degree of overlap of the second-layered leads 670, 680 with respect to the first-layered leads 630, 640 is specifically designed to be greater than 50 percent (%)—preferably, 75%.

Figure 70:
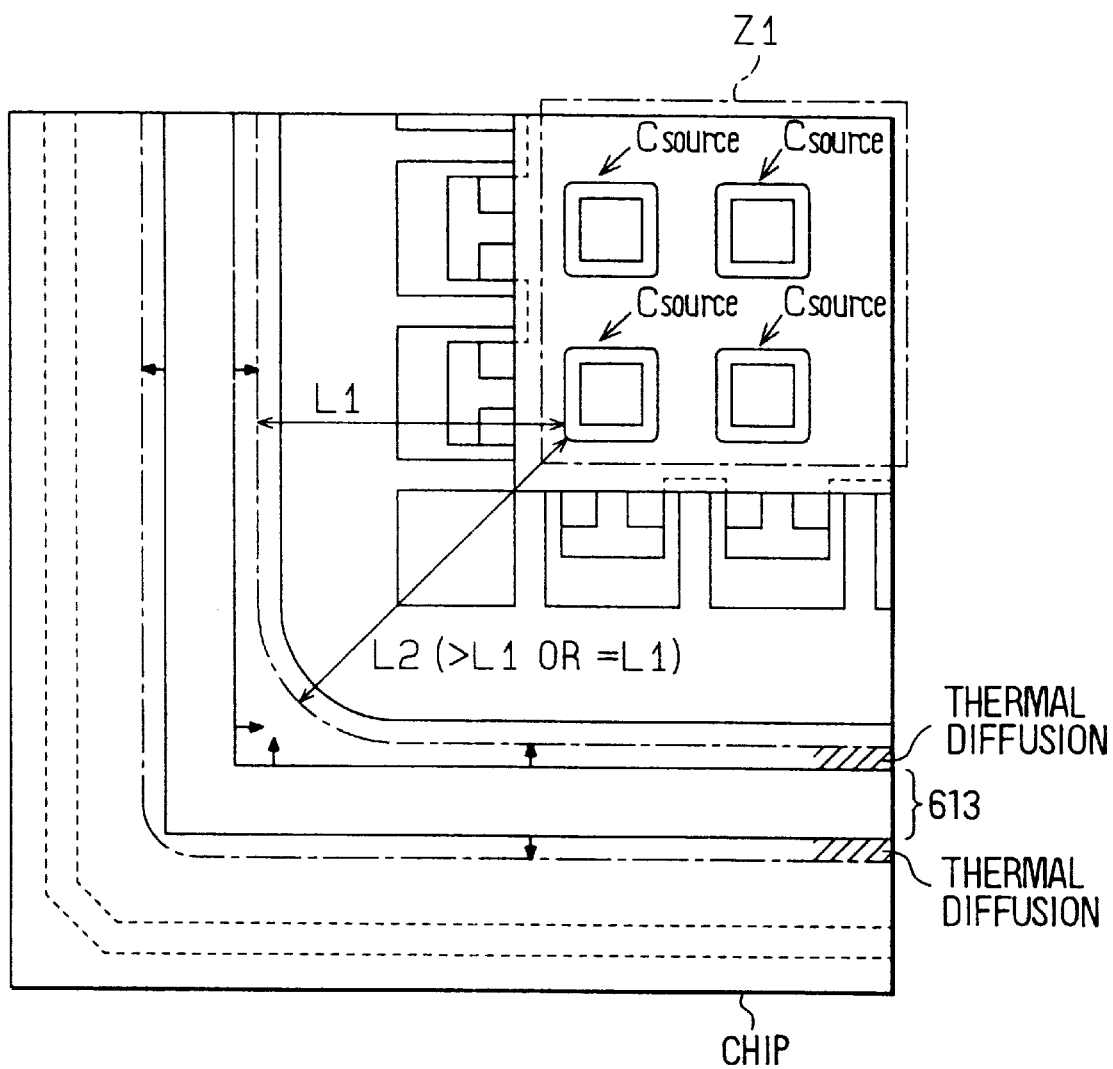
FIG. 70 is a plan view diagram showing a corner edge portion of an IC chip.

Turning to FIG. 70, there is shown an enlarged plan view of one corner edge of the IC chip. As shown herein, the deep n⁺ region 613 at this corner is laid out to have a straight shape rather than a circular shape. More specifically, let it cross linearly at the corner edge as an elongated structure of the deep n⁺ region 613 (impurity-diffused region for drain region fabrication) that is provided to extend around the source formation region Z 1 of rectangular shape with a prespecified distance thereto.

A method of manufacturing the up-drain type power MOSFET will now be described with reference to FIGS. 71A–71B to 75A–B along with FIG. 65 below.

Figure 71A:
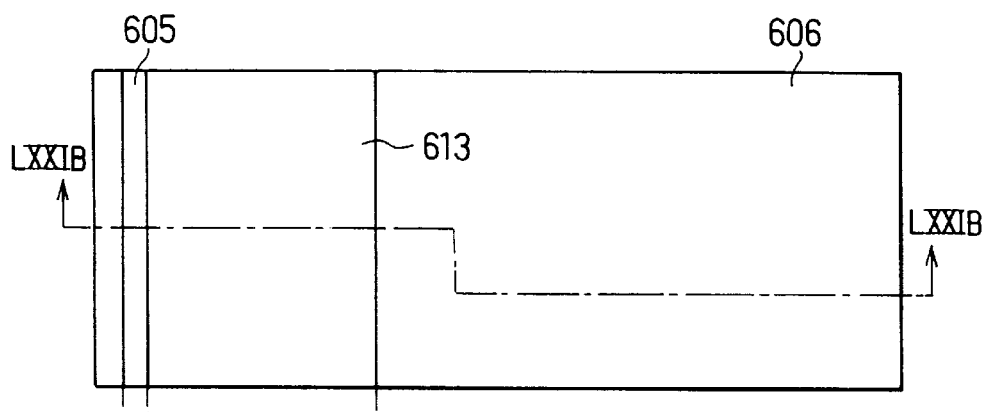
FIGS. 71A, 72A, 73A, 74A and 75A illustrate in plan view some of the major steps in the manufacture of a DMOSFET.
Figure 71B:
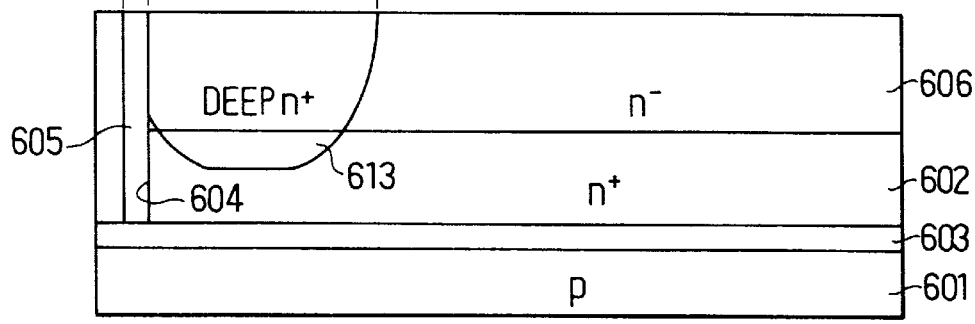

Firstly, as shown in FIGS. 71A and 71B, prepare an SOI substrate; and form therein a trench (groove) 604. Then, fabricate an oxide film 605 on sidewalls of the trench (groove) 604, which is then buried with polysilicon. Thereafter, perform ion implantation and thermal diffusion at a dose of $7\times10^{15}$ cm⁻² under 100 KeV at 1170° C. for 10 hours, thus forming a deep n⁺-type region 613. This thermal processing is done at high temperatures for a time period long enough to permit sufficient overlapping with its underlying n⁺-type buried layer 602.

Figure 72A:
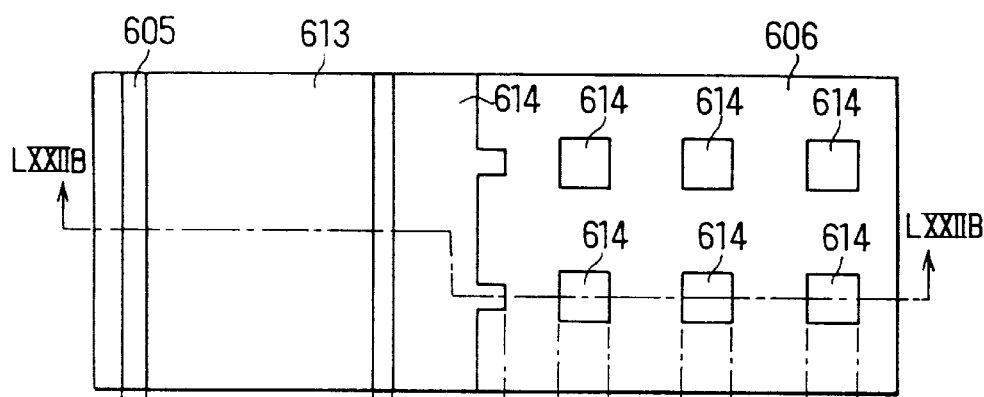
Figure 72B:
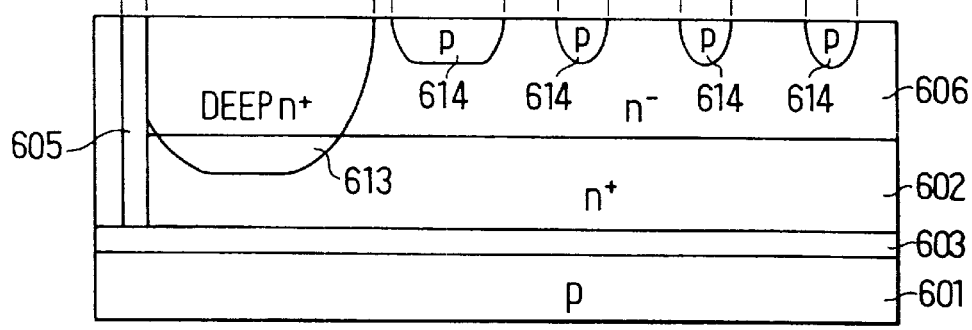

Them as shown in FIGS. 72A–72B, fabricate a p-type region 614 through implantation and thermal diffusion, resulting in a body diode being formed at the center of a source cell and at the periphery of the cell. The condition here is such that boron (B) impurity is doped with a dose of $2\times10^{14}$ cm⁻² at 1170° C. for 70 minutes.

Figure 73A:
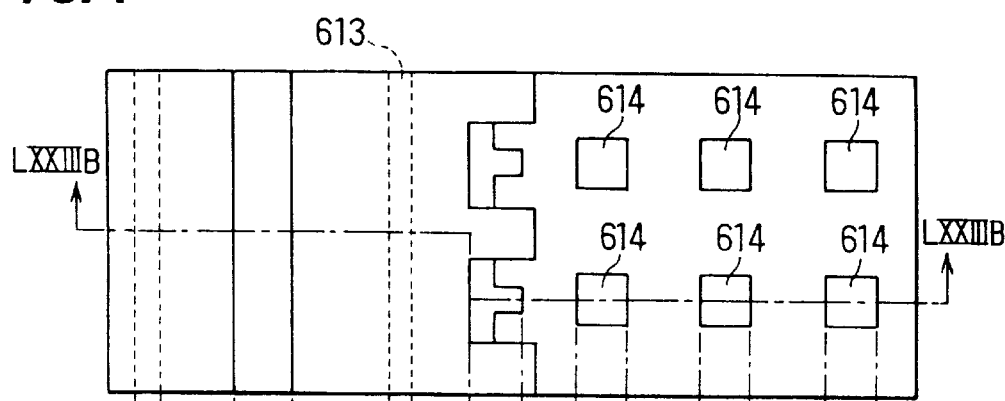
Figure 73B:
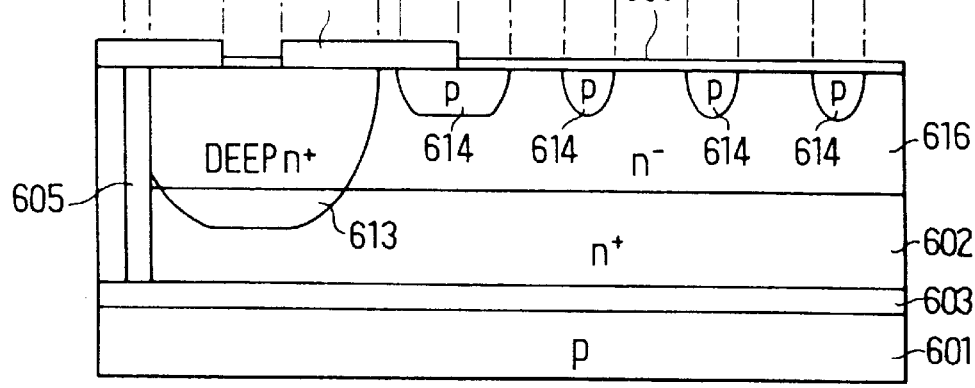

Thereafter, as shown in FIGS. 73A–B, form LOCOS oxide film 607 and gate oxide film 608. Here, the LOCOS oxide film 607 is formed by thermal oxidation in an oxygen gas environment with a patterned SiN film used as a mask therefor, to a thickness of approximately 600 nm.

Figure 74A:
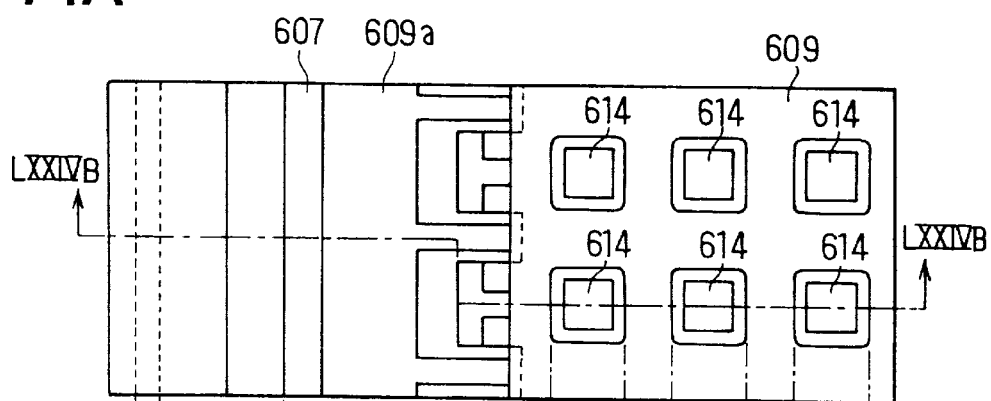
Figure 74B:
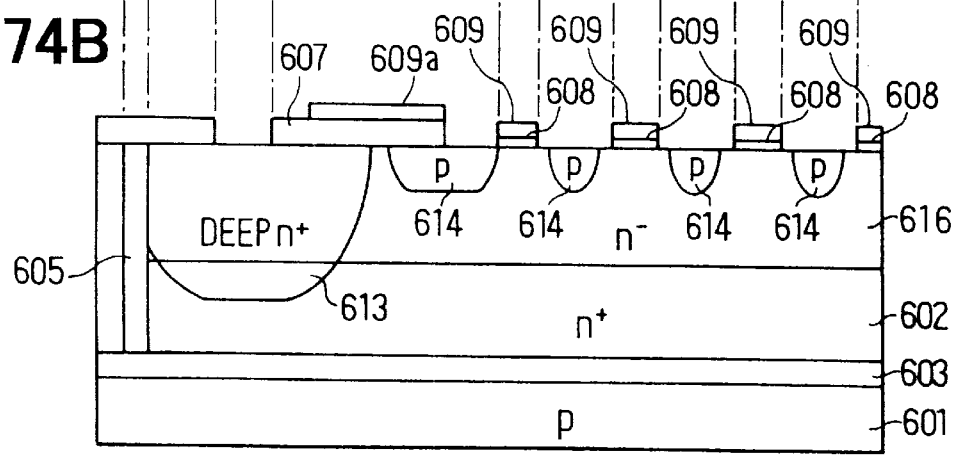

Then, as shown in FIGS. 74A–B, deposit a polysilicon film to a thickness of about 300 nm, which is patterned to form a polysilicon gate electrode 609.

Figure 75A:
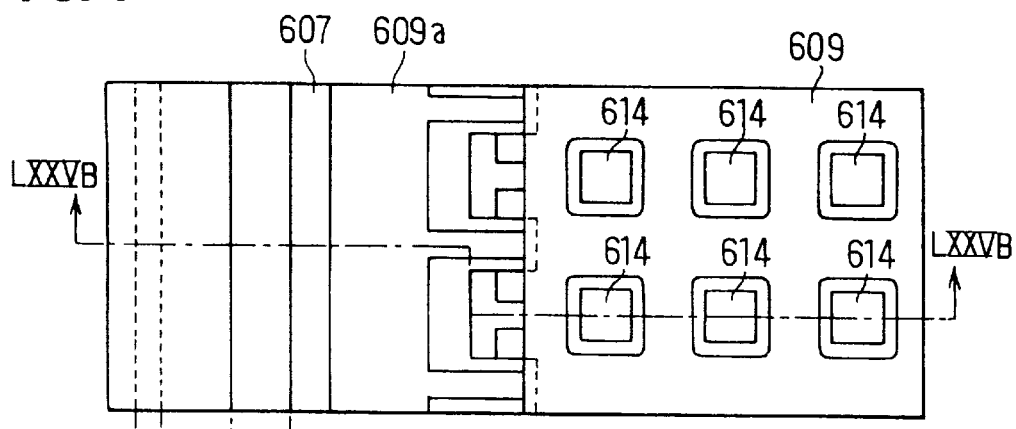
Figure 75B:
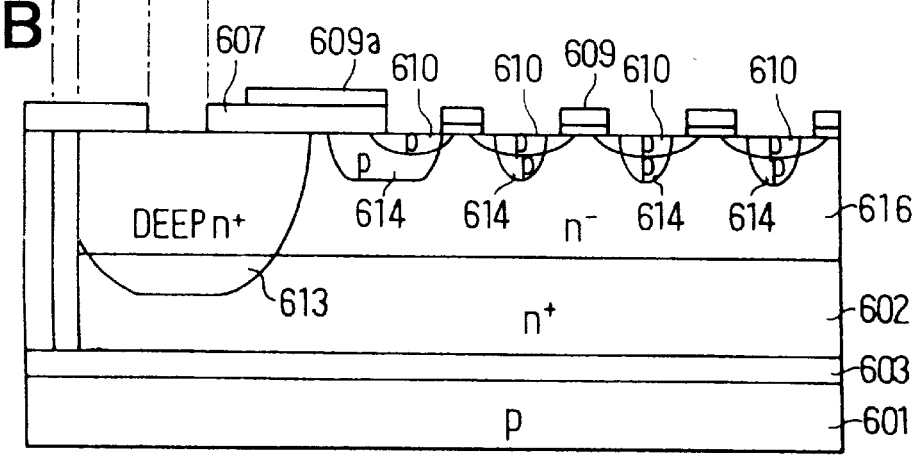

Next, as shown in FIGS. 75A–75B, perform implantation of boron (B) impurity at a dose of $5 \times 10^{13}$ cm$^{-2}$ with the polysilicon gate electrode 609 used as a mask and also thermal diffusion at 1050° C. for 7 hours, thus forming a p-type base region 610.

Further, as shown in FIGS. 65–66, perform implantation of arsenic (As) at a dose of $5 \times 10^{15}$ cm$^{-2}$ and boron (B) at $5 \times 10^{15}$ cm$^{-2}$ to thereby form an n$^+$ type source region 611 and p$^+$ type contact region 612.

Subsequently, as shown in FIG. 64, deposit BPSG film 615, about 700 nm thick, and then perform reflow processing at 950° C. for 20 minutes. Thereafter, form contact holes 616, 618; then, form aluminum layers 617, 169 by sputtering to a thickness of 1 $\mu$m. Further, perform patterning and sintering processes at 450° C.

Next, form an interlayer dielectric film (TEOS) 621. Then, after having formed via holes 623, disposed the second aluminum layer 522, which is then subject to patterning. Deposit thereon a passivation film (SiN) film 624 to a thickness of 1.6 $\mu$m, which is then patterned and annealed at 450° C.

Through the process steps above, the intended up-drain type power MOSFET is completed.

An operation of the up-drain DMOSFET with the above arrangement will be set forth below.

Upon turning on of the transistor due to application of a gate voltage thereto, a drain current rushes to flow, beneath the silicon oxide film 608 for use as the gate oxide film, from a drain terminal toward a source terminal along a path shown by "Lon " in FIG. 66.

Alternatively, upon applying of a surge voltage between the source and drain, a pn junction of drain and source breaks down (avalanche breakdown); in this case, a surge current behaves to flow from the drain electrode 619 through deep n$^+$ region 613 and n- region 609 plus p source regions 614, 610 toward source electrode 617 as indicated by flow path Ls in FIG. 66.

In this event, due to the fact that the LOCOS oxide film 607 is formed at a specified location from which the gate is externally pulled out of a source cell C$_{source}$ with the polysilicon layer 609a for use as gate lead material being disposed over the film 607, the surge current from the drain electrode 619 flows from the drain electrode 619 to reach an outermost source cell C$_{source}$ nearest thereto—very importantly, this current hardly flows through certain part lying immediately beneath the gate oxide film 608 of reduced thickness. For this reason, the gate oxide film 608 is free from risks of destructibility due to a potential drop at p region 614.

Generally, due to the necessity of preventing operation of a parasitic MOS transistor at a field section, the LOCOS oxide film 607 is designed to measure 500 nm or greater in thickness whereas the power MOSFET's gate oxide film 608 is set at 100 nm or less in thickness for achievement of drivability under CMOS power supply (about 5 volts).

In this embodiment also, since the source cell C$_{source}$ nearest to the drain is designed so that the p region 614 is elongated to underlie LOCOS oxide film 607 as shown in FIG. 66, the base has no interruptions when compared to prior known structures with polysilicon used as a mask, thereby causing any surge current to hardly enter or "invade" internal cells by way of n$^-$ region 606 between cells, which in turn makes it possible to prevent destruction of such internal cells.

Furthermore, as the n$^+$ source region 611 of the outermost source cell C$_{source}$ is partially removed at its drain side portion, it is possible even when a surge current flows in the source to prevent operation of a parasitic npn transistor formed of the source cell C$_{source}$'s p-base region 610 and n$^+$ source region 611, thus further improving the surge withstand rating.

In addition, with the aluminum lead wiring scheme of this embodiment, as shown in FIGS. 67–69, it is possible to suppress increase in aluminum lead resistivity due to the layout with source/drain lead pads Ps, Pd of a power MOSFET—this is often used in hybrid ICs because of its increased wire bondability—being offset in position toward one side of a chip concerned, resulting in achievement of an ability to reduce the power MOSFET turn-on resistance when compared to prior art simple aluminum layout schemes. Additionally the aluminum resistance when looking at from each source cell C$_{source}$ is made uniform in value, which in turn makes it possible to make uniform distribution of surge current among respective cells, resulting in improvement in surge withstand rating.

In this respect, more precisely, in ordinary cases where the second-layered aluminum leads are formed in the manufacture of silicon Ics, the underlying first-layered aluminum leads are formed thinner while the second-layered aluminum leads are formed thicker in order to prevent unwanted cut-off or "open-circuiting" at sharp high-angle stair-step like corrugated portions in the second-layered aluminum leads. For use in LSIs, the first-layered aluminum is about 0.5 $\mu$m in thickness whereas the second-layered aluminum is about 1.0 $\mu$m thick. Thus, the first-layered aluminum leads are about two times greater in electrical resistivity than the second-layered aluminum leads. Accordingly, lead wiring scheme used might directly affect the resultant DMOS turn-on resistance whenever such LSI-use thin aluminum leads are used to form power MOS transistor's on-chip leads-namely, when in a hybrid IC device with BiCMOS and DMOS transistors integrated together on the same chip DMOS transistors are disposed at the periphery of the chip with bonding pads being positionally offset toward one side thereof. This requires use of specific layout design scheme that permits minimization of resultant lead resistivity. To this end, it should be required that the first-layered aluminum leads be covered with the second-layered aluminum leads as much as possible.

Figure 79:
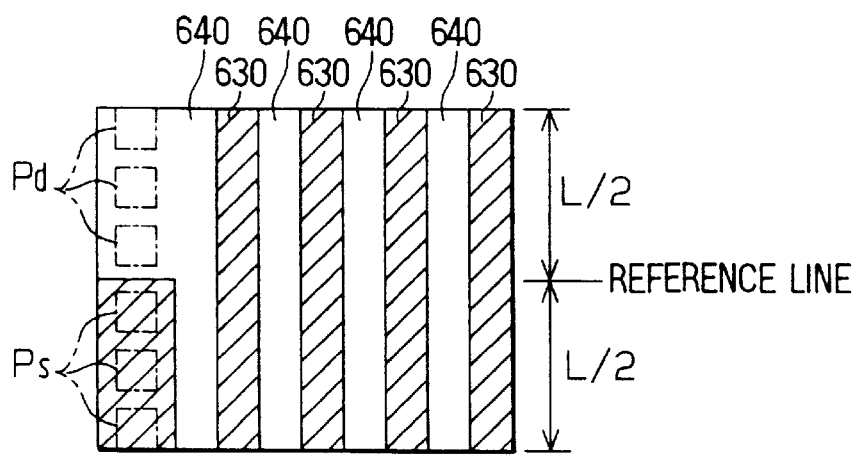
FIGS. 79–81 are diagrams showing corresponding layout patterns of first and second-layered aluminum leads and via holes in a comparative example.
Figure 80:
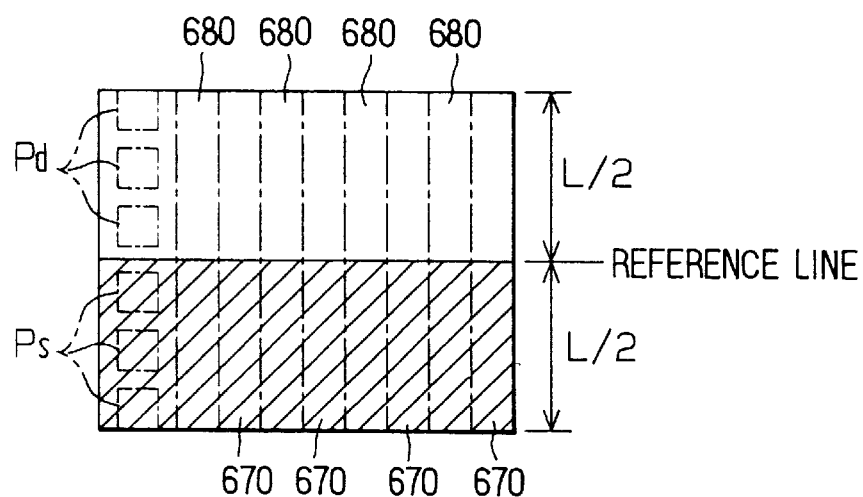
Figure 81:
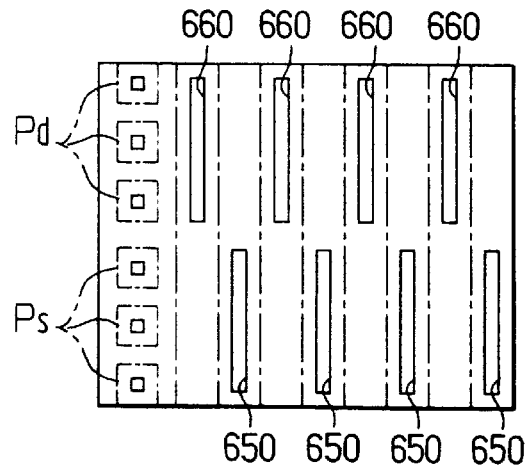

See FIGS. 79–81, which show as a comparative example a layout pattern of the first-layered aluminum leads and a layout pattern of second-layered aluminum leads along with a layout pattern of via holes involved.

In this comparison, the degree of overlap (cover ratio) of the second-layered aluminum leads 670, 680 relative to the first-layered aluminum leads 630, 640 is 50%, which might be associated with a problem as to resistance increase.

On the other hand, with the embodiment shown in FIGS. 67–69, the degree of overlap (cover ratio) of the second-layered aluminum leads relative to the first-layered aluminum leads is 75% in average, resulting in an improvement in turn-on resistance than the comparative example.

Figure 76:
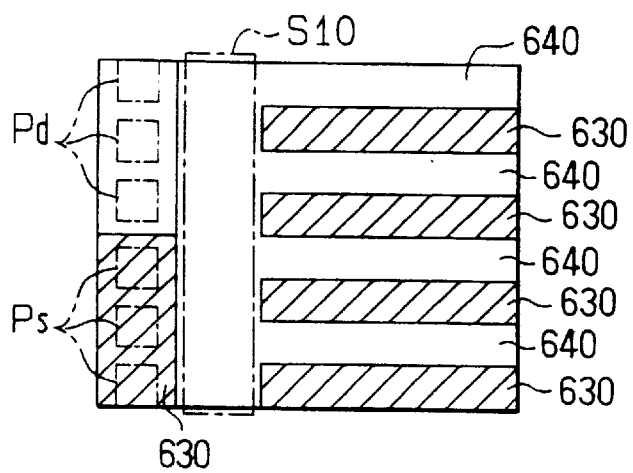
FIGS. 76 to 78 are diagrams showing layout patterns of first-layered aluminum leads and second-layered aluminum leads along with via holes in another example.
Figure 77:
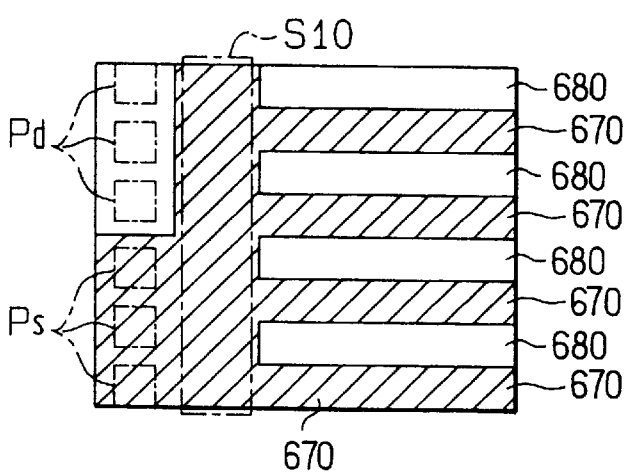
Figure 78:
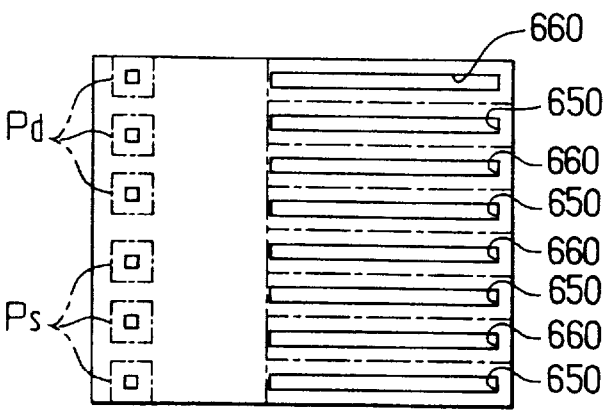

Another layout example in place of that shown in FIGS. 67–69 is shown in FIGS. 76–78. FIG. 76 shows a layout pattern of the first-layered aluminum leads; FIG. 77 shows a layout pattern of second-layered aluminum leads; FIG. 78 shows a layout pattern of via holes.

In this example the degree of overlap (cover ratio) of the second-layered aluminum leads relative to the first-layered aluminum leads is 100%. Note that in this case, unlike the case of FIGS. 67–69, an extra lead wiring area is additionally required at a draw-out section S10 (between pads and DMOS area).

Figure 82:
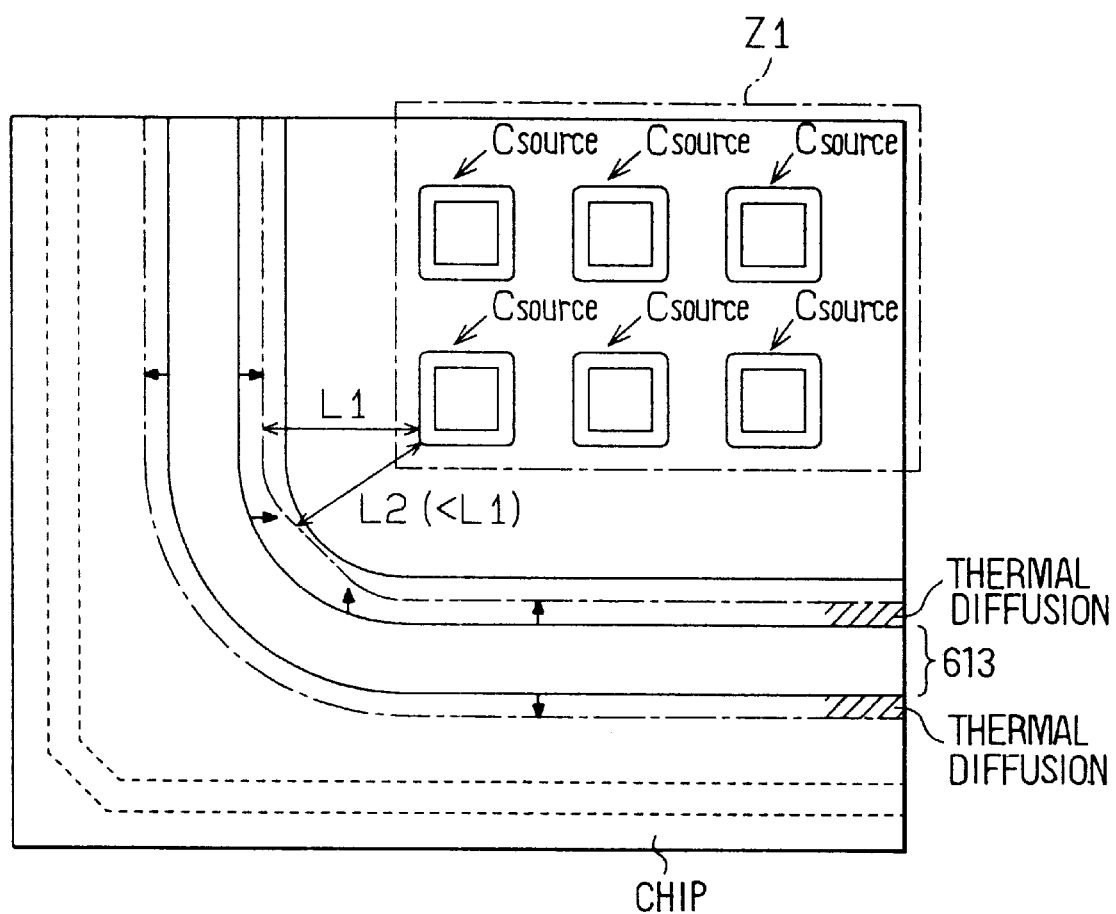
FIG. 82 is a plan view diagram showing a corner edge portion of an IC chip in the comparative example.

In addition, as shown in FIG. 70, the embodiment is designed so that the corner portion of the drain is modified from an arc-like shape to a right angle structure as shown in FIG. 82, thereby precluding reduction in distance between the resulting deep $n^+$-type region and source region otherwise occurring due to lateral outdiffusion of the deep $n^+$-type region 613 at such corner portion, which in turn enables uniform dispersion of a surge current while inhibiting local concentration of such current at or near the corner to thereby permit further improvement in surge withstand rating.

In this respect, more precisely, the comparative example shown in FIG. 82 is arranged so that its deep $n^+$-type region 613 is laid out into the form of circular shape making constant the distance between the deep $n^+$ region 613 and the source.

Hence, in the pattern of the comparative example of FIG. 82, it will possibly happen that the distance between base and deep $n^+$-type region 613 decreases at the edge portion due to out-diffusion of doped impurity from deep $n^+$ region 613 at such edge resulting in a decrease in deep $n^+$ region/base breakdown voltage, which in turn causes the resistance between deep $n^+$ region and base to decrease accordingly leading to risks of surge current concentration. In contrast, with the embodiment of FIG. 70, unlike the comparative example, the deep $n^+$ region 613 at the corner is laid out straightly rather than into a circular shape whereby even upon out-diffusing of the deep $n^+$ region 613 the distance between the base and deep $n^+$ region 613 stays greater than that between other portions, thereby preventing local concentration of a surge current due to decreases in breakdown voltage and in resistance as in the comparative example, which in turn makes it possible to increase the surge withstand rating.

In this way, it is possible to noticeably improve the surge withstand rating of up-drain type power MOSFET used in the hybrid IC device while simultaneously reducing the turn-on resistance of the resultant device structure including on-chip leads also.

As apparent from the foregoing, the illustrative embodiment offers several advantages which follow.

(i) As shown in FIG. 66 the LOCOS oxide film 607 is also disposed at the source formation region Z1 side portion of the dielectric film overlying the silicon substrate 602 between the drain formation region Z2 and source formation region Z1 while letting the dielectric film be greater in thickness than the gate oxide film 608 with the gate lead material (polysilicon layer) 609 being disposed thereon. Hence, although upon application of a surge voltage between the source and drain a surge current can flow from the drain electrode 619 into a certain cell lying nearest to the drain electrode 619 in the source formation region Z1, such surge current flow will no longer lead to destruction of any gate oxide film because of the fact that a thick insulation film (LOCOS oxide film) 607 rather than a thin dielectric film (gate oxide film) 608 is present in a flow path Ls of this surge current.

In brief, it is possible to improve the surge withstand rating by employing a specific gate wiring structure that is arranged so that when outwardly railing the gate lead material 609a toward the outside of a source cell(s) while eliminating formation of gate oxide film 608 along the surge current flow path Ls, part of the thick dielectric film 607 is extended and elongated into inside of such source cell(s) with the gate lead material 609a being disposed thereon.

In other words, in view of the fact that the destructibility of power MOSFET upon application of a surge thereto is due to the gate thereof, the gate destructibility may be eliminated by employing a specific structure that is designed so that any gate oxide film (along with gate polysilicon) is not formed at those locations that can experience surge current flow, which in turn makes it possible to improve the surge withstand rating.

(ii) The dielectric film 607 as disposed at the source formation region Z1 side end is formed of a LOCOS oxide film for use in electrically separating or isolating between the source formation region Z1 and drain formation region Z2 on or over the semiconductor substrate; accordingly, practical applicability becomes preferable.

(iii) In the lateral type insulated-gate transistor with wire bonding pads Ps, Pd being offset in position toward one side of a chip as shown in FIGS. 67–68 and also with those interconnect leads associated with the source and drain being formed across two laminated layers on or over the substrate, the degree of overlap of the second-layered leads 670, 680 relative to the first-layered leads 630, 640 is specifically designed to be greater than 50%. Hence, while in view of the step coverage the second-layered leads 670, 680 are formed thicker than the first-layered leads 630, 640, the second-layered leads 670, 680 are disposed in a wide range thus enabling reduction of the resultant electrical lead resistivity. This makes it possible to reduce the turn-on resistance accordingly.

(iv) As shown in FIG. 70, linear crossing or intersection is provided at a corner edge portion as a structure for elongate extension of the impurity diffusion region (deep $n^+$ region) 613 used for drain region fabrication. Hence, even where the impurity diffusion region 613 can expand due to thermal out-diffusion of its doped impurity at such corner, any decrease in distance between the drain and source at the corner will no longer occur at the corner because of the linear intersection of impurity diffusion region 613 whereby local concentration of a surge current is precluded at the corner so that the current may be dispersed uniformly, which in turn enables improvement in surge withstand rating.

Although in the discussion above the insulated-gate transistor is formed of a MOSFET, the inventive teachings as disclosed herein may also be applied to IGBTs. If this is the case, an IGBT structure is similar to the above-noted MOSFET device structure with the $n^+$ regions 602, 613 of FIG. 66 being replaced with $p^+$ regions and also with the terminal names "drain" and "source" being changed to collector and emitter respectively.

Eighth Embodiment

Figure 83:
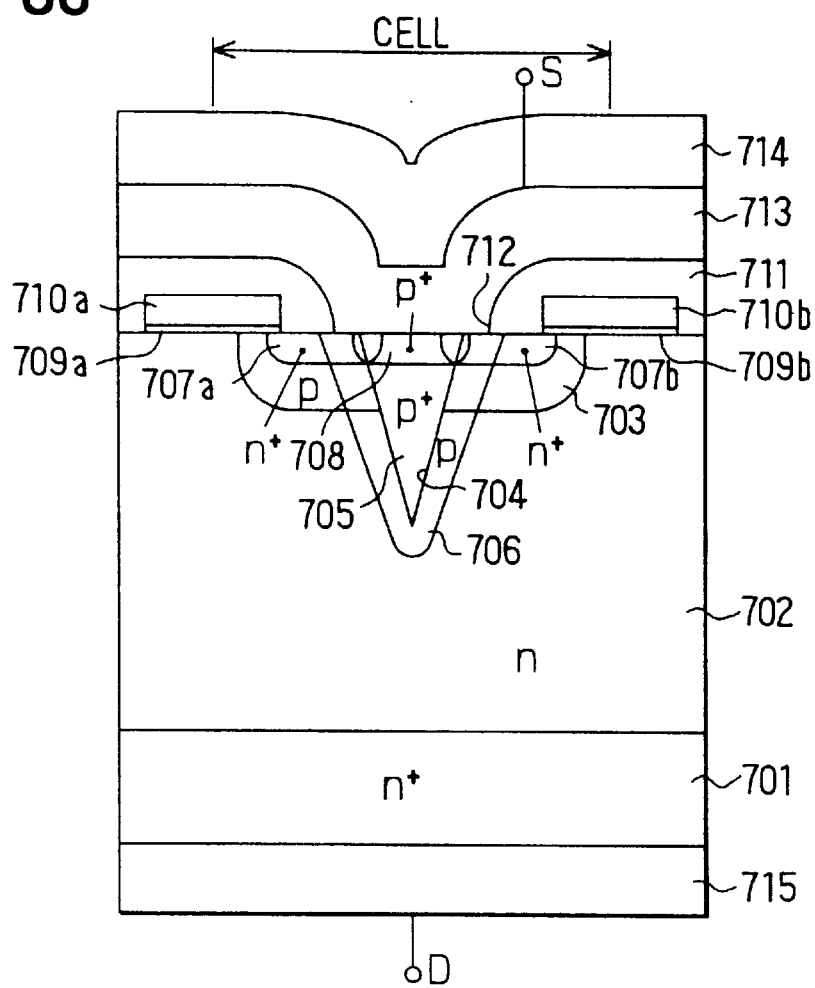
FIG. 83 depicts a sectional view of a longitudinal type MOSFET also embodying the invention.

Referring to FIG. 83, there is shown a vertical type n-channel MOSFET in accordance with an eighth embodiment of the invention.

The NMOSFET has an $n^+$ type silicon substrate 701 as its semiconductor substrate, in which an n-type epitaxial layer 702 is formed as a semiconductor layer of first conductivity type. This n-type epitaxial layer 702 has its surface portion in which a p-type well region 703 (channel formation region of second conductivity type) is formed to have a predetermined depth. In addition a V-shaped groove 704 is formed at the p-well channel region 703 in the surface of n-type epitaxial layer 702 in such a manner that this groove 704 is opened to the surface of p-well channel region 703. The V-like groove 704 penetrates the p-well channel region 703 to reach epitaxial layer 702. The groove 704 may be designed to have a planar shape of circle, polygon, or any other shapes.

A boron-doped polysilicon layer 705 is filled within the V-like groove 704 to have its upper surface that is flush with an upper surface of n-type epitaxial layer 702.

A p-type body region 706 for use in fabricating a body diode is formed at a portion constituting a sidewall of V-like groove 704 in the n-type epitaxial layer 702. The p-type body region 706 uses, as its impurity, boron (B) as supplied from the boron-doped polysilicon layer 705. This p-type body region 706 is deeper than p-well channel region 703. In addition, n$^+$-type source regions 707a, 707b are formed as impurity diffusion layers of first conductivity type in the surface of p-well channel region 703, and a p$^+$-type body region 708 is also formed therein.

Polysilicon gate electrodes 710a, 710b are formed over the p-well channel region 703 with gate oxide films 709a, 709b for use as gate insulation films being sandwiched therebetween. The polysilicon gate electrodes 710a, 710b are covered with a BPSG film 711. A source electrode (wire lead) 713 made of aluminum is disposed on this BPSG film 711 and is contacted via contact hole 712 with n$^+$-type source regions 707a, 707b and p$^+$-type body region 708. An SiN film 714 is formed as a passivation film on the source electrode 713. A drain electrode 715 made of Ti/Ni/Au is formed on the bottom surface of n$^+$-type silicon substrate 701.

In the case of p-channel MOSFET, the layers of FIG. 83 are modified so that the "p" and "n" conductivity types are interchanged with each other while employing a p$^+$-type substrate in place of the n$^+$ substrate.

A manufacturing method of the vertical type NMOSFET of FIG. 83 will now be explained with reference to FIGS. 84 through 90.

Figure 84:
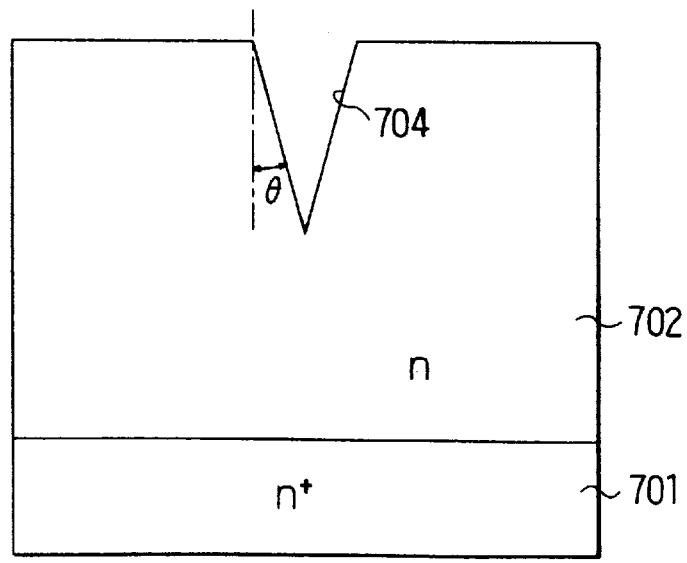
FIGS. 84–90 illustrate in cross-section some of the major steps in the manufacture of the MOSFET.

First, as shown in FIG. 84, prepare an n$^+$-type silicon substrate 710 (use p$^+$ substrate for p-channel MOSFET (PMOSFET) with "p" and "n" types being changed with each other), on which an n-type epitaxial layer 702 is grown. Then, coat a photoresist film on the n-type epitaxial layer 702 for patterning to fabricate a body diode.

Further, with the resist film used as a mask, dry-etch the n-type epitaxial layer 702 to thereby form a V-like groove 704 at the center of a cell. More specifically the V-like groove 704 is formed by anisotropic etch techniques such as reactive ion etching (RIE). Etching conditions are designed to ensure that this groove 704 has a shape along its depth whose taper angle θ becomes greater than zero degrees, thereby resembling the letter "V" in profile. The depth of V-like groove 704 falls within a range of about 1 to 5 μm.

Thereafter, perform isotropic etching such as chemical dry etching (CDE) for recovery of any possible etch damages; then, effectuate thermal processing at 1000° C. or higher. In other words, a damaged layer (region containing an increased number of crystal defects) formed on sidewalls during etching is removed away by isotropic etching such as CDE while recovering such crystal defects through annealing. Only either one of CDE and anneal processes may be done where necessary.

Figure 85:
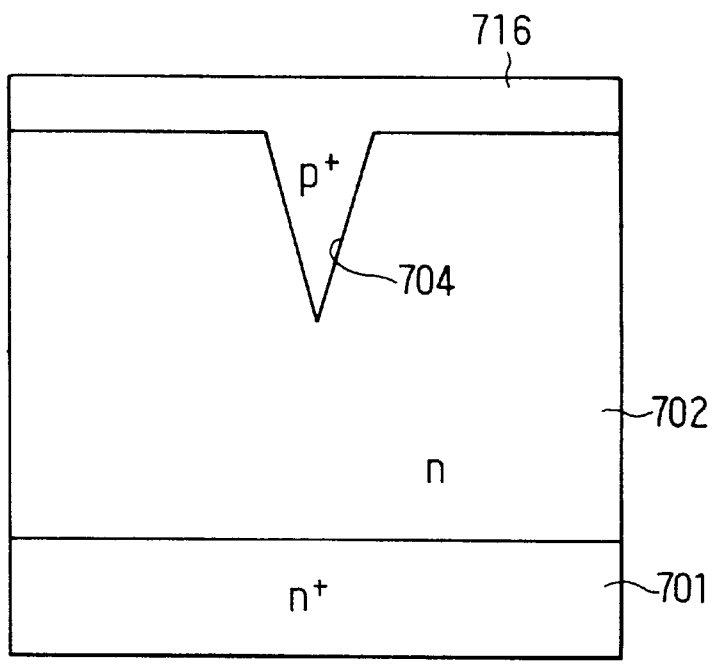

Subsequently, as shown in FIG. 85, deposit on the n-type epitaxial layer 702 a boron-doped polysilicon layer 716 which completely buries and fills inside of the V-like groove 704. Here, a doping amount of boron (B) in the boron-doped polysilicon layer 716 is about $10^{10}$ to $10^{21}$ cm$^{-3}$. Additionally in the case of a PMOSFET, a polysilicon layer is alternatively used with phosphorus (P) or arsenic (As) doped therein.

Figure 86:
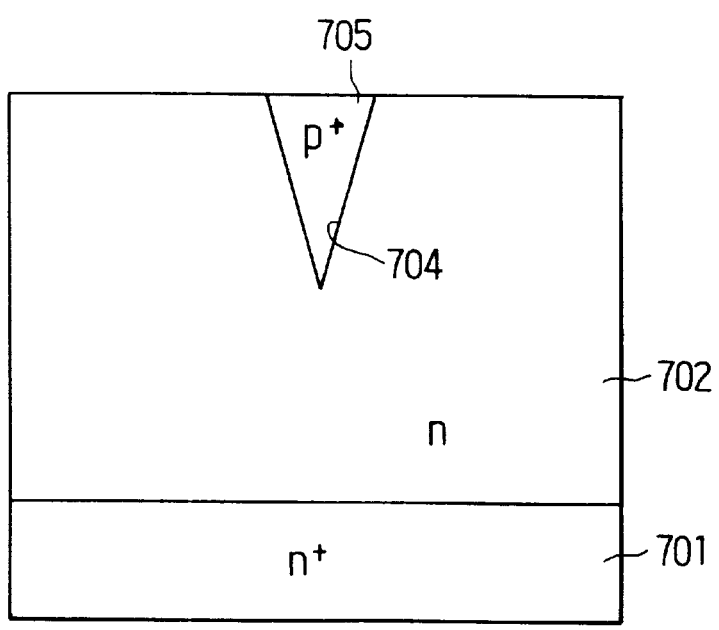

Then, as shown in FIG. 86, let the boron-doped polysilicon layer 716 be subject at its top surface to chemical mechanical polishing (CMP) treatment to remove certain portions of the boron-doped polysilicon layer 716 other than its buried part filled within the V-like groove 704. Note that dry etching techniques are used to remove such unnecessary portions of the boron-doped polysilicon layer 716; if this is the case, special care should be taken to retain the surface flatness at the upper opening part of the groove 704. Through the process steps above, a boron-doped polysilicon layer 705 is disposed within the V-like groove 704.

Figure 92A:
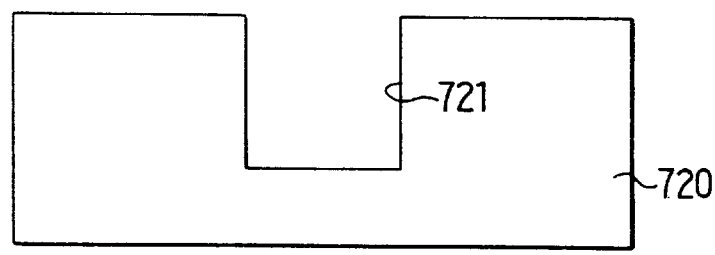
FIGS. 92A to 92C depict in cross-section some of the major steps in the manufacture of a device for comparison.

Note here that as the groove 704's taper angle θ (see FIG. 84) is greater than zero degrees, it is possible to prevent fabrication of any unwanted vacant space or cavity during filling inside of the groove 704 with the boron-doped polysilicon layer 705. More specifically, in the event that a groove 721 with rectangular profile is formed in a substrate 720 at an angle θ=0° as shown in FIG. 92A, after startup of deposition of a polysilicon layer 722 shown in FIG. 92B, a cavity 723 can be formed as shown in FIG. 92C. In contrast, with the embodiment, use of the V-like groove 704 precludes formation of any cavity therein.

Figure 87:
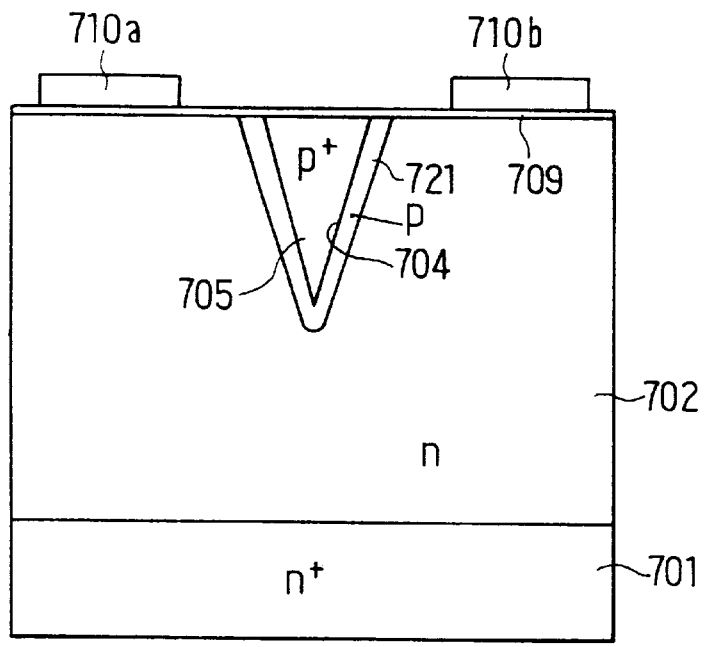

Thereafter, fabricate a dummy oxide film on the n-type epitaxial layer 702 of FIG. 86. After removal through etching, form a gate oxide film 709 to a thickness of about 10 to 100 nm as shown in FIG. 87. Then, deposit a gate electrode formation polysilicon film to a thickness of about 100 to 1000 nm; further perform etching with use of a resist mask. Whereby, polysilicon gate electrodes 710a, 710b are formed.

Figure 88:
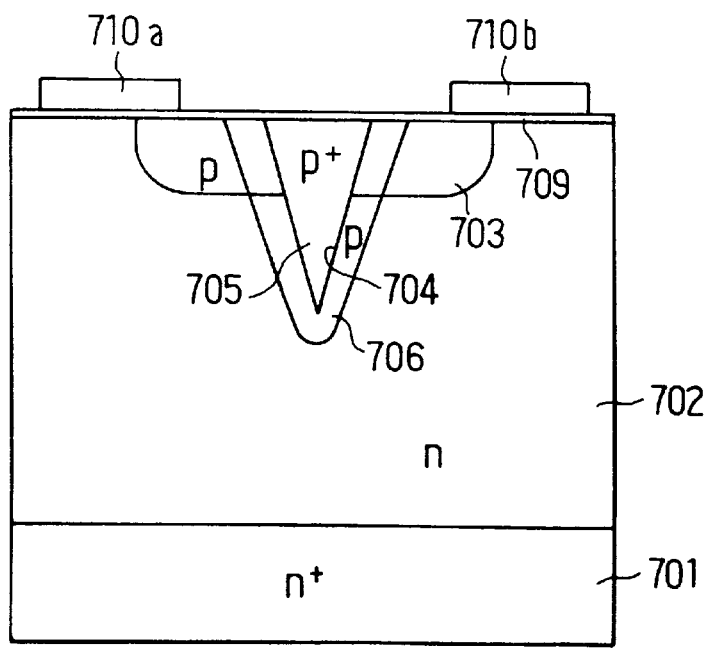

Subsequently, as shown in FIG. 88, let the n-type epitaxial layer 702 be doped by implantation with boron (B) impurity at about $10^{12}$ to $10^{14}$ cm$^{-2}$ for fabrication of a p-well channel region 703; further, perform the so-called "drive-in" process. During this drive-in, boron is out-diffused or "transpired" from the boron-doped polysilicon layer 705 buried within the groove 704, thus forming a p-type body region 706 with increased impurity concentration extending along sidewalls of the V-like groove 704. Note that in the case of a PMOSFET, phosphorus (P) or arsenic (As) or else may be doped for fabrication of an n-type well region.

Figure 89:
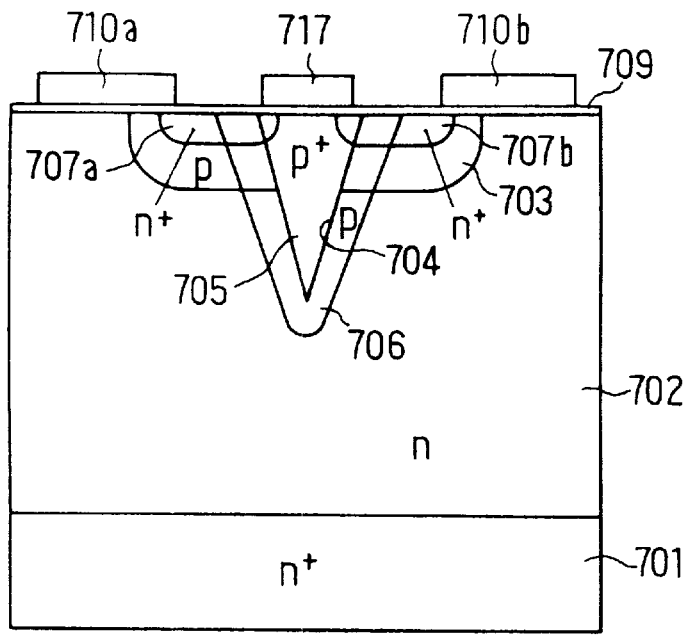

Next, as shown in FIG. 89, implant arsenic (As) impurity with a resist mask 717 used with respect to the n-type epitaxial layer 702, forming n$^+$-type source regions 707a, 707b. Implant boron (B) in the case of a PMOSFET.

Figure 90:
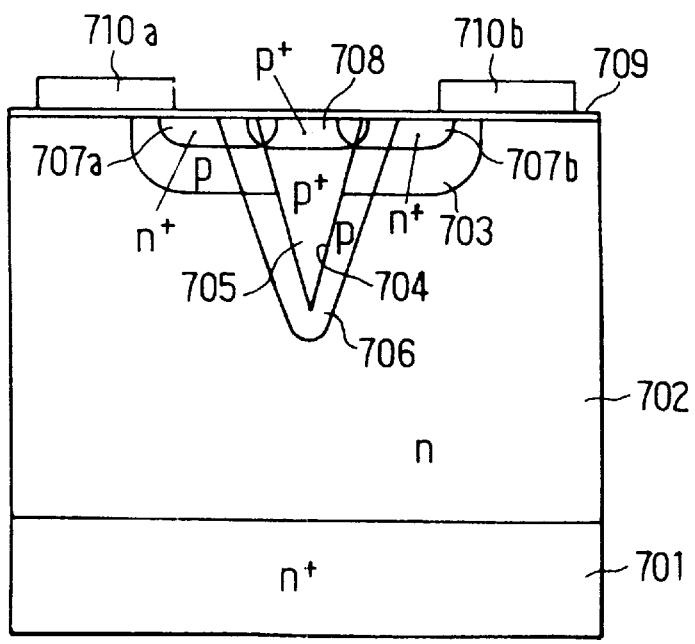

Further, as shown in FIG. 90, let the n-type epitaxial layer 702 be doped with boron (B) by use of a resist mask to form a p$^+$ body region 708 for use in taking a body potential. Arsenic (As) is alternatively implanted in the case of PMOSFET.

Here, for simplification of the processes required, source implantation of FIG. 89 may be done without use of any masks while eliminating boron implantation step of FIG. 80. In this case the p-type body region 706 is capable of increasing the impurity concentration in its surface whereby the intended implantation of n$^+$-type source regions 707a, 707b may be carried out without use of any masks so that it is expectable to reduce production costs with a decrease in requisite number of photolithography process steps. Note here that in such case, it is required that the doped boron impurity concentration of the polysilicon layer 705 buried in groove 704 be greater than the As concentration at the stage of source implantation.

Next, as shown in FIG. 83, perform thermal oxidation to oxidize surfaces of the polysilicon gate electrodes 710a, 710b. Further, deposit a BPSG film 711, which is then subject to reflow, thus forming a source electrode (aluminum lead) 713 through contact etching. Optionally the source electrode (aluminum lead) 713 may be replaced with a Cu layer with long lifetime and low resistivity. Thereafter, fabricate a passivation film (SiN) 714; then, perform patterning.

Lastly, form on the bottom surface of substrate 701 a drain electrode 715 made of Ti/Ni/Au.

An explanation will next be given of an operation of the vertical NMOSFET thus manufactured, with reference to FIG. 91.

Figure 91:
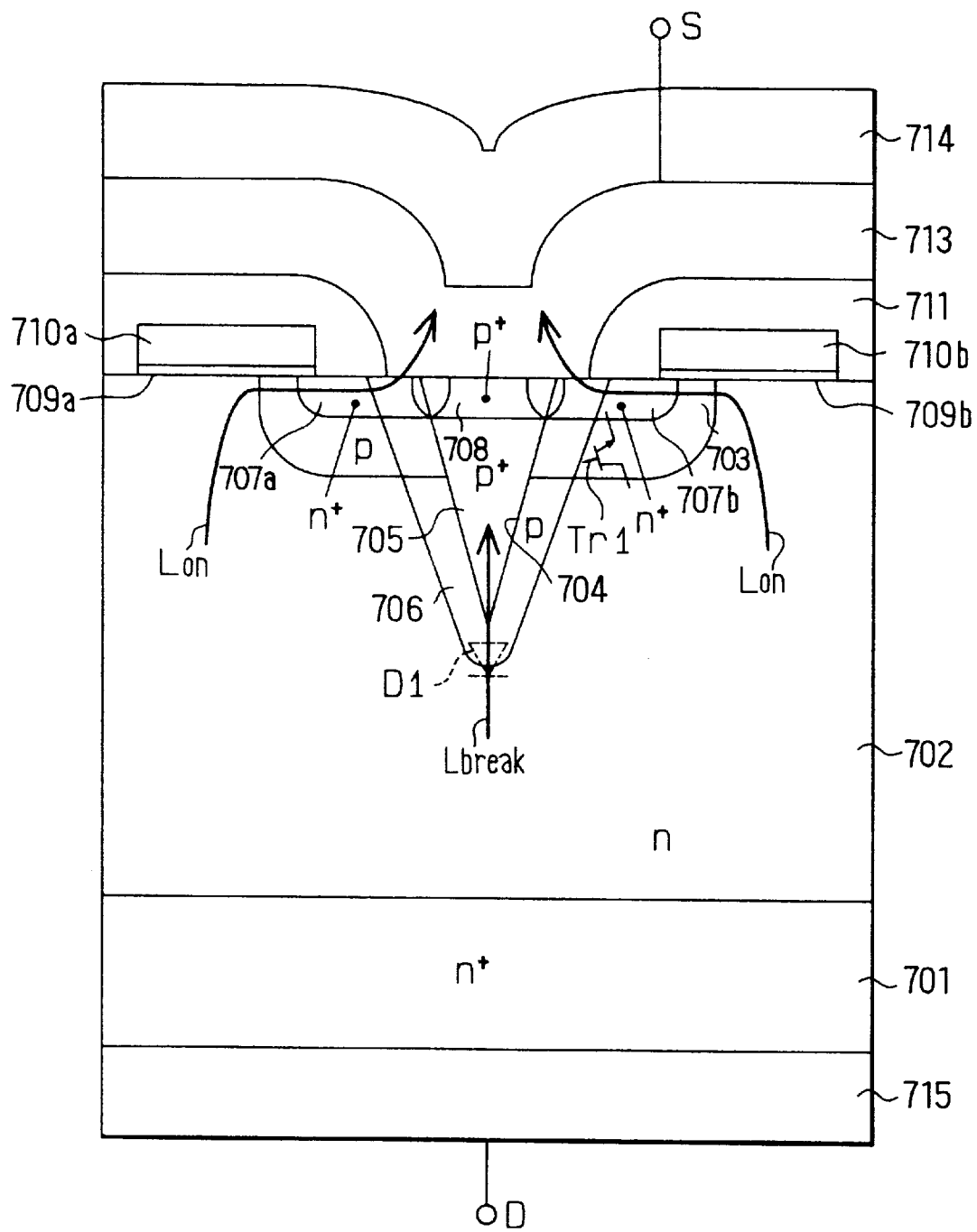
FIG. 91 is a sectional view for explanation of an operation of the embodiment device.

As shown in FIG. 91, the p-type body region 706 that is deeper than the p-well channel region 703 is disposed at sidewalls of the groove 704 with an interface defined between this p-type region 706 and p-well channel region 703, in which a body diode D1 will later be formed.

Upon turning on of the MOSFET, a current flows from its drain to source along a current flow path Lon.

Simultaneously a surge current can rush to flow from the drain via the embedded body diode D1 to source along a current flow path shown by "$L_{break}$" in FIG. 91. Specifically such surge current flows from the drain electrode 715 up to source electrode 713 by way of the n⁺-type silicon substrate 701→n-type epitaxial layer 702→p-type region 706→boron-doped polysilicon layer 705.

Here, since the V-like groove 704 is deeply formed by dry etching, the breakdown voltage of this MOSFET is determinable depending on both the shape (curvature) of a distal end portion of the V-like groove 704 (p-type body region 706) and the impurity concentration of n-type epitaxial layer 702. In brief, when applying a voltage of positive polarity to the drain electrode 715 for reverse-biasing between the drain and source, the resultant electric field is maximized in intensity at the distal end of groove 704 (p-type region 706) having the largest curvature, causing avalanche breakdown to occur firstly at here.

This body diode D1 is less in electrical resistivity due to the fact that the boron-doped polysilicon layer 705 is initially doped with boron (B) to an increased concentration of about $10^{10}$ to $10^{21}$ cm⁻³; for this reason, even in the event that a surge current flows therein due to the presence of an inductive (L) load, any appreciable potential increase will hardly take place at part of the p-well channel region 703. Accordingly, a parasitic npn transistor Tr1 formed of the n⁺ source regions 707a, 707b and p-well channel region 703 plus n-type epitaxial layer 702 will no longer be biased between the base and emitter thereof to thereby guarantee that the parasitic transistor Tr1 is not rendered operative in any way. This makes it possible to increase the surge withstand rating.

Note however that it is required to specifically design the n-type epitaxial layer 702 to have appropriate values of thickness and impurity concentration which prevent avalanche breakdown otherwise occurring due to excessive expansion of a depletion layer to reach the n⁺ silicon substrate 701. Without such settings, the resulting breakdown voltage is undesirably variable with a change or deviation of thickness of n-type epitaxial layer 702.

For the same reason also, it is possible to deeply form the body diode D1 with a narrowed interval, which in turn makes it possible to reduce cell size thereby increasing the cell density while simultaneously reducing the turn-on resistance.

Figure 92B:
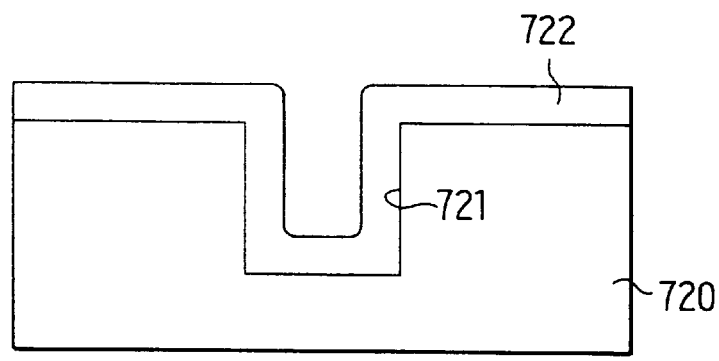
Figure 92C:
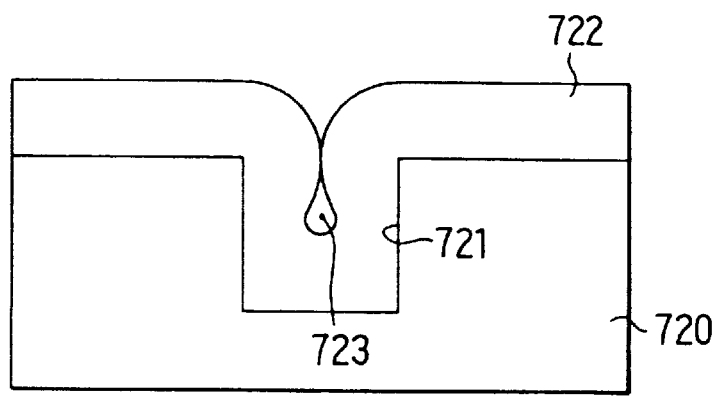

As a specific taper angle θ greater than zero degrees is provided during formation of the trench (groove) 704, any unwanted cavities or voids will hardly appear during burying of the polysilicon layer 705 as has been stated previously in conjunction with FIGS. 92A–92C whereby the intended burying/fulfillment is almost completely achievable so that the body diode D1 will no longer increase in electrical resistivity.

Figure 93:
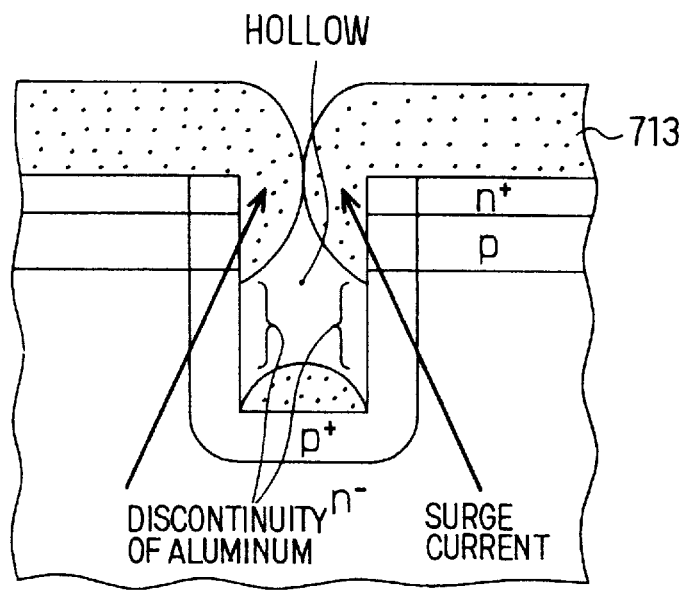
FIGS. 93–94 are diagrams for explanation of an operation.
Figure 94:
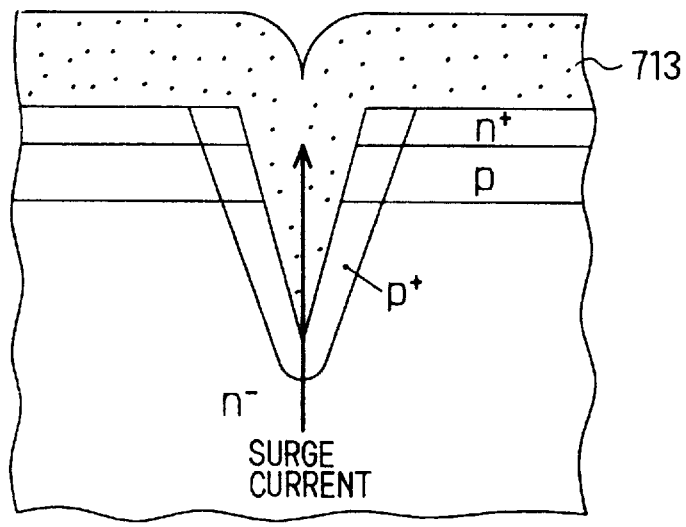

In addition, where a structure (diode shape) having vertical sidewalls as shown in FIG. 93 is employed as the cross-sectional shape of the groove (body diode), effectuation of aluminum sputtering directly for such vertical sidewalls can result in creation of cavities in the resulting groove due to the anisotropy of such sputtering, which often causes unintentional partial interruption or cutoff of an aluminum layer at the groove's bottom surface portion of step-like configuration. Such aluminum cutoff or open-circuiting results in the body diode's distal end failing to be directly coupled to the aluminum source electrode 713, thus inhibiting sufficient flow of a surge current originated from breakdown at the body diode section. Thus, use of such structure having vertical walls makes it difficult to increase the surge withstand rating. In contrast, with the embodiment discussed herein, the body diode is specifically arranged so that its groove's sidewalls are formed into a taper-like shape (at angle θ>0) as shown in FIG. 94, any aluminum layer cutoff (formation of cavity) hardly takes place even during aluminum sputtering with enhanced anisotropy, thereby successfully minimizing or avoiding the risk as to electrical disconnection of the body diode from its associative aluminum layer. Thus, the embodiment shown in FIG. 94 is more preferable than the structure shown in FIG. 93.

In this way, the anti-surge device structure for use with solid-state power devices in the technical field of power ICs for lead drive as built in land vehicle electronics or alternatively discrete power devices is specifically arranged so that fabrication of the p⁺ body layer 706 through dry etching process makes it possible to improve the surge withstand rating relative to static electricity and inductive (L) loads without increasing the MOSFET turn-on resistance and reducing the breakdown voltage thereof.

In addition, whereas prior art approaches using implantation and thermal diffusion methods suffer from undesired enlargement of a p⁺ body region due to lateral expansion of dopants, the embodiment above is arranged to employ a specific dry etch technique with vertical etchability to fabricate p⁺ body region 706 of high impurity concentration thereby enabling formation of the intended body diode D1 low in resistivity and less in size. This in turn makes it possible to accomplish a surge withstand rating-increased power MOSFET without accompanying any penalty as to increase in cell size (without increasing the turn-on resistance).

Some of the features unique to this embodiment are as follows.

(i) For the vertical MOS transistor structure, as shown in FIG. 83, the V-like groove 704 that is opened to the surface of p-well channel region 703 is formed in the surface of n-type epitaxial layer 702 while filling the V-like groove 704 with boron-doped polysilicon layer 705 in contact with source electrode 713 and also forming at certain part of n-type epitaxial layer 702 constituting sidewalls of V-groove 704 the p-type body region 706 for use in forming a body diode in the interface relative to n-type epitaxial layer 702 in such a manner that p-type body region 706 is deeper than p-well channel region 703.

Hence, as shown in FIG. 91, the p-type body region 706 deeper than p-well channel region 703 is disposed at the sidewall part of the V-like groove 704, with this p-type body region 706 and n-type epitaxial layer 702 forming the body diode D1 required. This makes it possible for a surge current if any to flow vertically through this body diode D1 and the boron-doped polysilicon layer 705 filled within V-groove 704.

(ii) A method of manufacturing the vertical type MOS transistor is such that as shown in FIG. 92, V-like groove 704 is defined in a surface of n-type epitaxial layer 702 as has been formed on n⁺ silicon substrate 701; then, as shown in FIG. 86, fill the groove 704 with boron-doped polysilicon layer 705. Further, as shown in FIG. 88, let boron of such polysilicon layer 705 out-diffuse toward sidewalls of V-groove 704 to thereby form p-type body region 706 deeper than p-well channel region 703; next, as shown in FIG. 83, dispose on n-type epitaxial layer 702 a source electrode 713 which is brought into contact with boron-doped polysilicon layer 705.

The vertical type MOS transistor of the above paragraph (i) is thus manufactured.

(iii) As the V-like groove 704 is formed by etching, applicability and utilizability becomes preferable.

(iv) As the groove 704 is formed to have a V-like shape in profile, applicability becomes preferable.

(v) As either one of CDE and anneal techniques is used after formation of the V-like groove 704 for removal of damaged layers and recovery of crystal defects, applicability is preferable.

In addition to the embodiments stated supra, the inventive teachings may also be reduced to practice in a way which follows.

Figure 95:
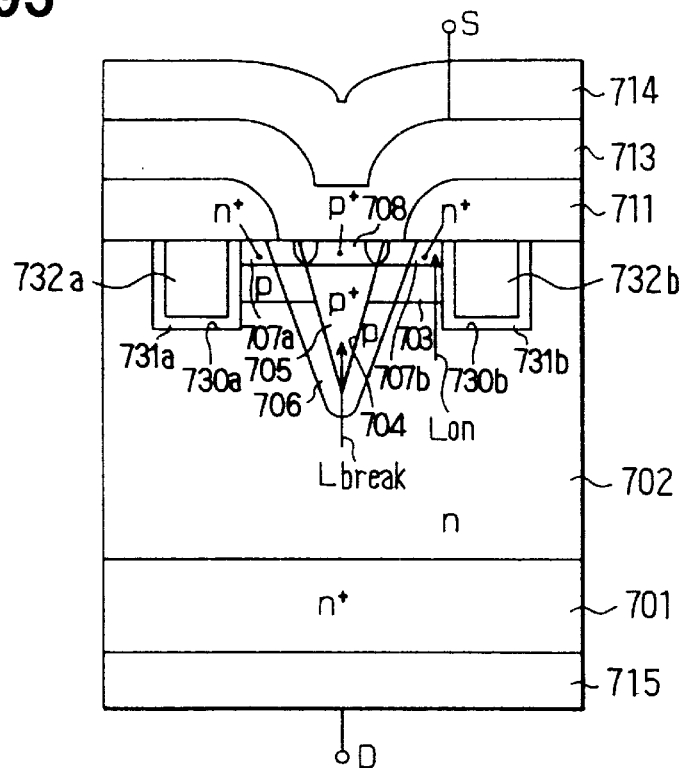
FIGS. 95–99 are diagrams each showing a sectional view of a MOS transistor also embodying the invention.

Although the invention has been set forth in detail in conjunction with planar type DMOS devices, a DMOS device may also be used with its gate formed by a trench as shown in FIG. 95. More specifically, trench grooves 730a, 730b are formed in an n-type epitaxial layer 702 while letting polysilicon gate electrodes 732a, 732b be formed within the trenches 730a, 730b via gate oxide films 731a, 731b, respectively.

Figure 96:
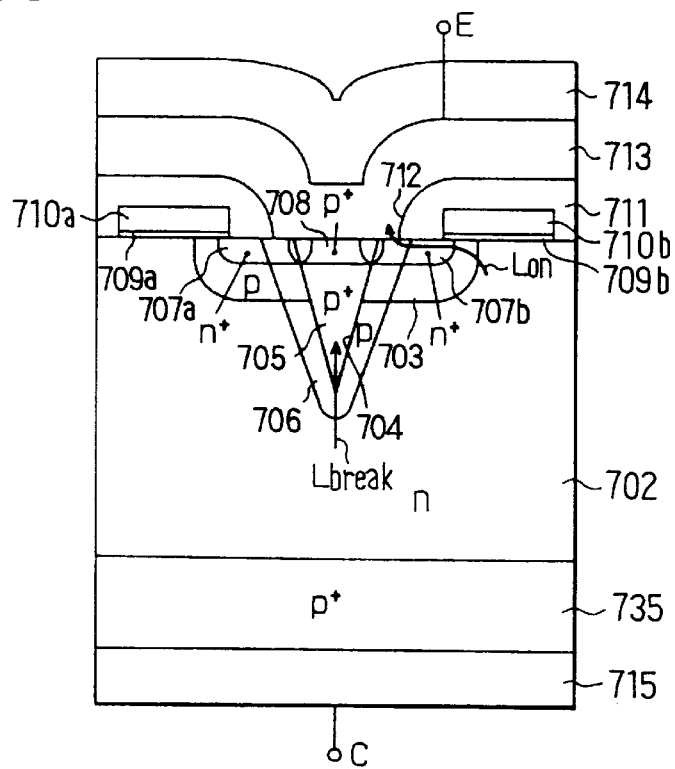

In addition, other than the planar type DMOS devices, an IGBT is also permissible which has its n-type epitaxial layer 702 as formed on p⁺-type substrate 735 as shown in FIG. 96.

Figure 97:
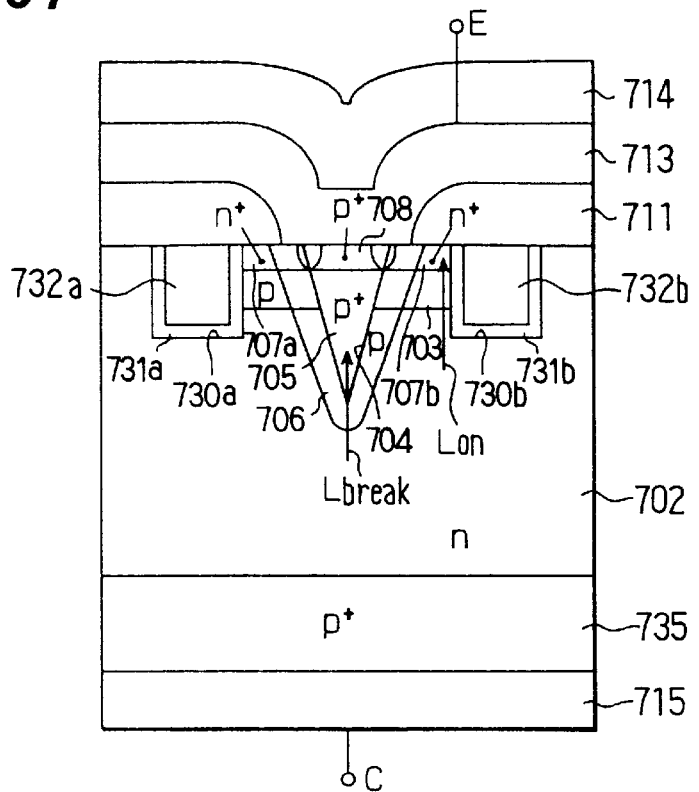

Alternatively, as shown in FIG. 97, a trench IGBT may also be provided, which is arranged so that polysilicon gate electrodes 732a, 732b are formed within trenches 730a, 730b in n-type epitaxial layer 702 via gate oxide films 731a, 731b.

Figure 98:
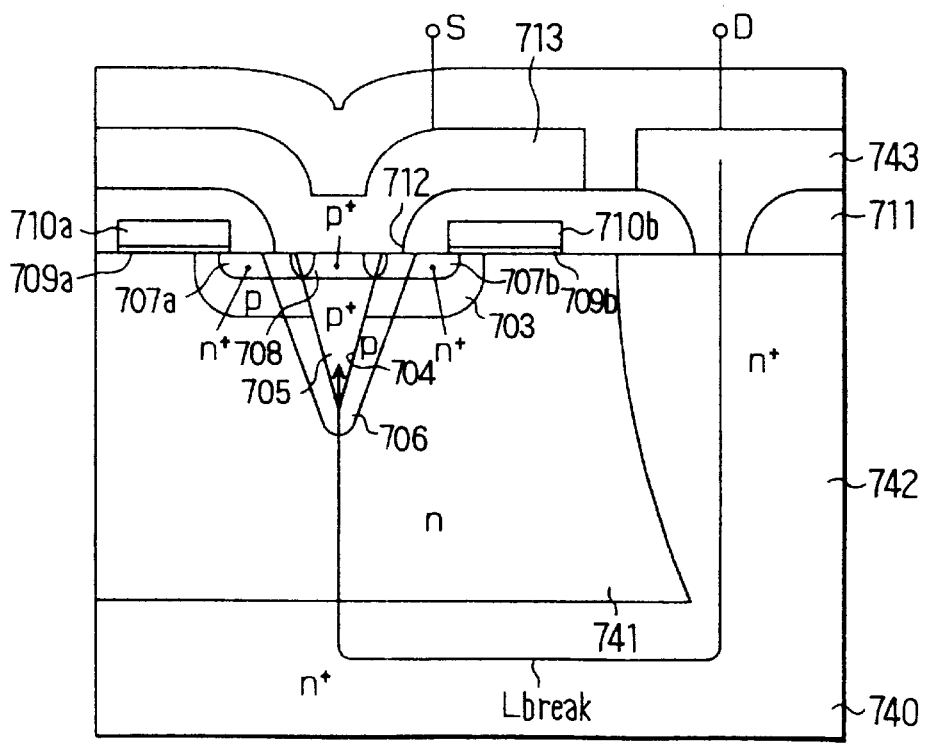

Still alternatively, as shown in FIG. 98, the invention is also applicable to an up-drain type MOSFET with a drain electrode disposed on a surface thereof. More specifically, an n-type epitaxial layer 742 is formed on n⁺-type substrate 740 with drain electrode 743 being disposed on n⁺ region 742 as formed in n-type epitaxial layer 742. This up-drain MOSFET is to be built in power ICs.

Figure 99:
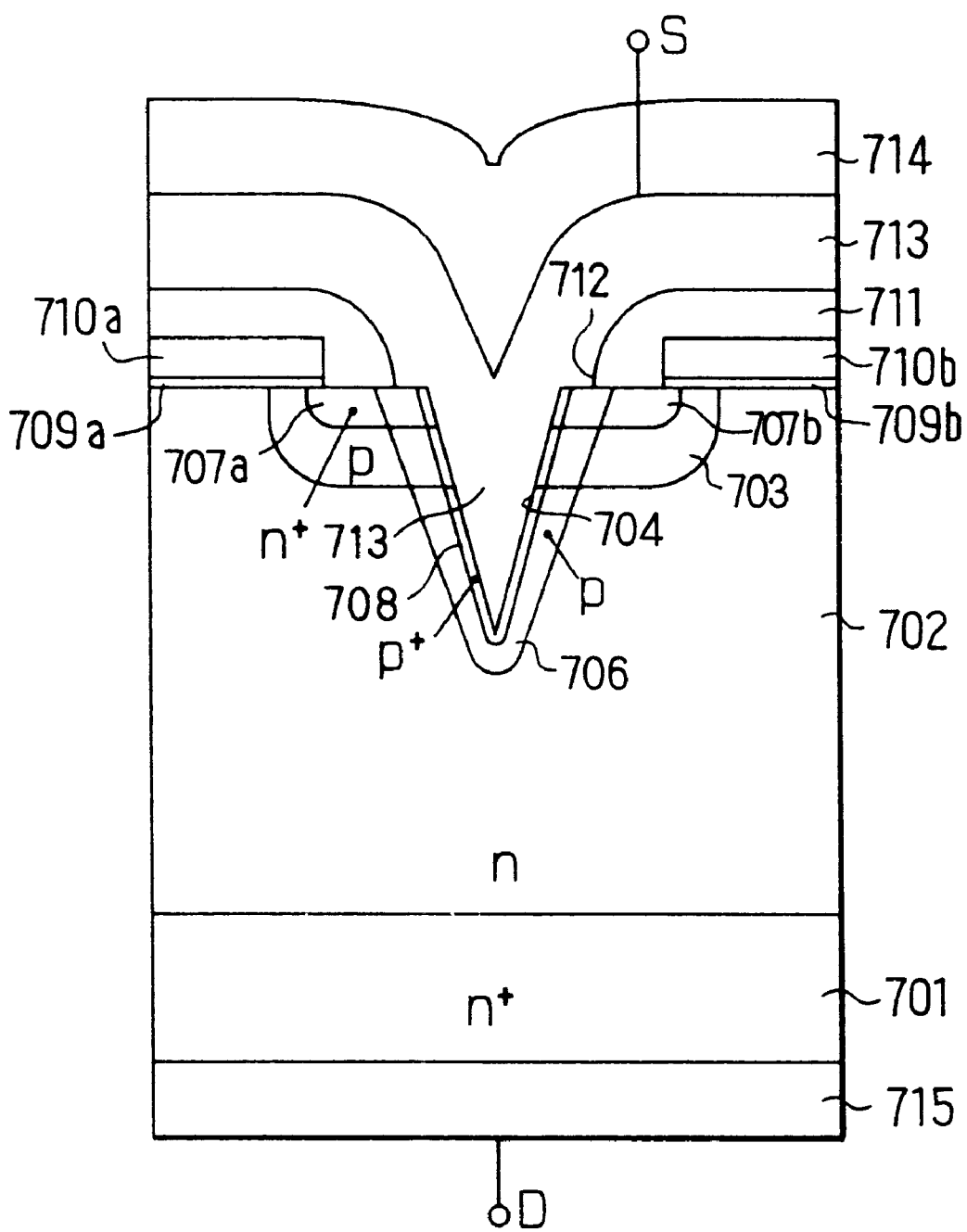
Figure 100:
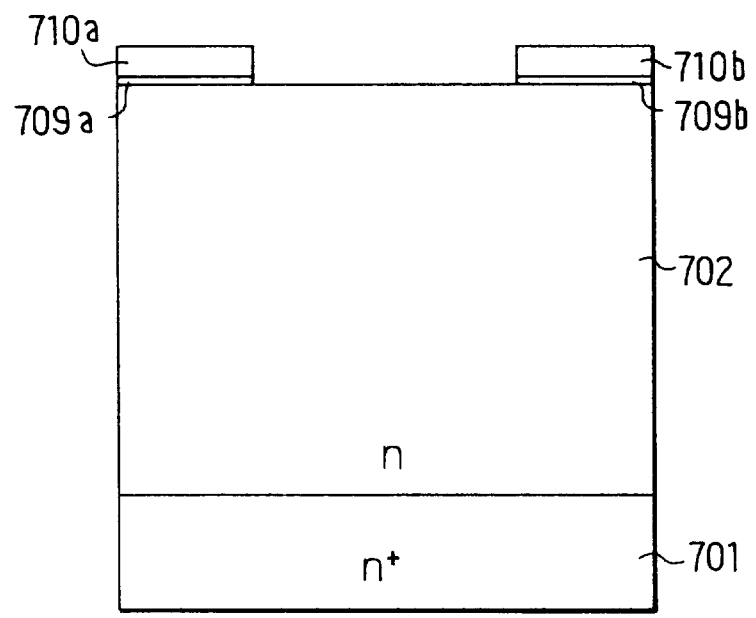
FIGS. 100–105 illustrate in cross-section some of the major steps in the manufacture of a device structure embodying the invention.
Figure 101:
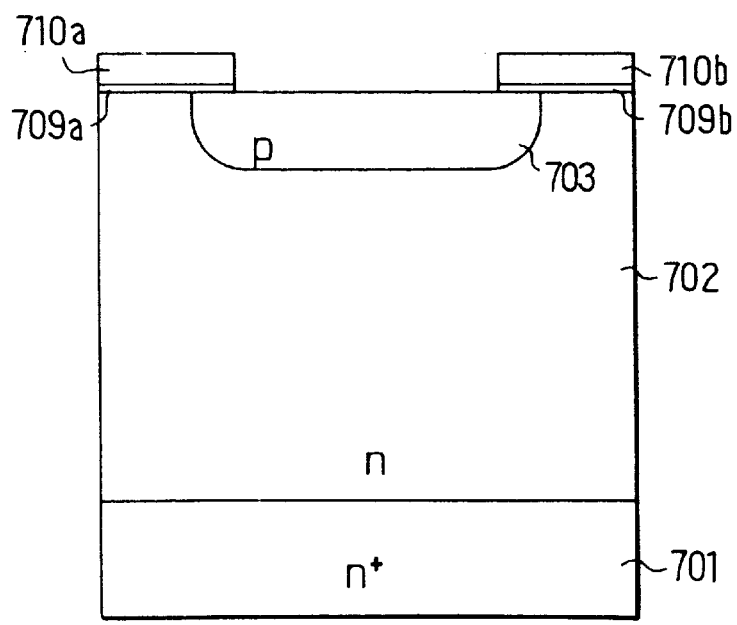
Figure 102:
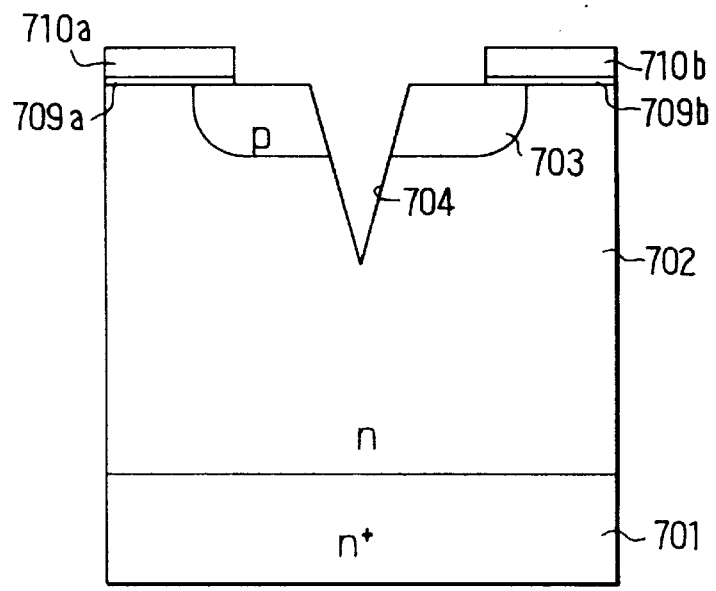
Figure 103:
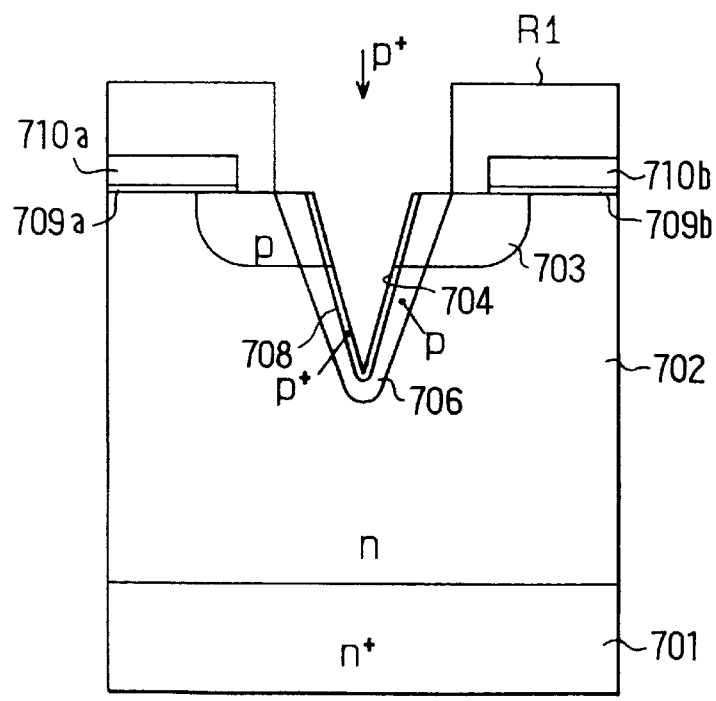
Figure 104:
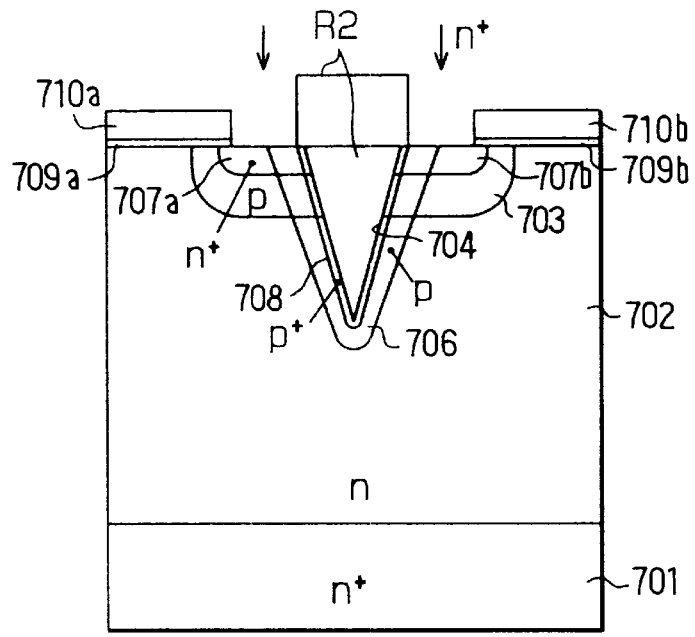
Figure 105:
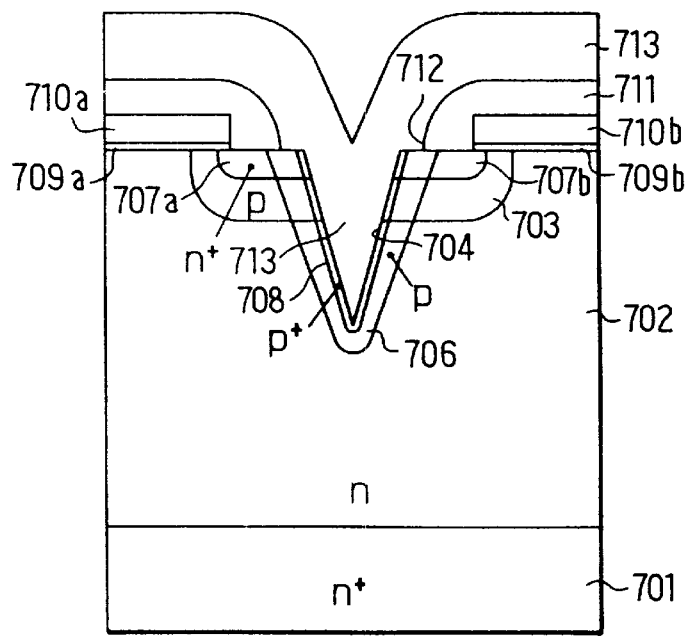

Yet alternatively, as shown in FIG. 99, a device structure is employable which is designed so that an aluminum layer 713 is directly deposited without filling the groove 704 with polysilicon, thus letting the source electrode material 713 be buried within groove 704. In this structure a p-type body region 706 is disposed along sidewalls of the groove 704. More specifically, as shown in FIG. 100, an n-type epitaxial layer 702 is disposed on substrate 701 with gate oxide films 709a, 709b and polysilicon gate electrodes 710a, 710b disposed on the n-type epitaxial layer 702. Thereafter, as shown in FIG. 101, implantation and drive-in processing are done to form p-well channel region 703. Then, as shown in FIG. 102, a V-like groove 704 is formed in n-type epitaxial layer 702. Further, as shown in FIG. 103, a resist film R1 is used to perform two implantation steps followed by drive-in process, thus forming p-type body region 706 and p⁺-type body region 708. Subsequently, as shown in FIG. 104, a resist film R2 is used to implantation and drive-in, forming n⁺ source regions 707a, 707b. Then, as shown in FIG. 105, an aluminum layer is formed through sputtering to thereby fabricate source electrode 713.

In this way the MOS transistor shown in FIG. 99 is manufacturable by the method including the steps of forming the V-like groove 704 in the surface of n-type semiconductor substrate 702 formed on substrate 701 and then forming at sidewalls of V-groove 704 the p-body region 706 deeper than p-well channel region 703 and next disposing aluminum electrode 713 within V-groove 704. To be brief, the groove 707 opened to the surface of p-well channel region 703 is formed in the surface of n-type epitaxial layer 702 while letting p-body region 706 be formed at certain part constituting sidewalls of groove 704 in n-epitaxial layer 702 so that layer 706 is deeper than p-well channel region 703, thus forming the intended body diode in an interface relative to n-epitaxial layer 702.

In this case also, use of the V-like groove 704 makes it possible, as has been explained with reference to FIGS. 93–94, to avoid problems as to unwanted in-groove cavity formation and aluminum layer interruption plus disconnection from aluminum at the body diode, thus rendering the resultant device structure more preferable.

Although the invention has been disclosed and illustrated with reference to some particular embodiments, the principles involved are susceptible for use in numerous other embodiments which will be apparent to persons skilled in the art. The invention is, therefore, to be limited only as indicated by the scope of the appended claims.

What is claimed is:

1. A power MOS transistor comprising:
   a buried semiconductor layer of a first conductivity type;
   a surface side semiconductor layer of the first conductivity type, formed on the buried semiconductor layer, and having an impurity concentration lower than that of the buried semiconductor layer;
   a channel region of a second conductivity type, defined in a surface portion of the surface side semiconductor layer;
   a source region of the first conductivity type, formed in a surface portion of the channel region;
   a gate electrode disposed on at least a part of the channel region in the surface side semiconductor layer with a gate insulation film interposed therebetween;
   a deep drain region of the first conductivity type, formed in at least the surface of the surface side semiconductor layer; and
   a base region of the second conductivity type, formed in the surface portion of the surface side semiconductor layer to partly overlap with the deep drain region, the base region being connected to a source side to define a surge bypassing diode between the source side and a drain side.

2. A power MOS transistor according to claim 1, wherein:
   the power MOS transistor is an up-drain type; and
   the drain region is a deep drain region having a depth enough to reach the buried layer from the surface of the surface-side layer.

3. A power MOS transistor comprising:
   a buried semiconductor layer of a first conductivity type;
   a surface side semiconductor layer of the first conductivity type, formed on the buried semiconductor layer, and having an impurity concentration lower than that of the buried semiconductor layer;
   a channel region of a second conductivity type, defined in a surface portion of the surface side semiconductor layer;
   a source region of the first conductivity type, formed in a surface portion of the channel region;
   a gate electrode disposed on at least a part of the channel region in the surface side semiconductor layer with a gate insulation film interposed therebetween;
   a drain region of the first conductivity type, formed in at least the surface of the surface side semiconductor layer; and a semiconductor region of the first conductivity type, formed in the surface portion of the surface side semiconductor layer, the semiconductor region being connected to a drain side; and a base region of the second conductivity type, formed in the surface portion of the surface side semiconductor layer to partly overlap with the semiconductor region, the base region being connected to a source side to define a surge bypassing diode between the source side and the drain side.

4. A power MOS transistor according to claim 2, wherein:

the power MOS transistor is an up-drain type; and the drain region is a deep drain region having a depth enough to reach the buried layer from the surface of the surface-side layer.

5. A power MOS transistor according to claim 2, wherein the power MOS transistor is a lateral drain type.

6. A power MOS transistor comprising:

a semiconductor substrate of a first conductivity type as a drain region;

a surface side semiconductor layer of the first conductivity type, formed on the semiconductor substrate, and having an impurity concentration lower than that of the semiconductor substrate;

a channel region of a second conductivity type, defined in a surface portion of the surface side semiconductor layer;

a source region of the first conductivity type, formed in a surface portion of the channel region;

a gate electrode disposed on at least a part of the channel region in the surface side semiconductor layer with a gate insulation film interposed therebetween;

a deep region of the first conductivity type, formed in at least the surface of the surface side semiconductor layer; and a base region of the second conductivity type, formed in the surface portion of the surface side semiconductor layer to partly overlap with the deep region, the base region being connected to a source side to define a surge bypassing diode between the source side and a drain side.

7. A power MOS transistor according to claim 6, wherein:

the power MOS transistor is a vertical drain type; and the deep region having a depth enough to reach the buried layer from the surface of the surface side semiconductor layer.

8. A power MOS transistor comprising:

a buried semiconductor layer of a first conductivity type;

a surface side semiconductor layer of the first conductivity type, formed on the buried semiconductor layer, and having an impurity concentration lower than that of the buried semiconductor layer;

a channel region of a second conductivity type, defined in a surface portion of the surface side semiconductor layer;

an emitter region of the first conductivity type, formed in a surface portion of the channel region;

a gate electrode disposed on at least a part of the channel region in the surface side semiconductor layer with a gate insulation film interposed therebetween;

a collector region of the second conductivity type, formed in at least the surface of the surface side semiconductor layer; and a semiconductor region of the first conductivity type, formed in the surface portion of the surface side semiconductor layer, the semiconductor region being connected to a collector side; and a base region of the second conductivity type, formed in the surface portion of the surface side semiconductor layer to partly overlap with the semiconductor region, the base region being connected to an emitter side to define a surge bypassing diode between the source side and the drain side.

9. A power MOS transistor according to claim 8, wherein the power MOS transistor is an integrated gate bipolar transistor.

10. A power MOS transistor according to claim 2, wherein the surge bypassing diode is formed in a separate region other than a transistor formation region.

11. The transistor of claim 1 further comprising:

means for causing a cathode potential of the surge bypassing diode when supplying thereto a maximal current pursuant to surge current application criteria to stay equal to or less than a breakdown voltage at the drain or collector of the transistor.

12. A semiconductor device comprising:

a semiconductor substrate; and a plurality of active devices formed on the substrate, the active device including a power device and a bipolar transistor plus a double-well CMOS transistor, wherein the substrate has a semiconductor well region of a first conductivity type and a well region of a second conductivity type, the well regions is for use with the double-well CMOS transistor, the well regions are also formed in both a power device formation region and a bipolar transistor formation region respectively to thereby make up the power device and the bipolar transistor therein.

13. A semiconductor device according to claim 12, wherein the power device is a lateral type MOSFET.

14. A semiconductor device according to claim 12, wherein the power device is an IGBT.

15. A semiconductor device according to claim 12, wherein the power device is a thyristor.

* * * * *